US011690238B2

(12) United States Patent
Ohsawa et al.

(10) Patent No.: US 11,690,238 B2
(45) Date of Patent: Jun. 27, 2023

(54) LIGHT-EMITTING ELEMENT, DISPLAY DEVICE, ELECTRONIC DEVICE, AND LIGHTING DEVICE

(71) Applicant: Semiconductor Energy Laboratory Co., Ltd., Kanagawa-ken (JP)

(72) Inventors: Nobuharu Ohsawa, Kanagawa (JP); Satoshi Seo, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 216 days.

(21) Appl. No.: 16/757,833

(22) PCT Filed: Oct. 18, 2018

(86) PCT No.: PCT/IB2018/058069
§ 371 (c)(1),
(2) Date: Apr. 21, 2020

(87) PCT Pub. No.: WO2019/082024
PCT Pub. Date: May 2, 2019

(65) Prior Publication Data
US 2021/0193943 A1    Jun. 24, 2021

(30) Foreign Application Priority Data
Oct. 27, 2017  (JP) ................. 2017-208054

(51) Int. Cl.
*H01L 51/50*  (2006.01)
*C09K 11/06*  (2006.01)
(Continued)

(52) U.S. Cl.
CPC .......... *H01L 51/5028* (2013.01); *C09K 11/06* (2013.01); *G06F 3/041* (2013.01);
(Continued)

(58) Field of Classification Search
None
See application file for complete search history.

(56) References Cited

U.S. PATENT DOCUMENTS 6,310,360 B1   10/2001  Forrest et al.
10,230,055 B2   3/2019  Kanamoto et al.
(Continued)

FOREIGN PATENT DOCUMENTS

CN    001402885 A    3/2003
CN    102217419 A    10/2011
(Continued)

OTHER PUBLICATIONS

Nakanotani, H. et al., "High-Efficiency Organic Light-Emitting Diodes with Fluorescent Emitters," Nature Communications, May 30, 2014, vol. 5, pp. 4016-1-4016-7.
(Continued)

*Primary Examiner* — Gregory D Clark
(74) *Attorney, Agent, or Firm* — Husch Blackwell LLP

(57) ABSTRACT

An object is to provide a light-emitting element with high emission efficiency. The light-emitting element contains first to third organic compounds. The first organic compound has a function of converting triplet excitation energy into light. The second organic compound has a benzofuropyrimidine skeleton or a benzothienopyrimidine skeleton. The third organic compound is a fluorescent compound. Light emitted from the light-emitting element is light emitted from the third organic compound that receives excitation energy from the first organic compound or from an exciplex formed by the first and second organic compounds.

25 Claims, 22 Drawing Sheets

(51) Int. Cl.
  *G06F 3/041* (2006.01)
  *H01L 51/00* (2006.01)
  *G09G 3/3225* (2016.01)
  *G09G 3/3266* (2016.01)
  *G09G 3/3275* (2016.01)

(52) U.S. Cl.
  CPC ........ *H01L 51/006* (2013.01); *H01L 51/0071* (2013.01); *H01L 51/0072* (2013.01); *H01L 51/0074* (2013.01); *H01L 51/0085* (2013.01); *C09K 2211/1059* (2013.01); *C09K 2211/185* (2013.01); *G09G 3/3225* (2013.01); *G09G 3/3266* (2013.01); *G09G 3/3275* (2013.01); *H01L 51/0054* (2013.01); *H01L 51/0073* (2013.01); *H01L 2251/5376* (2013.01); *H01L 2251/552* (2013.01)

(56) References Cited

U.S. PATENT DOCUMENTS

| | | | |
|---|---|---|---|
| 10,586,931 | B2 | 3/2020 | Kanamoto et al. |
| 10,693,094 | B2 | 6/2020 | Seo et al. |
| 11,088,332 | B2 | 8/2021 | Kanamoto et al. |
| 11,276,824 | B2 | 3/2022 | Kanamoto et al. |
| 2002/0146589 | A1 | 10/2002 | Akiyama et al. |
| 2005/0089715 | A1* | 4/2005 | Cosimbescu ....... H01L 51/0052 313/506 |
| 2008/0237875 | A1 | 10/2008 | Yamazaki et al. |
| 2010/0265187 | A1* | 10/2010 | Chang .................. G06F 3/0446 345/173 |
| 2011/0309345 | A1* | 12/2011 | Balaganesan ....... H01L 51/0067 544/212 |
| 2013/0306945 | A1 | 11/2013 | Seo |
| 2014/0034930 | A1 | 2/2014 | Seo et al. |
| 2014/0191225 | A1 | 7/2014 | Inoue et al. |
| 2014/0291645 | A1 | 10/2014 | Inoue et al. |
| 2015/0349284 | A1 | 12/2015 | Seo et al. |
| 2016/0028022 | A1 | 1/2016 | Seo et al. |
| 2016/0064684 | A1 | 3/2016 | Seo et al. |
| 2016/0093823 | A1 | 3/2016 | Seo et al. |
| 2016/0268534 | A1 | 9/2016 | Hosoumi et al. |
| 2016/0351833 | A1 | 12/2016 | Hosoumi et al. |
| 2017/0012207 | A1 | 1/2017 | Seo et al. |
| 2017/0186971 | A1 | 6/2017 | Kanamoto et al. |
| 2017/0324054 | A1 | 11/2017 | Ishisone et al. |
| 2019/0044073 | A1* | 2/2019 | Ogiwara ............. H01L 51/0072 |
| 2020/0343469 | A1 | 10/2020 | Ohsawa et al. |
| 2020/0350508 | A1 | 11/2020 | Seo et al. |

FOREIGN PATENT DOCUMENTS

| | | |
|---|---|---|
| CN | 102683604 A | 9/2012 |
| CN | 106057846 A | 10/2016 |
| CN | 106206963 A | 12/2016 |
| EP | 1 204 994 | 5/2002 |
| EP | 2 746 273 A1 | 6/2014 |
| JP | 2002-050483 A | 2/2002 |
| JP | 2003-520391 | 7/2003 |
| JP | 2014-045179 A | 3/2014 |
| JP | 2016-171318 A | 9/2016 |
| JP | 2016-225619 A | 12/2016 |
| JP | 2017-022378 A | 1/2017 |
| KR | 2016-0110173 A | 9/2016 |
| KR | 2016-0140393 A | 12/2016 |
| KR | 2018-0099657 A | 9/2018 |
| TW | 518768 B | 1/2003 |
| TW | 201705573 | 2/2017 |
| TW | 201716382 | 5/2017 |
| TW | 201721922 | 6/2017 |
| TW | 201736378 | 10/2017 |
| WO | WO 2001/008230 A1 | 2/2001 |
| WO | WO 2001/091203 A2 | 11/2001 |
| WO | WO 2013/024872 A1 | 2/2013 |
| WO | WO 2017/006222 A1 | 1/2017 |
| WO | WO 2017/037571 A1 | 3/2017 |
| WO | WO 2017/055963 A1 | 4/2017 |
| WO | WO 2017/109637 A1 | 6/2017 |
| WO | WO 2017/115788 A1 | 7/2017 |

OTHER PUBLICATIONS

International Search Report (Application No. PCT/IB2018/058069) dated Jan. 29, 2019.

Written Opinion (Application No. PCT/IB2018/058069) dated Jan. 29, 2019.

Baldo, M. et al., "High-Efficiency Fluorescent Organic Light-Emitting Devices Using a Phosphorescent Sensitizer," Nature, Feb. 17, 2000, vol. 403, pp. 750-753.

Sajoto, T. et al., "Temperature Dependence of Blue Phosphorescent Cyclometalated Ir(III) Complexes," Journal of the American Chemical Society, Jun. 18, 2009, vol. 131, No. 28, pp. 9813-9822.

Taiwanese Office Action (Application No. 107137504) dated May 31, 2022.

Chinese Office Action (Application No. 201880068252.4) dated Nov. 15, 2022.

Chinese Office Action (Application No. 201880068252.4) dated Apr. 13, 2023.

\* cited by examiner

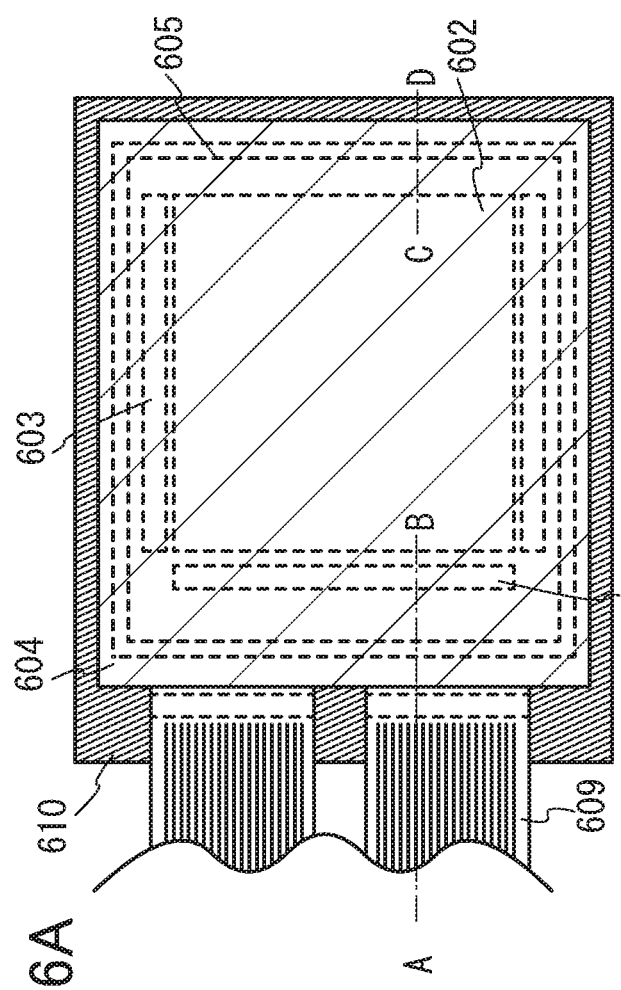
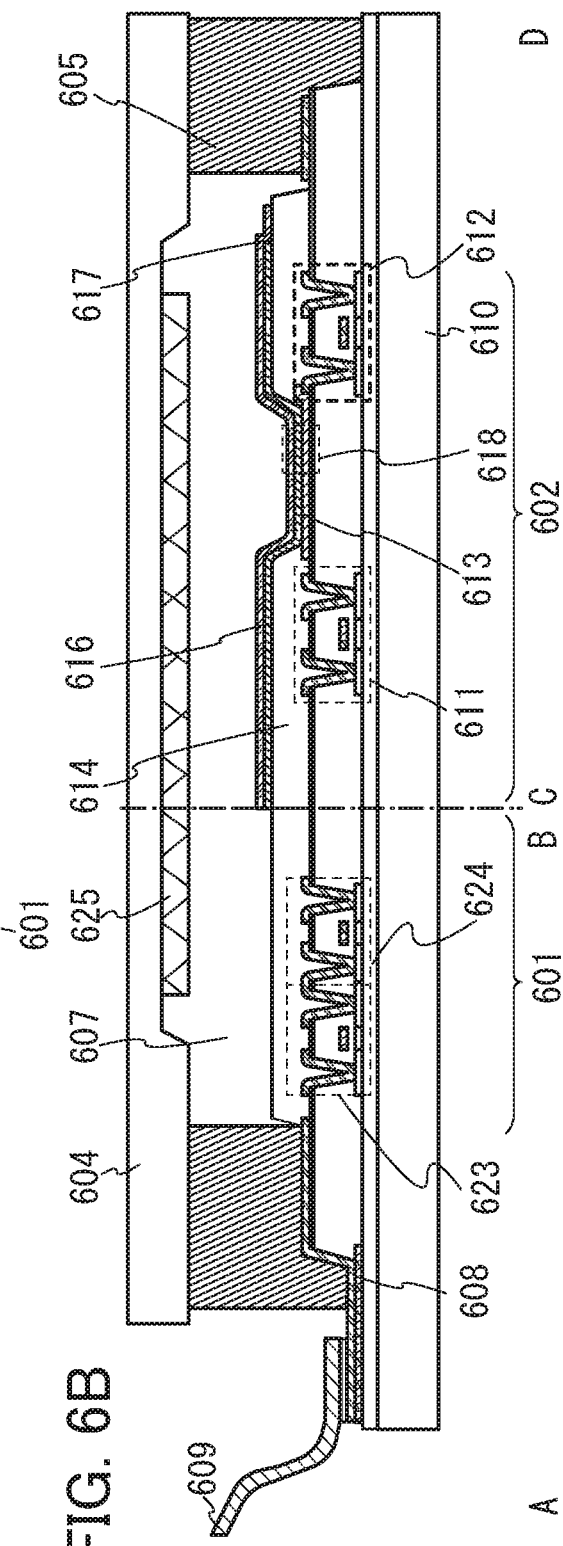
FIG. 6A
FIG. 6B

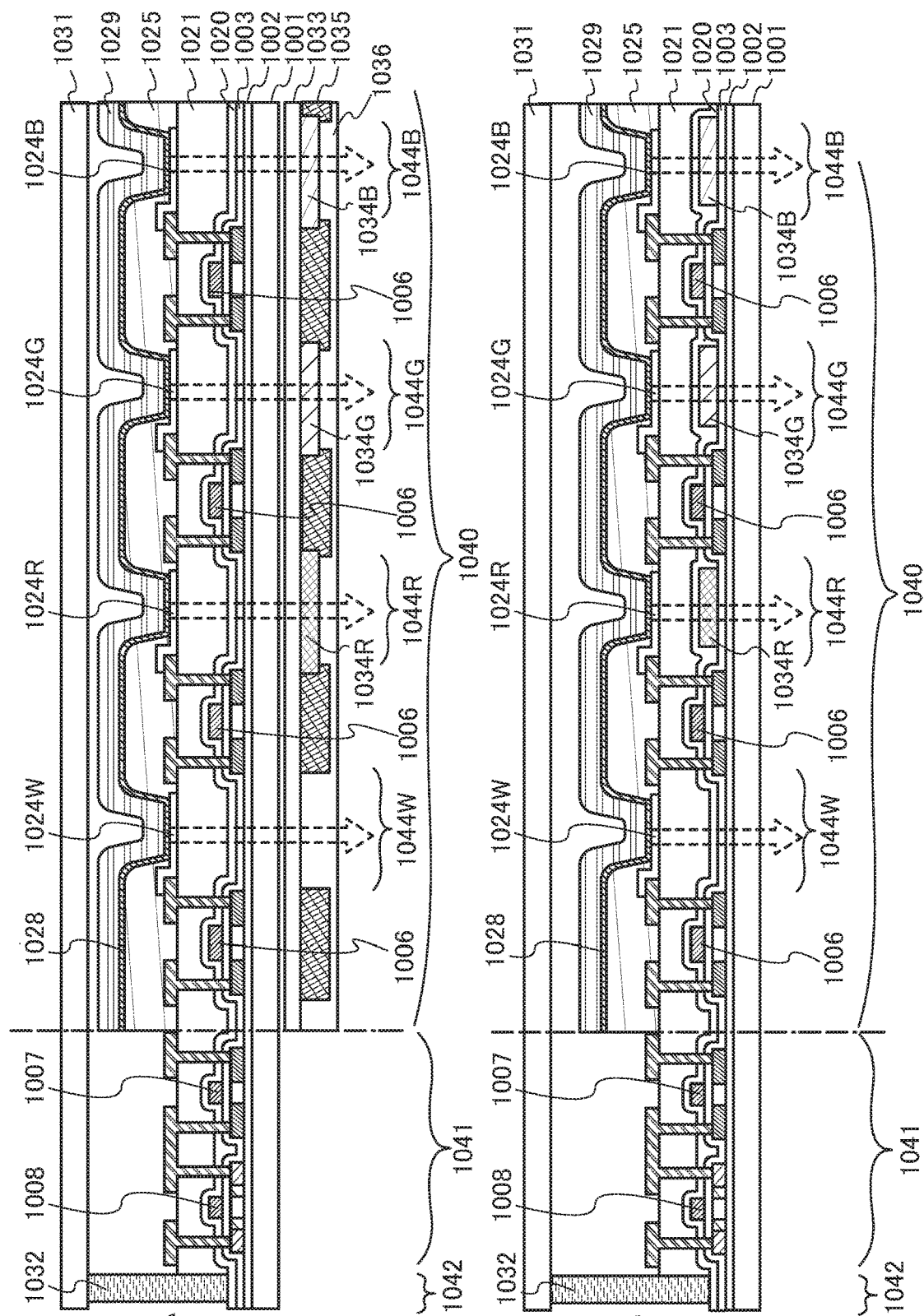

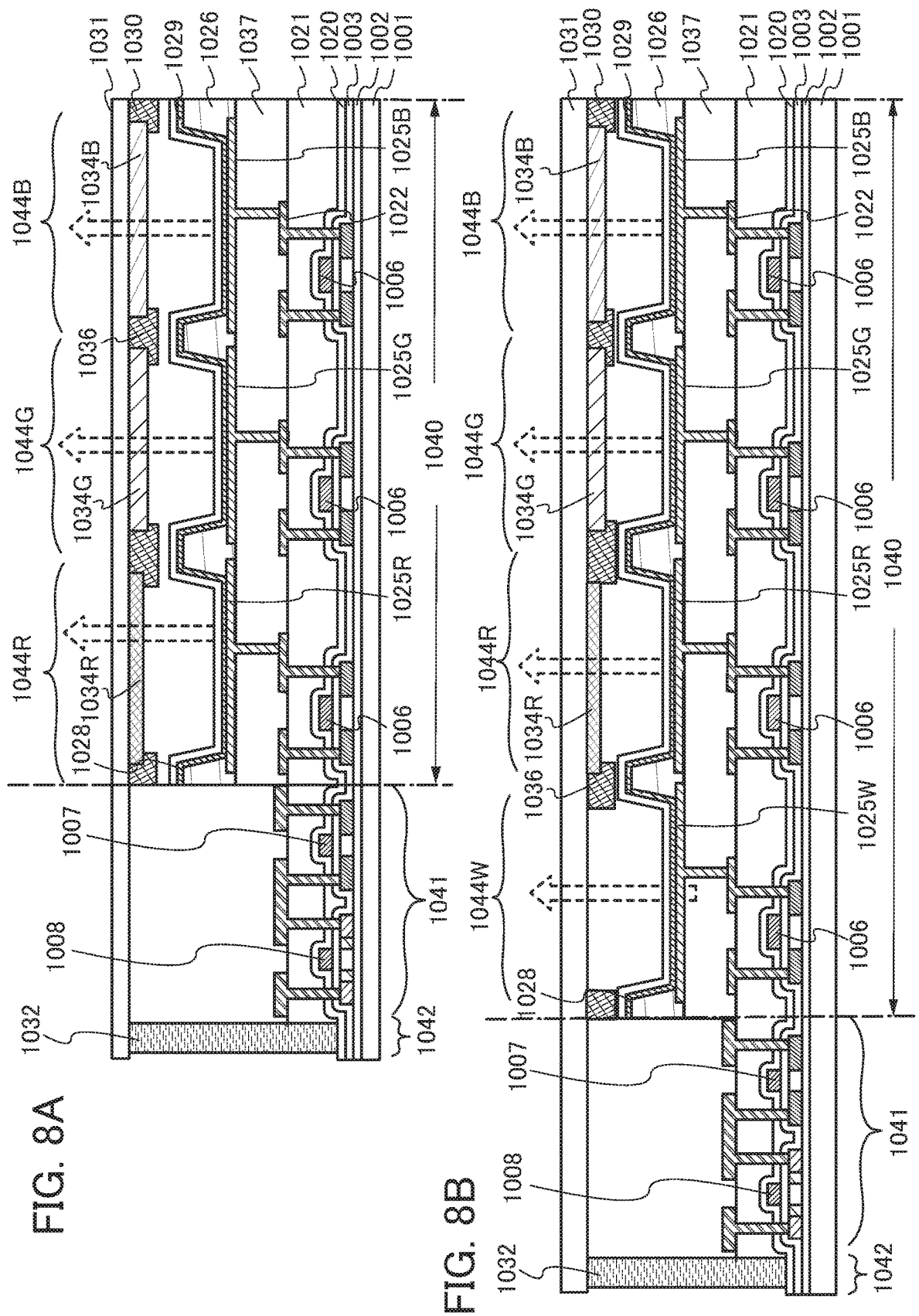

LIGHT-EMITTING ELEMENT, DISPLAY DEVICE, ELECTRONIC DEVICE, AND LIGHTING DEVICE

This application is a 371 of international application PCT/IB2018/058069 filed on Oct. 18, 2018 which is incorporated herein by reference.

TECHNICAL FIELD

One embodiment of the present invention relates to a light-emitting element, or a display device, an electronic device, and a lighting device each including the light-emitting element.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specific examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

BACKGROUND ART

In recent years, research and development have been extensively conducted on light-emitting elements utilizing electroluminescence (EL). In a basic structure of such a light-emitting element, a layer containing a light-emitting substance (an EL layer) is sandwiched between a pair of electrodes. By application of a voltage between the electrodes of this element, light is emitted from the light-emitting substance.

Since the above light-emitting element is of self-luminous type, a display device using this light-emitting element has advantages such as high visibility, no necessity of a backlight, and low power consumption. Moreover, such a display device also has advantages such as thinness, light weight, and high response speed.

In a light-emitting element where an EL layer containing an organic compound as a light-emitting substance is provided between a pair of electrodes (e.g., in an organic EL element), application of a voltage between the pair of electrodes causes injection of electrons from a cathode and holes from an anode into the EL layer having light-emitting properties, and thus a current flows. By recombination of the injected electrons and holes, the light-emitting organic compound is brought into an excited state to provide light emission.

An excited state of an organic compound can be a singlet excited state (S*) or a triplet excited state (T*). Light emission from the singlet excited state is referred to as fluorescence, and light emission from the triplet excited state is referred to as phosphorescence. The statistical generation ratio of these states in a light-emitting element is considered to be S*:T*=1:3. Thus, a light-emitting element containing a compound that phosphoresces (a phosphorescent compound) has higher emission efficiency than a light-emitting element containing a compound that fluoresces (a fluorescent compound). For that reason, light-emitting elements containing phosphorescent compounds capable of converting triplet excitation energy into light have been actively developed in recent years.

Among light-emitting elements containing phosphorescent compounds, a light-emitting element that emits blue light has not yet been put into practical use because it is particularly difficult to develop a stable compound having a high triplet excitation energy level. For this reason, the development of light-emitting elements containing fluorescent compounds, which are more stable, has been conducted, and a technique for increasing the emission efficiency of a light-emitting element containing a fluorescent compound (a fluorescent element) has been searched.

A known example is a light-emitting element containing a thermally activated delayed fluorescent (TADF) material. In a thermally activated delayed fluorescent material, a singlet excited state is generated from a triplet excited state by reverse intersystem crossing, and then the singlet excitation energy is converted into light.

Patent Document 1 discloses a method in which in a light-emitting element containing a thermally activated delayed fluorescent material and a fluorescent compound, singlet excitation energy of the thermally activated delayed fluorescent material is transferred to the fluorescent compound and light emission is obtained from the fluorescent compound.

REFERENCE

Patent Document

Patent Document 1: Japanese Published Patent Application No. 2014-045179

Non-Patent Document

Non-Patent Document 1: T. Sajoto et al., *J. Am. Chem. Soc.*, 2009, 131, 9813

DISCLOSURE OF INVENTION

To increase the emission efficiency of a fluorescent element, efficient generation of a singlet excited state from a triplet excited state and highly efficient energy transfer to a fluorescent material are desired. Accordingly, there has been demand for development of a method and a material for efficiently generating a singlet excited state from a triplet excited state to further increase the emission efficiency of a light-emitting element. Moreover, a material having a favorable carrier-transport property needs to be used for the light-emitting layer in order to lower the driving voltage.

In view of the above, an object of one embodiment of the present invention is to provide a light-emitting element with high emission efficiency. Another object of one embodiment of the present invention is to provide a light-emitting element with low driving voltage. Another object of one embodiment of the present invention is to provide a highly reliable light-emitting element. Another object of one embodiment of the present invention is to provide a light-emitting element with low power consumption. Another object of one embodiment of the present invention is to provide a novel light-emitting element. Another object of one embodiment of the present invention is to provide a novel light-emitting device. Another object of one embodiment of the present invention is to provide a novel electronic device.

Note that the description of the above objects does not preclude the existence of other objects. In one embodiment of the present invention, there is no need to achieve all the objects. Other objects are apparent from and can be derived from the description of the specification and the like.

As described above, demand has risen for development of a method for efficiently converting triplet excitation energy of a fluorescent element into light. Thus, the energy transfer efficiency between materials used in the light-emitting layer needs to be increased.

In view of the above, one embodiment of the present invention is a light-emitting element including a light-emitting layer between a pair of electrodes. The light-emitting layer contains a first organic compound, a second organic compound, and a third organic compound. The first organic compound has a function of converting triplet excitation energy into light. The second organic compound has a benzofuropyrimidine skeleton or a benzothienopyrimidine skeleton. The third organic compound has a function of converting singlet excitation energy into light. Light emitted from the light-emitting layer includes light emitted from the third organic compound.

In the above structure, the first organic compound preferably has a function of supplying excitation energy to the third organic compound.

Another embodiment of the present invention is a light-emitting element including a light-emitting layer between a pair of electrodes. The light-emitting layer contains a first organic compound, a second organic compound, and a third organic compound. The first organic compound and the second organic compound are capable of forming an exciplex. The first organic compound has a function of converting triplet excitation energy into light. The second organic compound has a benzofuropyrimidine skeleton or a benzothienopyrimidine skeleton. The third organic compound has a function of converting singlet excitation energy into light. Light emitted from the light-emitting layer includes light emitted from the third organic compound.

In the above structure, the exciplex preferably has a function of supplying excitation energy to the third organic compound.

In any of the above structures, it is preferred that the benzofuropyrimidine skeleton be a benzofuro[3,2-d]pyrimidine skeleton, or that the benzothienopyrimidine skeleton be a benzothieno[3,2-d]pyrimidine skeleton.

In the above structure, the benzofuro[3,2-d]pyrimidine skeleton or the benzothieno[3,2-d]pyrimidine skeleton preferably has a substituent at the 4-position or the 8-position.

In any of the above structures, the first organic compound preferably contains Ru, Rh, Pd, Os, Ir, or Pt.

In any of the above structures, the first organic compound preferably emits phosphorescence.

In any of the above structures, it is preferred that the emission spectrum of the exciplex partly overlap an absorption band on the longest wavelength side of an absorption spectrum of the third organic compound.

In any of the above structures, the first organic compound preferably has an emission quantum yield higher than or equal to 0% and lower than or equal to 40% at room temperature.

In any of the above structures, the exciplex preferably has a function of emitting light with higher emission efficiency than that of the first organic compound.

In any of the above structures, the third organic compound preferably emits fluorescence.

In any of the above structures, a difference between singlet excitation energy and triplet excitation energy of the first organic compound is preferably greater than or equal to 0 eV and less than or equal to 0.2 eV.

Another embodiment of the present invention is a display device including the light-emitting element having any of the above structures, and at least one of a color filter and a transistor. Another embodiment of the present invention is an electronic device including the display device and at least one of a housing and a touch sensor. Another embodiment of the present invention is a lighting device including the light-emitting element having any of the above structures, and at least one of a housing and a touch sensor. The category of one embodiment of the present invention includes not only a light-emitting device including a light-emitting element but also an electronic device including a light-emitting device. Accordingly, a light-emitting device in this specification refers to an image display device or a light source (including a lighting device). The light-emitting device may include, in its category, a display module in which a connector such as a flexible printed circuit (FPC) or a tape carrier package (TCP) is connected to a light-emitting element, a display module in which a printed wiring board is provided on the tip of a TCP, and a display module in which an integrated circuit (IC) is directly mounted on a light-emitting element by a chip on glass (COG) method.

One embodiment of the present invention can provide a light-emitting element with high emission efficiency, a light-emitting element with low driving voltage, a highly reliable light-emitting element, a light-emitting element with low power consumption, a novel light-emitting element, a novel light-emitting device, or a novel electronic device.

Note that the description of these effects does not preclude the existence of other effects. One embodiment of the present invention does not necessarily achieve all the effects. Other effects will be apparent from and can be derived from the description of the specification, the drawings, the claims, and the like.

BRIEF DESCRIPTION OF DRAWINGS

In the accompanying drawings:

FIGS. 6A and 6B are a top view and a schematic cross-sectional view illustrating a display device of one embodiment of the present invention;

FIGS. 7A and 7B are schematic cross-sectional views each illustrating a display device of one embodiment of the present invention;

FIGS. 8A and 8B are schematic cross-sectional views each illustrating a display device of one embodiment of the present invention;

BEST MODE FOR CARRYING OUT THE INVENTION

Figure 1A:
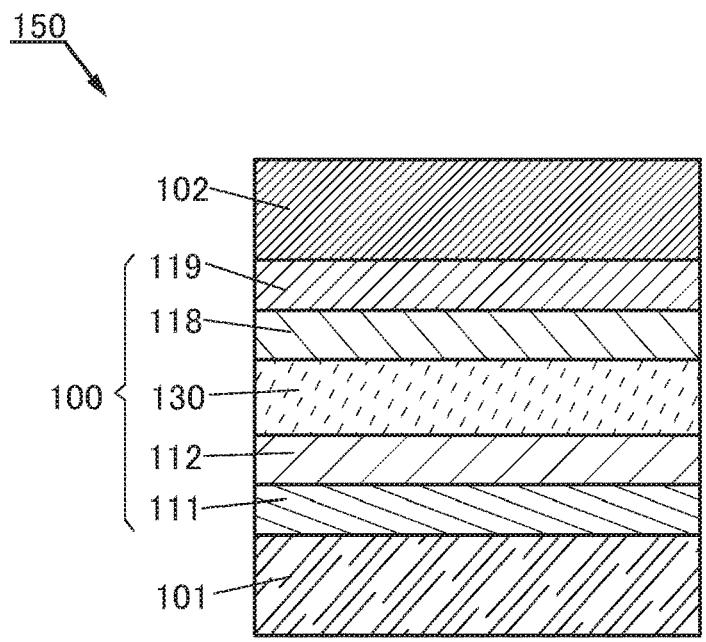
FIGS. 1A and 1B are schematic cross-sectionals views of a light-emitting element of one embodiment of the present invention.

Embodiments of the present invention will be described in detail below with reference to the drawings. Note that the present invention is not limited to the following description, and the modes and details can be modified in various ways without departing from the spirit and scope of the present invention. Accordingly, the present invention should not be interpreted as being limited to the content of the embodiments and examples below.

Note that the position, size, range, or the like of each component illustrated in drawings and the like is not accurately represented in some cases for easy understanding. Therefore, the disclosed invention is not necessarily limited to the position, size, range, or the like disclosed in the drawings and the like.

Note that the ordinal numbers such as first and second in this specification and the like are used for convenience and do not denote the order of steps or the stacking order of layers in some cases. Therefore, description can also be made when "first" is appropriately replaced with "second" or "third", for example. In addition, the ordinal numbers in this specification and the like are not necessarily the same as those used for specifying one embodiment of the present invention.

In the description of structures of the invention in this specification and the like with reference to the drawings, the same components in different diagrams are sometimes denoted by the same reference numeral.

In this specification and the like, the terms "film" and "layer" can be interchanged with each other. For example, in some cases, the term "conductive film" can be used instead of the term "conductive layer", and the term "insulating layer" can be used instead of the term "insulating film".

In this specification and the like, a singlet excited state (S*) refers to a singlet state having excitation energy. An S1 level means the lowest singlet excitation energy level, that is, the excitation energy level of the lowest singlet excited state (S1 state). A triplet excited state (T*) refers to a triplet state having excitation energy. A T1 level means the lowest triplet excitation energy level, that is, the excitation energy level of the lowest triplet excited state (T1 state). Note that in this specification and the like, "singlet excited state" and "singlet excitation energy level" sometimes mean the S1 state and the S1 level, respectively. Moreover, "triplet excited state" and "triplet excitation energy level" sometimes mean the T1 state and the T1 level, respectively.

In this specification and the like, a fluorescent compound refers to a compound that emits light in the visible light region when relaxing from the singlet excited state to the ground state. A phosphorescent compound refers to a compound that emits light in the visible light region at room temperature when relaxing from the triplet excited state to the ground state. That is, a phosphorescent compound refers to a compound that can convert triplet excitation energy into visible light.

Note that in this specification and the like, room temperature refers to a temperature ranging from 0° C. to 40° C.

In this specification and the like, a blue wavelength region ranges from 400 nm to less than 490 nm, and blue light has at least one emission spectrum peak in the wavelength region. A green wavelength region ranges from 490 nm to less than 580 nm, and green light has at least one emission spectrum peak in the wavelength region. A red wavelength region ranges from 580 nm to 680 nm, and red light has at least one emission spectrum peak in the wavelength region.

Embodiment 1

In this embodiment, a light-emitting element of one embodiment of the present invention will be described below with reference to FIGS. 1A to 1C, FIGS. 2A and 2B, FIG. 3, and FIGS. 4A and 4B.

<Structure Example 1 of Light-Emitting Element>

First, the structure of the light-emitting element of one embodiment of the present invention will be described below with reference to FIGS. 1A to 1C.

FIG. 1A is a schematic cross-sectional view of a light-emitting element 150 of one embodiment of the present invention.

The light-emitting element 150 includes a pair of electrodes (an electrode 101 and an electrode 102) and an EL layer 100 between the pair of electrodes. The EL layer 100 includes at least a light-emitting layer 130.

The EL layer 100 illustrated in FIG. 1A includes functional layers such as a hole-injection layer 111, a hole-transport layer 112, an electron-transport layer 118, and an electron-injection layer 119, in addition to the light-emitting layer 130.

The electrode 101 and the electrode 102 of the pair of electrodes are described as an anode and a cathode, respectively, in this embodiment; however, the structure of the light-emitting element 150 is not limited to this. That is, the electrode 101 may be a cathode, the electrode 102 may be an anode, and the stacking order of the layers between the electrodes may be reversed. In other words, the hole-injection layer 111, the hole-transport layer 112, the light-emitting layer 130, the electron-transport layer 118, and the electron-injection layer 119 may be stacked in this order from the anode side.

Note that the structure of the EL layer 100 is not limited to the structure illustrated in FIG. 1A, as long as at least one of the hole-injection layer 111, the hole-transport layer 112, the electron-transport layer 118, and the electron-injection layer 119 is included. Alternatively, the EL layer 100 may include a functional layer that is capable of lowering a hole- or electron-injection barrier, improving a hole- or electron-transport property, inhibiting a hole- or electron-transport property, or suppressing a quenching phenomenon due to an electrode, for example. Note that the functional layer may be a single layer or stacked layers.

Next, the light-emitting layer 130 is described below.

In one embodiment of the present invention, the light-emitting element 150 is a fluorescent element that contains a fluorescent compound in the light-emitting layer 130. A fluorescent element is highly reliable and has high color purity because its emission spectrum tends to be sharper than that of a phosphorescent element. Note that in an organic EL element, the generation ratio of singlet excitons to triplet excitons (hereinafter referred to as exciton generation probability) is 1:3 according to the statistical probability. This means, in a fluorescent element that emits light using singlet excitons, only 25% of the generated excitons typically contribute to light emission. It is therefore important to make triplet excitons contribute to light emission for the sake of achieving higher efficiency of a fluorescent element.

In view of the above, the present inventors have found that triplet excitons can contribute to fluorescence efficiently, i.e., a highly efficient fluorescent element can be obtained with the use of a light-emitting layer containing an organic compound capable of converting triplet excitation energy into light, an organic compound that has a benzofuropyrimidine skeleton or a benzothienopyrimidine skeleton, and an organic compound that emits fluorescence.

The benzofuropyrimidine skeleton is preferably a benzofuro[3,2-d]pyrimidine skeleton, and the benzothienopyrimidine skeleton is preferably a benzothieno[3,2-d]pyrimidine skeleton. Such a composition can improve the electron-transport property of the organic compound. Moreover, such a composition lowers the lowest unoccupied molecular orbital (LUMO) level of the organic compound; thus, the organic compound is more likely to receive electrons in the light-emitting layer, so that the driving voltage of the light-emitting element can be lowered.

The benzofuro[3,2-d]pyrimidine skeleton or the benzothieno[3,2-d]pyrimidine skeleton preferably has a substituent at the 4-position and/or the 8-position. With such a structure, a light-emitting element having high emission efficiency and high reliability can be obtained.

The substituent at the 4-position and/or the 8-position preferably has a skeleton with a hole-transport property, specifically, a carbazole skeleton, a dibenzofuran skeleton, or a dibenzothiophene skeleton, for example.

An example of the aforementioned organic compound capable of converting triplet excitation energy into light is a compound that can phosphoresce (hereinafter also referred to as phosphorescent compound). A phosphorescent compound in this specification and the like is a compound that phosphoresces but does not fluoresce at a temperature ranging from low temperature (e.g., 77 K) to room temperature (i.e., from 77 K to 313 K). The phosphorescent compound preferably contains a heavy atom in order to efficiently convert triplet excitation energy into light. When the phosphorescent compound contains a heavy atom, transition between a singlet ground state and a triplet excited state is allowed by spin-orbit interaction (interaction between the spin angular momentum and orbital angular momentum of an electron). Consequently, the probability of transition between the singlet ground state and the triplet excited state of the phosphorescent compound is increased; thus, the emission efficiency and the absorption probability that relate to the transition can be increased. In addition, energy transfer from the triplet excitation energy level of the phosphorescent compound to the singlet excitation energy level of the fluorescent compound by the Förster mechanism is also allowed. To facilitate the energy transfer, the phosphorescent compound preferably contains a metal element with large spin-orbit interaction, specifically, a transition metal element. It is particularly preferred that the phosphorescent compound contain a platinum group element (ruthenium (Ru), rhodium (Rh), palladium (Pd), osmium (Os), iridium (Ir), or platinum (Pt)), especially iridium, in which case the probability of direct transition between the singlet ground state and the triplet excited state can be increased.

Another example of the material capable of converting triplet excitation energy into light is a thermally activated delayed fluorescent (TADF) material. Note that the TADF material is a material that has a small difference between the S1 level and the T1 level and is capable of converting triplet excitation energy into singlet excitation energy by reverse intersystem crossing. Thus, the TADF material enables upconversion of triplet excitation energy into singlet excitation energy (i.e., reverse intersystem crossing) using a small amount of thermal energy and can efficiently generate a singlet excited state. An exciplex whose excited state is formed by two kinds of substances has an extremely small difference between the S1 level and the T1 level and functions as a TADF material that can convert triplet excitation energy into singlet excitation energy.

Figure 1B:
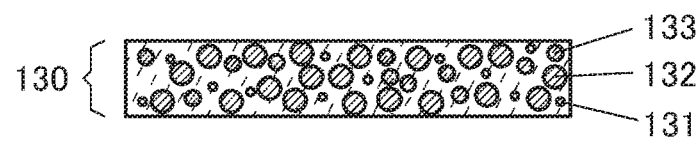

FIG. 1B is a schematic cross-sectional view illustrating an example of the light-emitting layer 130 in FIG. 1A. The light-emitting layer 130 illustrated in FIG. 1B contains a compound 131, a compound 132, and a compound 133. In one embodiment of the present invention, the compound 131 is capable of converting triplet excitation energy into light; the compound 132 is an organic compound having a benzofuropyrimidine skeleton or a benzothienopyrimidine skeleton; and the compound 133 is a guest material that fluoresces.

<Structure Example 1 of Light-Emitting Layer>

Figure 1C:
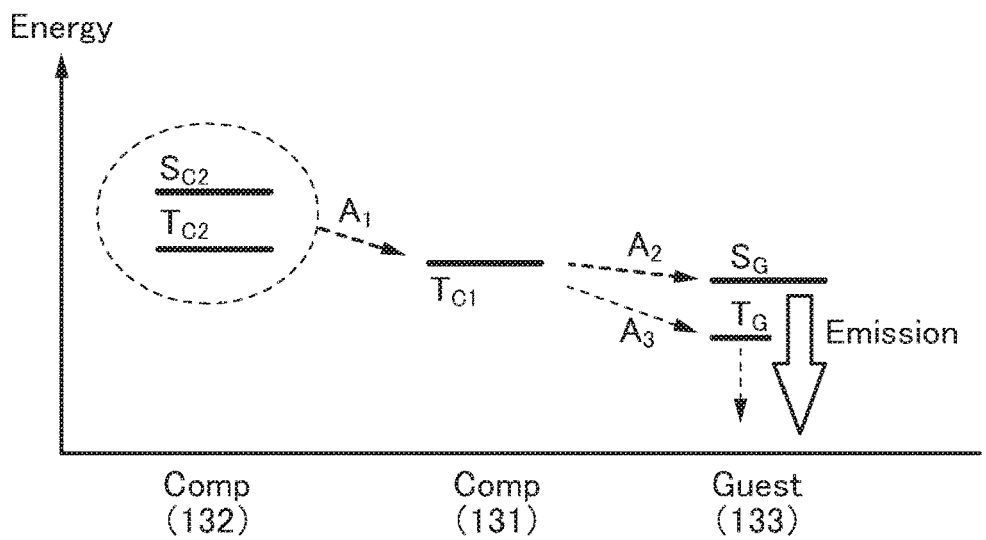
FIG. 1C shows the energy level correlation in a light-emitting layer.

FIG. 1C shows an example of the energy level correlation in the light-emitting layer included in the light-emitting element of one embodiment of the present invention. In this structure example, the compound 131 is a phosphorescent compound.

Specifically, FIG. 1C shows the correlation of the energy levels of the compounds 131, 132, and 133 in the light-emitting layer 130. What terms and numerals in FIG. 1C represent are as follows:

Comp (131): the compound 131;
Comp (132): the compound 132;
Guest (133): the compound 133;
$T_{C1}$: the T1 level of the compound 131;
$S_{C2}$: the S1 level of the compound 132;
$T_{C2}$: the T1 level of the compound 132;
$S_G$: the S1 level of the compound 133; and
$T_G$: the T1 level of the compound 133.

In FIG. 1C, an excited state is formed when the compound 131 or the compound 132 receives holes and electrons. Here, the compound 131 is a phosphorescent compound, and thus intersystem crossing between a singlet state and a triplet state is allowed. Hence, both the singlet excitation energy and the triplet excitation energy of the compound 132 can be transferred rapidly to the compound 131 (Route $A_1$ in FIG. 1C). At this time, $S_{C2} \geq T_{C2}$ and $T_{C2} \geq T_{C1}$ are preferable. The light-emitting layer 130 is formed with a mixture of the compounds 131, 132, and 133; the proportion of the compound 132 is preferably higher than that of the compound 131 in the mixture, and specifically, the weight ratio of the compound 131 to the compound 132 preferably ranges from 1:9 to 3:7. Such a composition enables the compound 131 to be excited efficiently. In addition, since the compound 131 is a phosphorescent compound, the triplet excitation energy of the compound 131 can be efficiently converted into the singlet excitation energy of the compound 133 (Route $A_2$ in FIG. 1C). Here, $S_{C2} \geq T_{C1} \geq S_G$ as shown in FIG. 1C is preferable, in which case the singlet excitation energy is efficiently transferred to the compound 133 serving as the guest material. Moreover, $T_{C2} \geq T_{C1} \geq S_G$ is preferable, in which case the triplet excitation energy is efficiently converted into the singlet excitation energy and transferred to the compound 133, which is the guest material.

The triplet excitation energy transferred from $T_{C1}$ to $T_G$ deactivates (Route $A_3$ in FIG. 1C). For that reason, the amount of energy transferred via Route $A_3$ is preferably small. In order to avoid energy transfer via Route $A_3$, the weight ratio of the compound 133 to the total of the compounds 131 and 132 is preferably low, and specifically ranges preferably from 0.001 to 0.05, further preferably from 0.001 to 0.01.

Note that when the direct carrier recombination process is dominant in the compound 133, a large number of triplet excitons are generated in the compound 133, resulting in decreased emission efficiency due to thermal deactivation. Thus, the proportion of the energy transfer process via Route $A_2$ is preferably higher than that of the direct carrier recombination process in the compound 133, in which case the probability of generating the triplet excited state of the compound 133 can be lowered and thermal deactivation can be reduced. In order to make this condition, the weight ratio of the compound 133 to the total of the compounds 131 and 132 is preferably low, and specifically ranges preferably from 0.001 to 0.05, further preferably from 0.001 to 0.01.

When the light-emitting layer 130 has the above-described structure, light emitted from the fluorescent compound of the light-emitting layer 130 can be efficiently obtained.

In addition, $T_G$ is preferably 2.0 eV or lower, in which case a highly reliable light-emitting element can be obtained.

In the above structure, a material with a high emission quantum yield does not need to be used for the phosphorescent compound; accordingly, the material design is facilitated and the material can be selected from a wide range of choices. Specifically, the emission quantum yield of the compound may range from 0% to 50%, from 0% to 40%, from 0% to 25%, from 0% to 10%, or from 0% to 1% at room temperature or ordinary temperature.

As described above, an organic compound having a benzofuro[3,2-d]pyrimidine skeleton or a benzothieno[3,2-d]pyrimidine skeleton among organic compounds having a benzofuropyrimidine skeleton or a benzothienopyrimidine skeleton has a low LUMO level, and thus is suitable for the compound 132 having an electron-transport property.

<Structure Example 2 of Light-Emitting Layer>

Figure 2A:
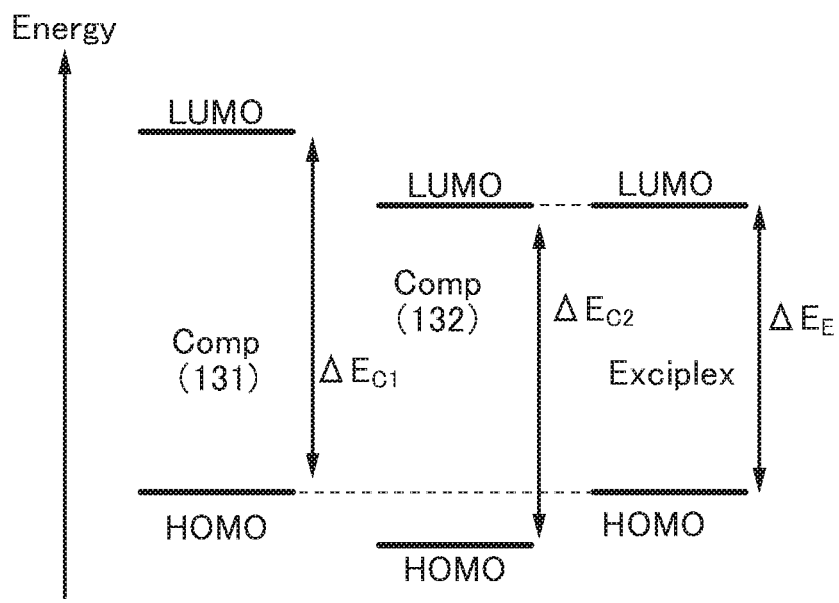
FIGS. 2A and 2B show the energy level correlation in a light-emitting layer of a light-emitting element of one embodiment of the present invention.
Figure 2B:
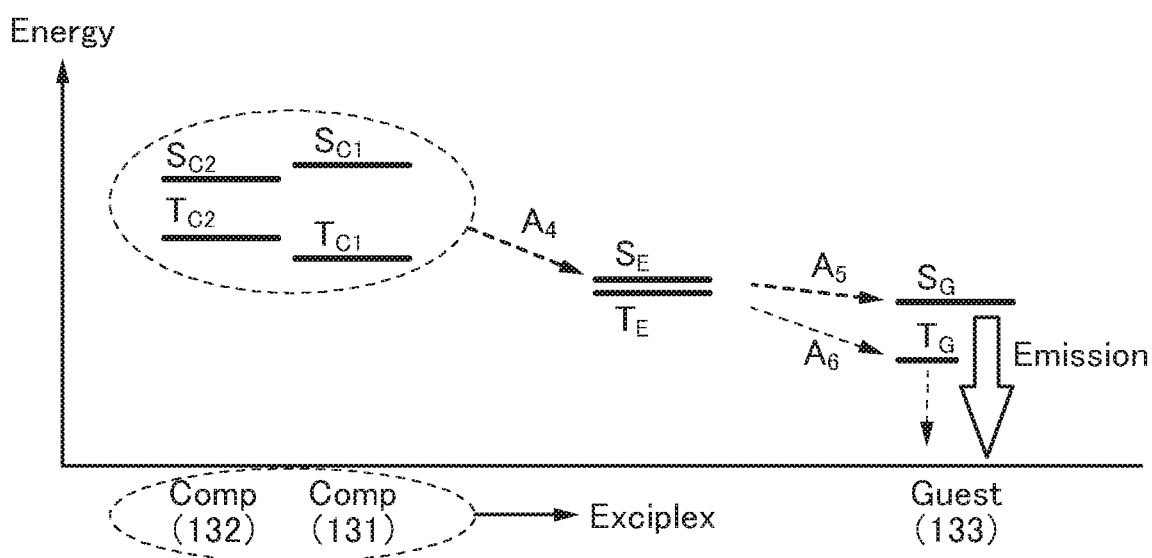

FIG. 2B shows an example of the energy level correlation in the light-emitting layer 130 in the light-emitting element 150 of one embodiment of the present invention. In this structure example, the compound 131 is a phosphorescent compound, and the compound 131 and the compound 132 form an exciplex.

Although it is acceptable as long as the combination of the compound 131 and the compound 132 can form an exciplex, it is preferred that one of them be a compound having a hole-transport property and the other be a compound having an electron-transport property. In that case, a donor-acceptor exciplex is easily formed; thus, efficient formation of an exciplex is possible. When the compounds 131 and 132 are a combination of a compound having a hole-transport property and a compound having an electron-transport property, the carrier balance can be easily controlled by adjustment of the mixing ratio. Specifically, the weight ratio of the compound having a hole-transport property to the compound having an electron-transport property is preferably within a range of 1:9 to 9:1. Since the carrier balance can be easily controlled with the above composition, a carrier recombination region can also be controlled easily.

Formation of an exciplex can be confirmed, for example, by comparing the emission spectra of the compound 131, the compound 132, and a mixed film in which these compounds are mixed and observing a phenomenon in which the emission spectrum of the mixed film is shifted to the long-wavelength side than that of each of the compounds (or has a new peak on the long-wavelength side). Alternatively, formation of an exciplex can be confirmed by comparing transient photoluminescence (PL) of the compound 131, the compound 132, and a mixed film in which these compounds are mixed and observing a difference in transient response (e.g., a phenomenon in which the transient PL lifetime of the mixed film has more long-lived components or has a larger proportion of delay components than that of each of the compounds).

For the combination of the materials for forming an exciplex efficiently, it is preferred that the highest occupied molecular orbital (HOMO) level of one of the compounds 131 and 132 is higher than that of the other compound and the LUMO level of the one of the compounds is higher than that of the other compound. Specifically, the energy difference between the HOMO levels of the compound 131 and the compound 132 is preferably greater than or equal to 0.1 eV, further preferably greater than or equal to 0.2 eV, still further preferably greater than or equal to 0.3 eV. Moreover, the energy difference between the LUMO levels of the compound 131 and the compound 132 is preferably greater than or equal to 0.1 eV, further preferably greater than or equal to 0.2 eV, still further preferably greater than or equal to 0.3 eV. Such an energy level correlation is preferable because electrons and holes, which are carriers injected from the pair of electrodes (the electrodes 101 and 102), are easily injected into the compound 131 and the compound 132. Note that the HOMO level of the compound 131 may be equivalent to that of the compound 132, or the LUMO level of the compound 131 may be equivalent to that of the compound 132.

Note that the LUMO levels and the HOMO levels of the compounds can be derived from the electrochemical characteristics (the reduction potentials and the oxidation potentials) of the compounds that are measured by cyclic voltammetry (CV).

When the compound 131 has a hole-transport property and the compound 132 has an electron-transport property, for example, it is preferred that the HOMO level of the compound 131 be higher than that of the compound 132 and the LUMO level of the compound 131 be higher than that of the compound 132, as in an energy band diagram in FIG. 2A. Such an energy level correlation is preferable because electrons and holes, which are carriers injected from the pair of electrodes (the electrodes 101 and 102), are easily injected into the compound 131 and the compound 132, respectively.

In FIG. 2A, Comp (131) represents the compound 131; Comp (132), the compound 132; $\Delta E_{C1}$, the energy difference between the LUMO level and HOMO level of the compound 131; $\Delta E_{C2}$, the energy difference between the LUMO level and HOMO level of the compound 132; and $\Delta E_E$, the energy difference between the LUMO level of the compound 132 and the HOMO level of the compound 131.

The exciplex formed by the compound 131 and the compound 132 has HOMO in the compound 131 and LUMO in the compound 132. The excitation energy of the exciplex roughly corresponds to the energy difference ($\Delta E_E$) between the LUMO level of the compound 132 and the HOMO level of the compound 131, which is smaller than the energy difference ($\Delta F_{C1}$) between the LUMO level and HOMO level of the compound 131 and the energy difference ($\Delta F_{C2}$) between the LUMO level and HOMO level of the compound 132. Thus, when the compound 131 and the compound 132 form an exciplex, an excited state can be formed with lower excitation energy. Having lower excitation energy, the exciplex can form a stable excited state.

FIG. 2B shows the correlation of the energy levels of the compounds 131, 132, and 133 in the light-emitting layer 130. In FIG. 2B, $S_{C1}$ represents the S1 level of the compound 131; $S_E$, the S1 level of the exciplex; and $T_E$, the T1 level of the exciplex. The other terms and numerals in FIG. 2B are the same as those shown in FIG. 1C.

In this structure example, the compound 131 and the compound 132 contained in the light-emitting layer 130 form the exciplex in the light-emitting element of one embodiment of the present invention. The S1 level ($S_E$) and the T1 level ($T_E$) of the exciplex are close to each other (see Route $A_4$ in FIG. 2B).

When the exciplex formed through the above process loses excitation energy by emitting light or supplying the excitation energy to another material, for example, and is brought into a ground state, the two substances forming the exciplex individually behave as the original separate substances.

Since the excitation energy levels ($S_E$ and $T_E$) of the exciplex are lower than the S1 levels ($S_{C1}$ and $S_{C2}$) of the substances that form the exciplex (i.e., the compounds 131 and 132), an excited state can be formed with lower excitation energy. Accordingly, the driving voltage of the light-emitting element 150 can be lowered.

Since the S1 level and T1 level ($S_E$ and $T_E$) of the exciplex are adjacent to each other, the exciplex has a function of exhibiting thermally activated delayed fluorescence. In other words, the exciplex has a function of converting triplet excitation energy into singlet excitation energy by upconversion. Thus, the triplet excitation energy generated in the light-emitting layer 130 is partly converted into singlet excitation energy by the exciplex. In order to cause this conversion, the energy difference between the S1 level and T1 level ($S_E$ and $T_E$) of the exciplex is preferably greater than 0 eV and less than or equal to 0.2 eV, further preferably greater than 0 eV and less than or equal to 0.1 eV. Note that in order to efficiently cause reverse intersystem crossing, the T1 level ($T_E$) of the exciplex is preferably lower than the T1 levels ($T_{C1}$ and $T_{C2}$) of the compounds 131 and 132 forming the exciplex. Accordingly, quenching of the triplet excitation energy of the exciplex formed by the compound 131 and the compound 132 does not easily occur, which causes efficient reverse intersystem crossing from triplet excitation energy to singlet excitation energy by the exciplex.

The singlet excitation energy level ($S_E$) of the exciplex is preferably higher than the singlet excitation energy level ($S_G$) of the compound 133 serving as a light-emitting material. With such an energy level correlation, the singlet excitation energy of the formed exciplex can be transferred from the singlet excitation energy level ($S_E$) of the exciplex to the singlet excitation energy level ($S_G$) of the compound 133.

Here, the energy level correlation between the compound 131 and the compound 132 is not limited to that shown in FIG. 2B. In other words, the singlet excitation energy level ($S_{C1}$) of the compound 131 may be higher or lower than the singlet excitation energy level ($S_{C2}$) of the compound 132, and the triplet excitation energy level ($T_{C1}$) of the compound 131 may be higher or lower than the triplet excitation energy level ($T_{C2}$) of the compound 132.

A phosphorescent compound is used as one of the compounds that form the exciplex in one embodiment of the present invention, which allows intersystem crossing between a singlet state and a triplet state. Thus, an exciplex in which the triplet excited state can be transferred to the singlet ground state can be formed. In that case, the triplet excitation energy level ($T_E$) of the exciplex is preferably higher than the singlet excitation energy level ($S_G$) of the compound 133, which is a light-emitting material. With such an energy level correlation, the triplet excitation energy of the formed exciplex can be transferred from the triplet excitation energy level ($T_E$) of the exciplex to the singlet excitation energy level ($S_G$) of the compound 133. Note that it can be difficult to clearly distinguish fluorescence and phosphorescence from each other in an emission spectrum because the S1 level and the T1 level ($S_E$ and $T_E$) of the exciplex are adjacent to each other. In that case, fluorescence and phosphorescence can sometimes be distinguished from each other in emission lifetime.

Through the above-described energy transfer process, the compound 133 is brought into a singlet excited state and can emit light (see Route $A_5$ in FIG. 2B).

The triplet excitation energy transferred from $T_E$ to $T_G$ deactivates (Route $A_6$ in FIG. 2B). For that reason, the amount of energy transferred via Route $A_6$ is preferably small. In order to avoid energy transfer via Route $A_6$, the weight ratio of the compound 133 to the total of the compounds 131 and 132 is preferably low, and specifically ranges preferably from 0.001 to 0.05, further preferably from 0.001 to 0.01.

Note that when the direct carrier recombination process is dominant in the compound 133, a large number of triplet excitons are generated in the compound 133, resulting in decreased emission efficiency due to thermal deactivation. Thus, the proportion of the energy transfer through the exciplex formation process (Route $A_5$ in FIG. 2B) is preferably higher than that of the direct carrier recombination process in the compound 133, in which case the probability of generating the triplet excited state of the compound 133 can be lowered and thermal deactivation can be reduced. In order to make this condition, the weight ratio of the compound 133 to the total of the compounds 131 and 132 is preferably low, and specifically ranges preferably from 0.001 to 0.05, further preferably from 0.001 to 0.01.

In addition, $T_G$ is preferably 2.0 eV or lower, in which case a highly reliable light-emitting element can be obtained.

Alternatively, the compound 131 may have an electron-transport property and the compound 132 may have a hole-transport property. In that case, the HOMO level of the compound 132 is preferably higher than that of the compound 131 and the LUMO level of the compound 132 is preferably higher than that of the compound 131.

The weight ratio of the compound 131 to the compound 132 is preferably low. Specifically, the weight ratio of the compound 131 to the compound 132 ranges preferably from 0.01 to 0.5, further preferably from 0.05 to 0.3.

When all the energy transfer processes through Route $A_4$ and Route $A_5$ occur efficiently in the above manner, both the singlet excitation energy and the triplet excitation energy generated in the light-emitting layer 130 are efficiently converted into the singlet excitation energy of the compound 133, whereby the light-emitting element 150 can emit light with high emission efficiency.

In the light-emitting element of one embodiment of the present invention, the benzofuropyrimidine skeleton included in the compound 132 is preferably a benzofuro[3,2-d]pyrimidine skeleton, and the benzothienopyrimidine skeleton included in the compound 132 is preferably a benzothieno[3,2-d]pyrimidine skeleton. Such a composition lowers the LUMO level of the compound 132, which is suitable for forming an exciplex.

The benzofuro[3,2-d]pyrimidine skeleton or the benzothieno[3,2-d]pyrimidine skeleton preferably has a substituent at the 4-position and/or the 8-position. Such a composition lowers the LUMO level of the compound 132, which is suitable for forming an exciplex.

The above-described process through Route $A_4$ and Route $A_5$ may be referred to as exciplex-singlet energy transfer (ExSET) or exciplex-enhanced fluorescence (ExEF) in this specification and the like. In other words, in the light-emitting layer 130, excitation energy is supplied from the exciplex to the fluorescent compound.

When the light-emitting layer 130 has the above-described structure, light emitted from the fluorescent compound can be efficiently obtained.

<Structure Example 3 of Light-Emitting Layer>

Figure 3:
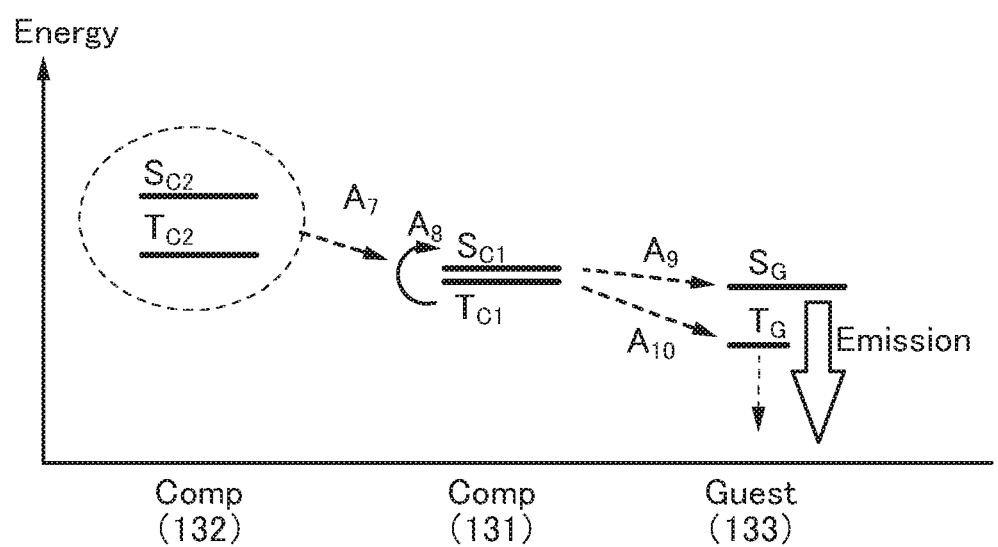
FIG. 3 shows the energy level correlation in a light-emitting layer of a light-emitting element of one embodiment of the present invention.

FIG. 3 shows an example of the energy level correlation in the light-emitting layer included in the light-emitting element of one embodiment of the present invention. In this structure example, the compound 131 is a thermally activated delayed fluorescent material. Note that $S_{C1}$ denotes the S1 level of the compound 131, and the other terms and numerals in FIG. 3 are the same as those shown in FIG. 1C.

In FIG. 3, an excited state is formed when the compound 131 or the compound 132 receives holes and electrons. The excitation energy of the compound 132 can be transferred promptly to the compound 131 (Route $A_7$). At this time, $S_{C2} \geq S_{C1}$ and $T_{C2} \geq T_{C1}$ are preferable. Here, the light-emitting layer 130 is formed with a mixture of the compounds 131, 132, and 133; the proportion of the compound 132 is preferably higher than that of the compound 131 in the mixture, and specifically, the weight ratio of the compound 131 to the compound 132 preferably ranges from 1:9 to 3:7. Such a composition enables the compound 131 to be excited efficiently.

Since the compound 131 is a thermally activated delayed fluorescent material, the triplet excitation energy of the compound 131 is upconverted into the singlet excitation energy at a temperature around room temperature (Route $A_8$). Moreover, because energy transfer from the singlet excitation energy level ($S_{C1}$) of the compound 131 to the singlet excitation energy level ($S_G$) of the compound 133 (i.e., Route $A_9$) is allowed, the triplet excitation energy of the compound 131 can be transferred to the singlet excitation energy level ($S_G$) of the compound 133 through the processes via Route $A_8$ and Route $A_9$. Here, $T_{C2} \geq T_{C1} \geq S_G$ as shown in FIG. 3 is preferable, in which case both the singlet excitation energy and the triplet excitation energy are efficiently transferred from the compound 131 and the compound 132 to the compound 133, which is the guest material.

To advance the above-described upconversion efficiently, the energy difference between the S1 level ($S_{C1}$) and the T1 level ($T_{C1}$) of the thermally activated delayed fluorescent material is preferably greater than 0 eV and less than or equal to 0.2 eV, further preferably greater than 0 eV and less than or equal to 0.1 eV.

The triplet excitation energy transferred from $T_{C2}$ to $T_G$ deactivates (Route $A_{10}$ in FIG. 3). For that reason, the amount of energy transferred via Route $A_{10}$ is preferably small. To avoid energy transfer via Route $A_{10}$, the energy difference between $T_{C1}$ and $T_G$ is preferably large; therefore, $T_G$ is preferably 2.0 eV or lower. With such a structure, a highly reliable light-emitting element having high emission efficiency can be obtained.

When the light-emitting layer 130 has the above-described structure, light emitted from the fluorescent compound of the light-emitting layer 130 can be efficiently obtained.

<Structure Example 4 of Light-Emitting Layer>

Figure 4A:
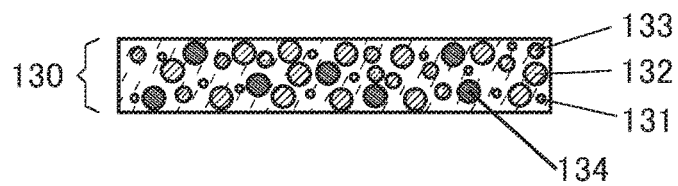
FIGS. 4A and 4B show the energy level correlation in a light-emitting layer of a light-emitting element of one embodiment of the present invention.

FIG. 4A shows the light-emitting layer 130 containing four kinds of materials. In FIG. 4A, the light-emitting layer 130 contains the compound 131, the compound 132, the compound 133, and a compound 134. In one embodiment of the present invention, the compound 131 is capable of converting triplet excitation energy into light; the compound 132 is an organic compound having a benzofuropyrimidine skeleton or a benzothienopyrimidine skeleton; the compound 133 is a guest material that emits fluorescence; and the compound 134 is an organic compound that forms an exciplex together with the compound 132.

Figure 4B:
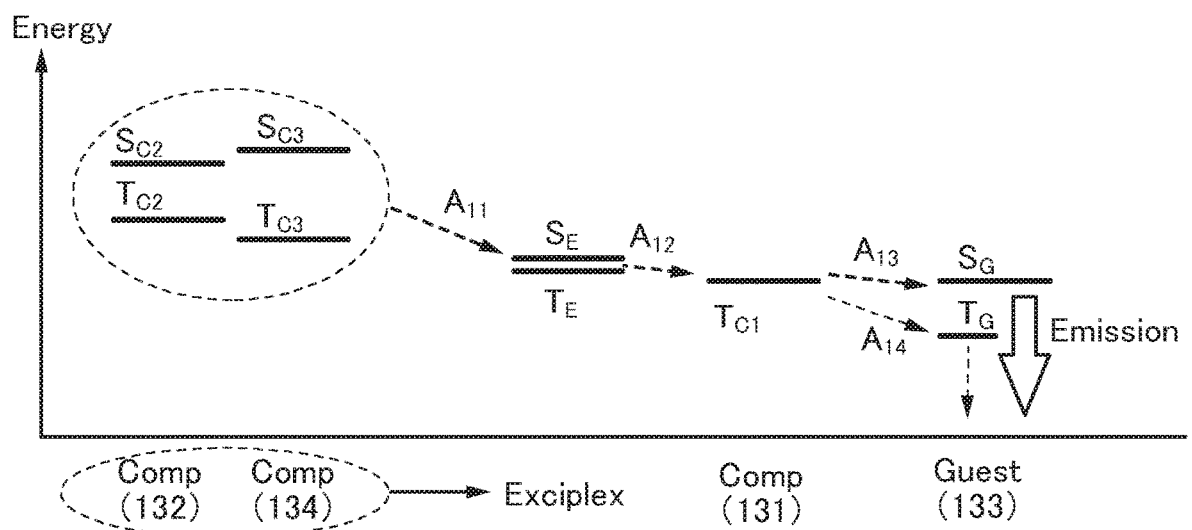

FIG. 4B shows the correlation of the energy levels of the compounds 131, 132, 133, and 134 in the light-emitting layer 130. In FIG. 4B, $S_{C3}$ and $T_{C2}$ represent the S1 level and the T1 level of the compound 134. The other terms and numerals in FIG. 4B are the same as those shown in FIG. 2B.

In this structure example, the compound 132 and the compound 134 contained in the light-emitting layer 130 form the exciplex in the light-emitting element of one embodiment of the present invention. The S1 level ($S_E$) and the T1 level ($T_E$) of the exciplex are close to each other (see Route $A_{11}$ in FIG. 4B).

As described above, when the exciplex formed through the aforementioned process loses excitation energy, the two substances forming the exciplex individually behave as the original separate substances.

Since the excitation energy levels ($S_E$ and $T_E$) of the exciplex are lower than the S1 levels ($S_{C2}$ and $S_{C3}$) of the substances that form the exciplex (i.e., the compounds 132 and 134), an excited state can be formed with lower excitation energy. Accordingly, the driving voltage of the light-emitting element 150 can be lowered.

Here, the compound 131 is a phosphorescent compound, and thus intersystem crossing between a singlet state and a triplet state is allowed. Hence, both the singlet excitation energy and the triplet excitation energy of the exciplex are transferred promptly to the compound 131 (Route $A_{12}$). At this time, $T_E$ $T_{C1}$ is preferable. In addition, the triplet excitation energy of the compound 131 can be efficiently converted into the singlet excitation energy of the compound 133 (Route $A_{13}$). Here, $T_E$ $T_{C1}$ $S_G$ as shown in FIG. 4B is preferable, in which case the excitation energy of the compound 131 is efficiently transferred as the singlet excitation energy to the compound 133, which is the guest material.

Although any combination of the compound 132 and the compound 134 that can form an exciplex is acceptable here, it is preferred that one of them be a compound having a hole-transport property and the other be a compound having an electron-transport property. In that case, a donor-acceptor exciplex is easily formed; thus, efficient formation of an exciplex is possible. When the compounds 132 and 134 are a combination of a compound having a hole-transport property and a compound having an electron-transport property, the carrier balance can be easily controlled by adjustment of the mixing ratio. Specifically, the weight ratio of the compound having a hole-transport property to the compound having an electron-transport property is preferably within a range of 1:9 to 9:1. Since the carrier balance can be easily controlled with the above composition, a carrier recombination region can also be controlled easily.

For the combination of the materials for forming an exciplex efficiently, it is preferred that the HOMO level of one of the compounds 132 and 134 is higher than that of the other compound and the LUMO level of the one of the compounds is higher than that of the other compound. Specifically, the energy difference between the HOMO levels of the compound 132 and the compound 134 is preferably greater than or equal to 0.1 eV, further preferably greater than or equal to 0.2 eV, still further preferably greater than or equal to 0.3 eV. Moreover, the energy difference between the LUMO levels of the compound 132 and the compound 134 is preferably greater than or equal to 0.1 eV, further preferably greater than or equal to 0.2 eV, still further preferably greater than or equal to 0.3 eV. Such an energy level correlation is preferable because electrons and holes, which are carriers injected from the pair of electrodes (the electrodes 101 and 102), are easily injected into the compound 132 and the compound 134. Note that the HOMO level of the compound 132 may be equivalent to that of the compound 134, or the LUMO level of the compound 132 may be equivalent to that of the compound 134.

The energy level correlation between the compound 132 and the compound 134 is not limited to that shown in FIG. 4B. In other words, the singlet excitation energy level ($S_{C2}$) of the compound 132 may be higher or lower than the singlet excitation energy level ($S_{C3}$) of the compound 134, and the triplet excitation energy level ($T_{C1}$) of the compound 131 may be higher or lower than the triplet excitation energy level ($T_{C3}$) of the compound 134.

In the compound 132 of the light-emitting element of one embodiment of the present invention, the benzofuropyrimidine skeleton is preferably a benzofuro[3,2-d]pyrimidine skeleton, and the benzothienopyrimidine skeleton is preferably a benzothieno[3,2-d]pyrimidine skeleton. Such a composition lowers the LUMO level of the compound 132, which is suitable for forming an exciplex.

The benzofuro[3,2-d]pyrimidine skeleton or the benzothieno[3,2-d]pyrimidine skeleton preferably has a substituent at the 4-position and/or the 8-position. Such a composition lowers the LUMO level of the compound 132, which is suitable for forming an exciplex.

The triplet excitation energy transferred from $T_{C1}$ to $T_G$ deactivates (Route $A_{14}$ in FIG. 4B). For that reason, the amount of energy transferred via Route $A_{14}$ is preferably small. To avoid energy transfer via Route $A_{14}$, the weight ratio of the compound 133 to the total of the compounds 131, 132, and 134 is preferably low, and specifically ranges preferably from 0.001 to 0.05, further preferably from 0.001 to 0.01.

In addition, $T_G$ is preferably 2.0 eV or lower, in which case a highly reliable light-emitting element can be obtained.

<Energy Transfer Mechanism>

Here, factors controlling the processes of intermolecular energy transfer are described. As mechanisms of the intermolecular energy transfer, two mechanisms, i.e., the Förster mechanism (dipole-dipole interaction) and the Dexter mechanism (electron exchange interaction) have been proposed. Here, an intermolecular energy transfer process between a first material in an excited state and a second material in a ground state is described; this energy transfer process can apply to the case where one of the materials is an exciplex.

<<Förster Mechanism>>

In the Förster mechanism, energy transfer does not require direct contact between molecules, and energy is transferred through resonance of dipole oscillation between the first material and the second material. By the resonance of dipole oscillation, the first material provides energy to the second material, and thus, the first material in an excited state is brought to a ground state and the second material in a ground state is brought to an excited state. The rate constant $k_{h^* \to g}$ of the Förster mechanism is expressed by Formula 1.

$$k_{h^* \to g} = \frac{9000 c^4 K^2 \phi \ln 10}{128\pi^5 n^4 N \tau R^6} \int \frac{f' h^{(v)\varepsilon} g^{(v)}}{v^4} dv \quad \text{[Formula 1]}$$

In Formula 1, v denotes a frequency; $f_h(v)$, a normalized emission spectrum of the first material (a fluorescent spectrum for discussing energy transfer from a singlet excited state, and a phosphorescent spectrum for discussing energy transfer from a triplet excited state); $\varepsilon_g(v)$, a molar absorption coefficient of the second material; N, Avogadro number; n, a refractive index of a medium; R, an intermolecular distance between the first material and the second material; τ, a measured excited-state lifetime (fluorescence lifetime or phosphorescence lifetime); c, the speed of light; ϕ, an emission quantum yield (a fluorescence quantum yield for discussing energy transfer from a singlet excited state, and a phosphorescence quantum yield for discussing energy transfer from a triplet excited state); and $K^2$, a coefficient (0 to 4) representing transition dipole moment orientation of the first material and the second material. Note that $K^2$ is 2/3 for random orientation.

<<Dexter Mechanism>>

In the Dexter mechanism, the first material and the second material are close to a contact effective range where their orbitals overlap, and energy is transferred through exchange of electrons between the first material in an excited state and the second material in a ground state. The rate constant $k_{h^* \to g}$ of the Dexter mechanism is expressed by Formula 2.

$$k_{h^* \to g} = \left(\frac{2\pi}{h}\right) K^2 \exp\left(-\frac{2R}{L}\right) \int f' h^{(v)\varepsilon'} g^{(v)dv} \quad \text{[Formula 2]}$$

In Formula 2, h denotes the Planck constant; K, a constant having an energy dimension; v, a frequency; $f_h(v)$, a normalized emission spectrum of the first material (a fluorescent spectrum for discussing energy transfer from a singlet excited state, and a phosphorescent spectrum for discussing energy transfer from a triplet excited state); $\varepsilon'_g(v)$, a normalized absorption spectrum of the second material; L, an effective molecular radius; and R, an intermolecular distance between the first material and the second material.

Here, the efficiency of energy transfer from the first material to the second material (energy transfer efficiency $\phi_{ET}$) is expressed by Formula 3. In the formula, $k_r$ denotes a rate constant of a light-emission process (fluorescence for discussing energy transfer from a singlet excited state, and phosphorescence for discussing energy transfer from a triplet excited state) of the first material; $k_n$, a rate constant of a non-light-emission process (thermal deactivation or intersystem crossing) of the first material; and ti, a measured excited-state lifetime of the first material.

$$\phi_{ET} = \frac{k_{h^* \to g}}{k_r + k_n + k_{h^* \to g}} = \frac{k_{h^* \to g}}{\left(\frac{1}{\tau}\right) + k_{h^* \to g}} \quad [\text{Formula 3}]$$

Formula 3 shows that the energy transfer efficiency $\phi_{ET}$ can be increased by increasing the rate constant $k_{h^* \to g}$ of energy transfer so that the other competing rate constant $k_r + k_n$ (=1/τ) becomes relatively small.

<<Concept for Promoting Energy Transfer>>

First, energy transfer by the Förster mechanism is described. When Formula 1 is substituted into Formula 3, τ can be eliminated. Thus, in the Förster mechanism, the energy transfer efficiency $\phi_{ET}$ does not depend on the excited-state lifetime τ of the first material. Furthermore, it can be said that higher energy transfer efficiency $\phi_{ET}$ is obtained with higher emission quantum yield $\phi$ (fluorescence quantum yield for discussing energy transfer from a singlet excited state, and phosphorescence quantum yield for discussing energy transfer from a triplet excited state).

Preferably, the emission spectrum of the first material (the fluorescent spectrum for discussing energy transfer from a singlet excited state, and the phosphorescent spectrum for discussing energy transfer from a triplet excited state) largely overlaps the absorption spectrum of the second material (absorption corresponding to transition from the singlet ground state to the singlet excited state). Moreover, the molar absorption coefficient of the second material is preferably high. This means that the emission spectrum of the first material overlaps the longest-wavelength-side absorption band of the second material. Since direct transition from the singlet ground state to the triplet excited state is forbidden in the second material, the molar absorption coefficient of the second material in the triplet excited state is negligible. Thus, a process of energy transfer from the excited state of the first material to the triplet excited state of the second material by the Förster mechanism can be ignored, and only a process of energy transfer to the singlet excited state of the second material is considered.

Next, energy transfer by the Dexter mechanism is described. According to Formula 2, in order to increase the rate constant $k_{h^* \to g}$, it is preferred that the emission spectrum of the first material (the fluorescent spectrum for discussing energy transfer from a singlet excited state, and the phosphorescent spectrum for discussing energy transfer from a triplet excited state) largely overlap the absorption spectrum of the second material (absorption corresponding to transition from a singlet ground state to a singlet excited state). Therefore, the energy transfer efficiency can be optimized by making the emission spectrum of the first material overlap the longest-wavelength-side absorption band of the second material.

When Formula 2 is substituted into Formula 3, it is found that the energy transfer efficiency $\phi_{ET}$ in the Dexter mechanism depends on z. In the Dexter mechanism, which is the energy transfer process based on electron exchange, energy transfer from the triplet excited state of the first material to the triplet excited state of the second material occurs, as well as the energy transfer from the singlet excited state of the first material to the singlet excited state of the second material.

In a manner similar to that of the energy transfer from the first material to the second material, the energy transfer by both the Förster mechanism and the Dexter mechanism occurs in the energy transfer process from the exciplex to the fluorescent compound.

In the light-emitting element of one embodiment of the present invention in which the second material is a fluorescent compound, the efficiency of energy transfer to the triplet excited state of the second material is preferably low. That is, the energy transfer efficiency based on the Dexter mechanism from the first material to the second material is preferably low, and the energy transfer efficiency based on the Förster mechanism from the first material to the second material is preferably high.

As described above, the energy transfer efficiency in the Förster mechanism does not depend on the excited-state lifetime τ of the first material. In contrast, the energy transfer efficiency in the Dexter mechanism depends on the excited-state lifetime τ of the first material. To reduce the energy transfer efficiency in the Dexter mechanism, the excited-state lifetime τ of the first material is preferably short.

In view of the above, in one embodiment of the present invention, an exciplex or a TADF material is used for the first material, and one of the compounds that form the exciplex is capable of converting triplet excitation energy into light. With the structure of one embodiment of the present invention, reverse intersystem crossing from the triplet excited state to the singlet excited state of the exciplex (first material) can be promoted, and the triplet excited-state lifetime τ of the exciplex (first material) can be shortened. Furthermore, transition from the triplet excited state to the singlet ground state of the exciplex (first material) can be promoted, and the triplet excited-state lifetime τ of the exciplex (first material) can be shortened. As a result, the efficiency of energy transfer in the Dexter mechanism from the triplet excited state of the exciplex (first material) to the triplet excited state of the fluorescent compound (second material) can be reduced; thus, a light-emitting element with high emission efficiency can be provided in one embodiment of the present invention.

In addition, the fluorescence lifetime of a thermally activated delayed fluorescent component in light emitted from the exciplex is preferably short, and specifically ranges preferably from 10 ns to 50 μs, further preferably from 10 ns to 20 μs, still further preferably from 10 ns to 10 μs.

The rate constant of the Förster mechanism is inversely proportional to the 6th power of the distance between the first material and the second material, and the rate constant of the Dexter mechanism is inversely proportional to the exponential function of the distance between the first material and the second material. Thus, the Dexter mechanism is dominant when the distance between the two molecules is approximately 1 nm or less, whereas the Förster mechanism is dominant when the distance is approximately 1 nm or more. To reduce the energy transfer efficiency in the Dexter mechanism, the distance between the first material and the second material is preferably long, and specifically preferably 0.7 nm or more, further preferably 0.9 nm or more, still further preferably 1 nm or more. Furthermore, to cause the energy transfer efficiently in the Förster mechanism, the distance between the first material and the second material is preferably 5 nm or less.

In light of the above, in one embodiment of the present invention, the compound 133, which is a fluorescent compound, preferably includes at least two alkyl groups each having 2 or more carbon atoms. Alternatively, the compound 133 preferably includes at least two branched alkyl groups each having 3 to 10 carbon atoms. Further alternatively, the compound 133 preferably includes at least two cyclic hydrocarbon groups each having 3 to 10 carbon atoms or at least two bridged cyclic hydrocarbon groups each having 3 to 10 carbon atoms. Furthermore, the compound 133 preferably includes a condensed aromatic hydrocarbon having 3 to 12 carbon atoms.

<Materials>

Next, the components of the light-emitting element of one embodiment of the present invention will be described in detail below.

<<Light-Emitting Layer>>

Materials that can be used for the light-emitting layer 130 are described below.

The compound 132 is an organic compound having a benzofuropyrimidine skeleton or a benzothienopyrimidine skeleton. The organic compound has a favorable electron-transport property and a high T1 level, and thus is suitable for a host material of the light-emitting layer.

The benzofuropyrimidine skeleton or the benzothienopyrimidine skeleton is preferably a benzofuro[3,2-d]pyrimidine skeleton or a benzothieno[3,2-d]pyrimidine skeleton, and more preferably, the benzofuro[3,2-d]pyrimidine skeleton or the benzothieno[3,2-d]pyrimidine skeleton has a substituent at the 4-position and/or the 8-position. With such a composition, a light-emitting element having high emission efficiency and high reliability can be obtained.

An example of a compound having the benzofuropyrimidine skeleton or the benzothienopyrimidine skeleton is an organic compound having a naphthofuropyrimidinyl group or a naphthothienopyrimidinyl group. An organic compound having a naphthofuropyrimidinyl group or a naphthothienopyrimidinyl group is highly reliable and is suitably used for the light-emitting element of one embodiment of the present invention.

Examples of the benzofuropyrimidine skeleton and the benzothienopyrimidine skeleton are skeletons represented by the following General Formulae (101) to (114). In General Formulae (101) to (114), X represents an oxygen atom or a sulfur atom; $Ht^1$ and $Ht^2$ each independently represent hydrogen or any one of (Ht-1) to (Ht-13) shown below; and $Ar^1$ and $Ar^2$ each independently represent hydrogen or any one of (Ar-1) to (Ar-27) shown below. Note that an organic compound having a benzofuropyrimidine skeleton or a benzothienopyrimidine skeleton that can be used in one embodiment of the present invention is not limited to those exemplified below.

[Chemical Formulae 1]

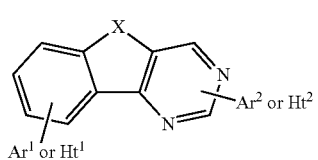
(101)

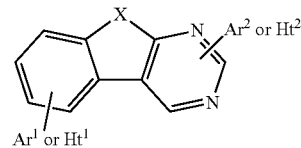
(102)

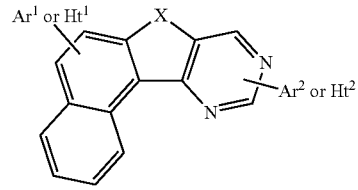
(103)

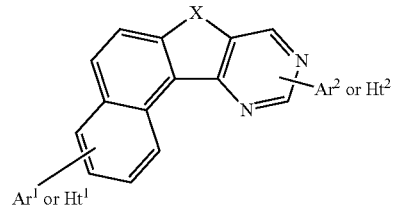
(104)

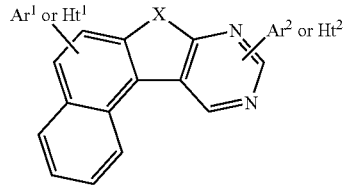
(105)

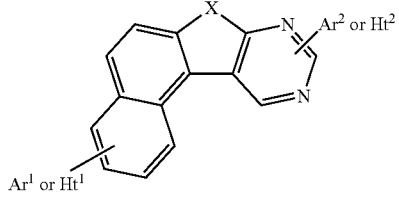
(106)

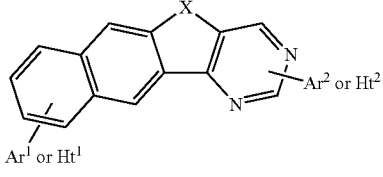
(107)

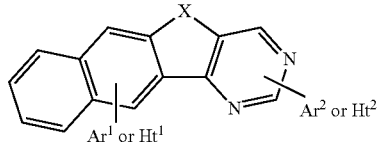
(108)

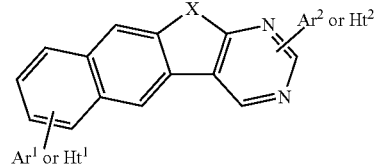
(109)

-continued

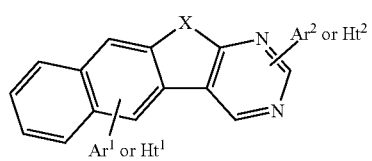
(110)

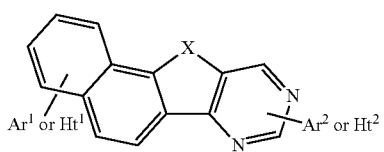
(111)

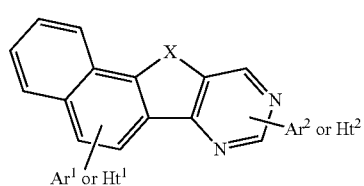
(112)

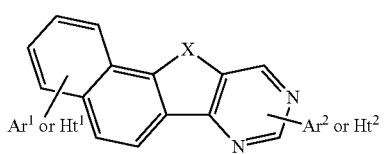
(113)

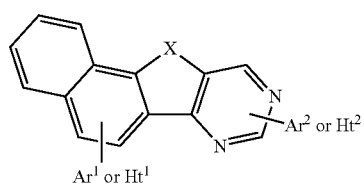
(114)

A substituent bonded at the 4-position and/or the 8-position of the benzofuro[3,2-d]pyrimidine skeleton or the benzothieno[3,2-d]pyrimidine skeleton is preferably a substituent having a π-electron rich heteroaromatic skeleton represented by Ht in General Formulae (101) to (114). The skeleton is preferably a furan skeleton, a thiophene skeleton, or a pyrrole skeleton because of their high stability and high reliability, and is more preferably a carbazole skeleton, a dibenzofuran skeleton, or a dibenzothiophene skeleton. With such a structure, a highly reliable light-emitting element can be obtained.

Examples of the η-electron rich heteroaromatic skeleton include skeletons represented by the following General Formulae (Ht-1) to (Ht-13). Note that X in General Formulae (Ht-1) to (Ht-13) represents an oxygen atom or a sulfur atom.

[Chemical Formulae 2]

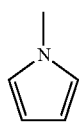
(Ht-1)

-continued

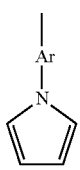
(Ht-2)

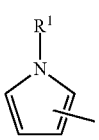
(Ht-3)

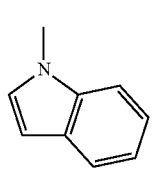
(Ht-4)

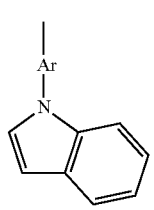
(Ht-5)

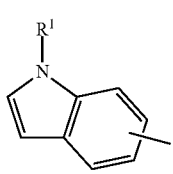
(Ht-6)

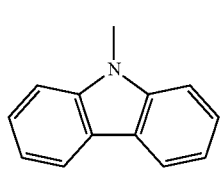
(Ht-7)

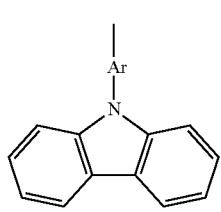
(Ht-8)

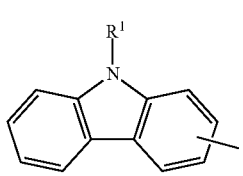
(Ht-9)

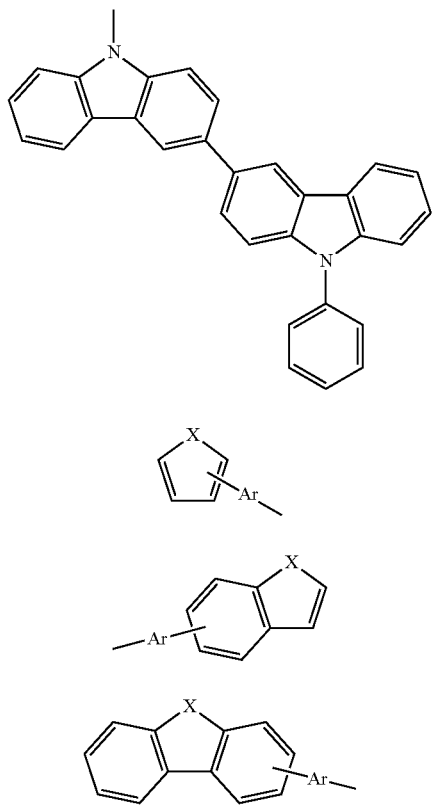

(Ht-10)

(Ht-11)

(Ht-12)

(Ht-13)

In General Formulae (101) to (114) and General Formulae (Ht-1) to (Ht-13) shown above, a substituent may be included. As the substituent, an alkyl group having 1 to 6 carbon atoms, a cycloalkyl group having 3 to 6 carbon atoms, or a substituted or unsubstituted aryl group having 6 to 12 carbon atoms can be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 12 carbon atoms include a phenyl group, a naphthyl group, and a biphenyl group. The above substituents may be bonded to each other to form a ring. For example, in the case where a carbon atom at the 9-position in a fluorene skeleton has two phenyl groups as substituents, the phenyl groups are bonded to form a spirofluorene skeleton. Note that an unsubstituted group has an advantage in easy synthesis and an inexpensive raw material.

The substituents denoted as $Ar^1$ and $Ar^2$ in General Formulae (101) to (114) are each independently represents, for example, hydrogen or a substituted or unsubstituted aryl group having 6 to 25 carbon atoms. Examples of the aryl group having 6 to 25 carbon atoms include a phenyl group, a naphthyl group, a biphenyl group, a terphenyl group, and a fluorenyl group. Specific examples are groups represented by the following Structural Formulae (Ar-28) to (Ar-46). Note that the substituents represented by $Ar^1$ and $Ar^2$ are not limited to those exemplified here.

[Chemical Formulae 3]

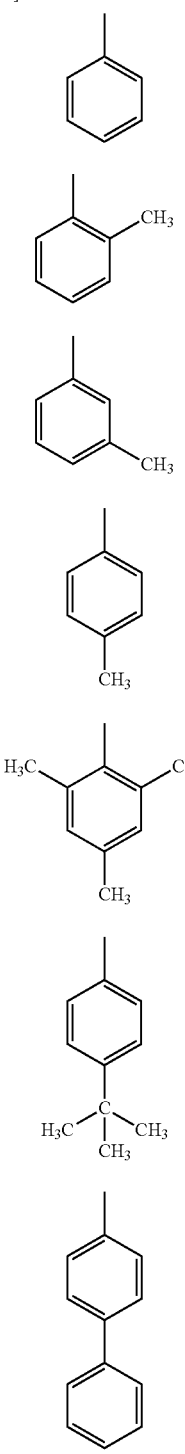

(Ar-28)

(Ar-29)

(Ar-30)

(Ar-31)

(Ar-32)

(Ar-33)

(Ar-34)

(Ar-35)

(Ar-36) 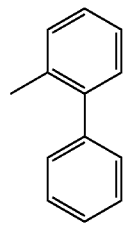

(Ar-37) 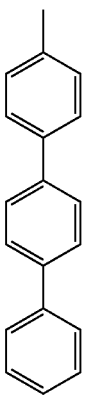

(Ar-38) 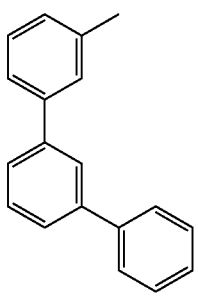

(Ar-39) 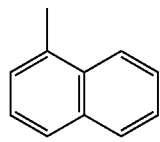

(Ar-40) 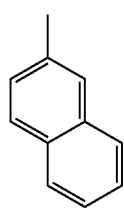

(Ar-41) 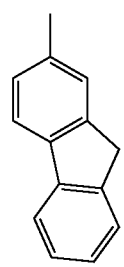

(Ar-42) 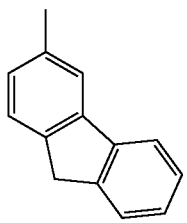

(Ar-43) 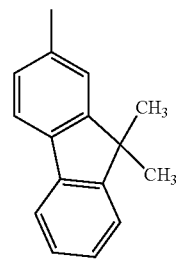

(Ar-44) 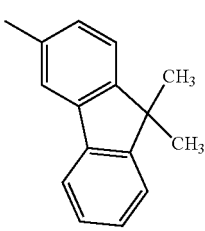

(Ar-45) 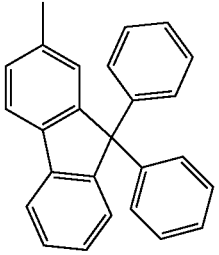

(Ar-46) 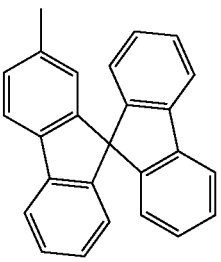

In General Formulae (Ht-2), (Ht-5), (Ht-8), and (Ht-11) to (Ht-13), Ar may represent a single-bond arylene group or an arylene group having 6 to 25 carbon atoms. The arylene group may include one or more substituents, and the substituents may be bonded to each other to form a ring. For example, a carbon atom at the 9-position in a fluorenyl group has two phenyl groups as substituents and the phenyl groups are bonded to form a spirofluorene skeleton. Specific examples of the arylene group having 6 to 25 carbon atoms include a phenylene group, a naphthalenediyl group, a biphenyldiyl group, and a fluorenediyl group. In the case where the arylene group includes a substituent, the substituent can be an alkyl group having 1 to 6 carbon atoms, a cycloalkyl group having 3 to 6 carbon atoms, or an aryl group having 6 to 12 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 12 carbon atoms include a phenyl group, a naphthyl group, and a biphenyl group.

As the arylene group represented by Ar, any of groups represented by the following Structural Formulae (Ar-1) to (Ar-27) can be used, for example. Note that the group that can be used as Ar is not limited to these.

[Chemical Formulae 4]

(Ar-1)

(Ar-2)

(Ar-3)

(Ar-4)

(Ar-5)

(Ar-6)

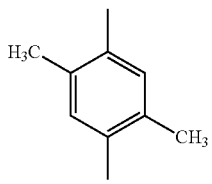

(Ar-7)

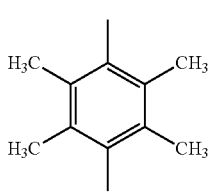

-continued (Ar-8)

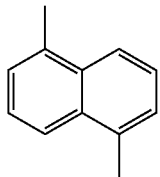

(Ar-9)

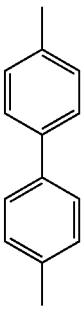

(Ar-10)

(Ar-11)

(Ar-12)

(Ar-13)

(Ar-14)
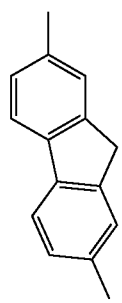
(Ar-15)
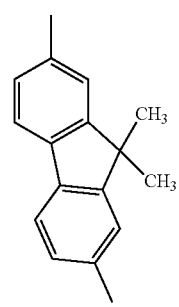
(Ar-16)
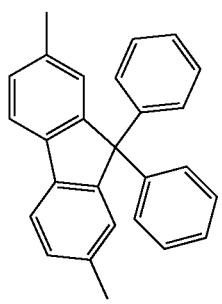
(Ar-17)
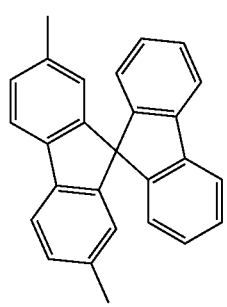
(Ar-18)
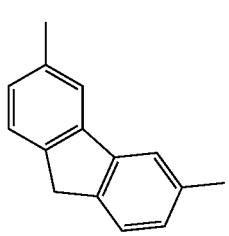
(Ar-19)
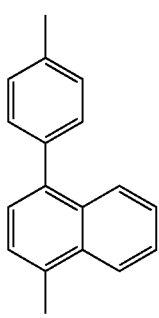
(Ar-20)
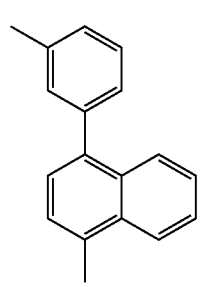
(Ar-21)
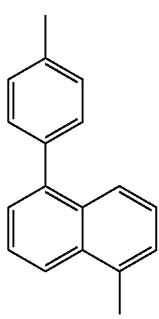
(Ar-22)
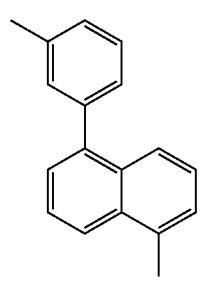
(Ar-23)
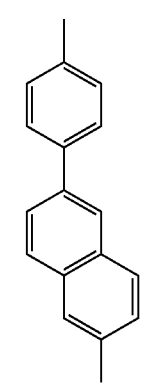

(Ar-24)
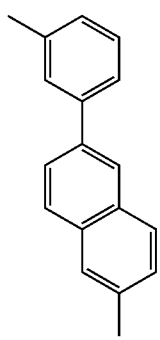

(Ar-25)
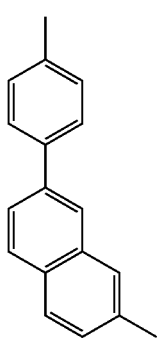

(Ar-26)
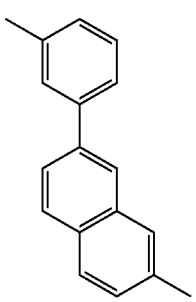

(Ar-27)
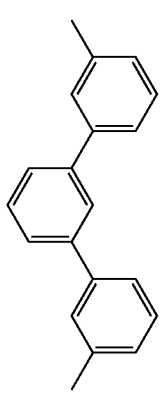

In General Formulae (Ht-3), (Ht-6), and (Ht-9), le represents any of hydrogen, an alkyl group having 1 to 6 carbon atoms, a cycloalkyl group having 3 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group. The above aryl group or phenyl group may include substituents, and the substituents may be bonded to each other to form a ring. As the substituent, an alkyl group having 1 to 6 carbon atoms, a cycloalkyl group having 3 to 6 carbon atoms, or an aryl group having 6 to 12 carbon atoms can be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 12 carbon atoms include a phenyl group, a naphthyl group, and a biphenyl group.

As the alkyl group or the aryl group represented by R', any of groups represented by the following Structural Formulae (R-1) to (R-32) can be used, for example. Note that the group that can be used as the alkyl group or the aryl group is not limited to these.

[Chemical Formulae 5]

(R-1) 

(R-2) 

(R-3) 

(R-4) 

(R-5) 

(R-6) 

(R-7) 

(R-8) 

(R-9) 

-continued
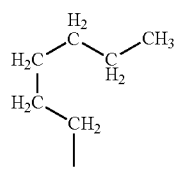 (R-10)
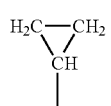 (R-11)
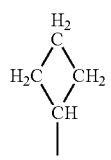 (R-12)
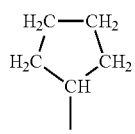 (R-13)
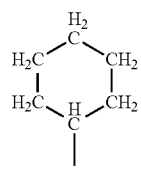 (R-14)
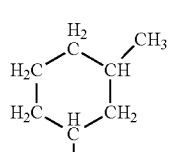 (R-15)
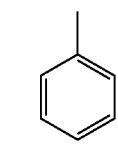 (R-16)
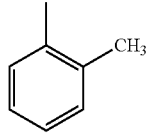 (R-17)
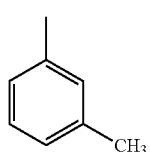 (R-18)
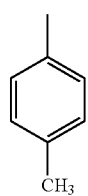 (R-19)
-continued
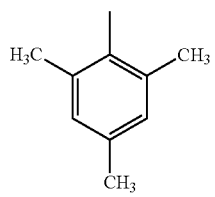 (R-20)
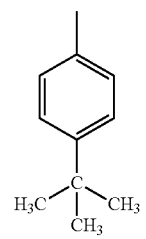 (R-21)
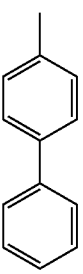 (R-22)
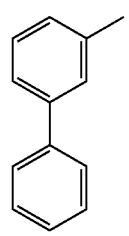 (R-23)
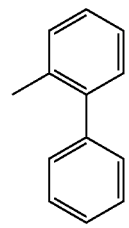 (R-24)
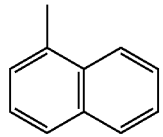 (R-25)
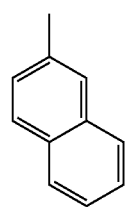 (R-26)

-continued (R-27)
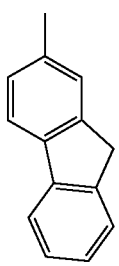

(R-28)
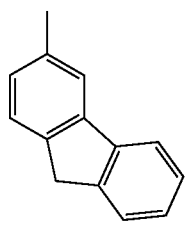

(R-29)
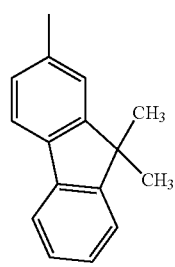

(R-30)
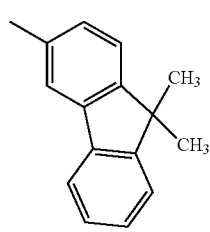

(R-31)
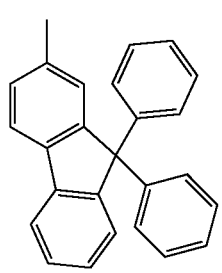

(R-32)
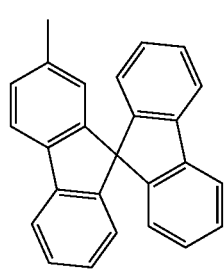

As a substituent that can be included in General Formulae (101) to (114), General Formulae (Ht-1) to (Ht-13), Ar, and $R^1$, the alkyl group or the aryl group represented by the above Structural Formulae (R-1) to (R-32) can be used, for example. Note that the group that can be used as the alkyl group or the aryl group is not limited to these.

As described above, the compound 131 preferably has a function of converting triplet excitation energy into light. Examples of organic compounds having this function include a phosphorescent material and a thermally activated delayed fluorescent material.

Examples of the phosphorescent compound include an iridium-, rhodium-, or platinum-based organometallic complex and metal complex, and specifically include a platinum complex and an organoiridium complex having a porphyrin ligand. In particular, an organoiridium complex such as an iridium-based ortho-metalated complex is preferable, for example. Examples of a ligand to be ortho-metalated include a 4H-triazole ligand, a 1H-triazole ligand, an imidazole ligand, a pyridine ligand, a pyrimidine ligand, a pyrazine ligand, and an isoquinoline ligand. Here, the compound 131 (phosphorescent compound) has an absorption band corresponding to triplet metal to ligand charge transfer (MLCT) transition.

Examples of substances that have an emission peak in the blue or green wavelength range include organometallic iridium complexes having a 4H-triazole skeleton, such as tris {2-[5-(2-methylphenyl)-4-(2,6-dimethylphenyl)-4H-1,2,4-triazol-3-yl-$\kappa N^2$]phenyl-$\kappa C$}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), tris[4-(3-biphenyl)-5-isopropyl-3-phenyl-4H-1,2,4-triazolato]iridium(III) (abbreviation: Ir(iPrptz-3b)$_3$), and tris[3-(5-biphenyl)-5-isopropyl-4-phenyl-4H-1,2,4-triazolato]iridium(III) (abbreviation: Ir(iPr5btz)$_3$); organometallic iridium complexes having a 1H-triazole skeleton, such as tris[3-methyl-1-(2-methylphenyl)-5-phenyl-1H-1,2,4-triazolato]iridium(III) (abbreviation: Ir(Mptz1-mp)$_3$) and tris(1-methyl-5-phenyl-3-propyl-1H-1,2,4-triazolato)iridium(III) (abbreviation: Ir(Prptz1-Me)$_3$); organometallic iridium complexes having an imidazole skeleton, such as fac-tris[1-(2,6-diisopropylphenyl)-2-phenyl-1H-imidazole]iridium(III) (abbreviation: Ir(iPrpmi)$_3$) and tris[3-(2,6-dimethylphenyl)-7-methylimidazo[1,2-f]phenanthridinato]iridium(III) (abbreviation: Ir(dmpimpt-Me)$_3$); and organometallic iridium complexes in which a phenylpyridine derivative having an electron-withdrawing group is a ligand, such as bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis {2-[3',5'-bis(trifluoromethyl)phenyl]pyridinato-N,$C^{2'}$}iridium(III) picolinate (abbreviation: Ir(CF$_3$ppy)$_2$(pic)), and bis[2-(4',6'-difluorophenyl)pyridinato-N,$C^2$]iridium(III) acetyl acetonate (abbreviation: FIr(acac)). Among the materials given above, the organometallic iridium complexes having a nitrogen-containing five-membered heterocyclic skeleton, such as a 4H-triazole skeleton, a 1H-triazole skeleton, or an imidazole skeleton, have high triplet excitation energy, high reliability, and high emission efficiency and are thus especially preferable.

Examples of substances that have an emission peak in the green or yellow wavelength range include organometallic iridium complexes having a pyrimidine skeleton, such as tris(4-methyl-6-phenylpyrimidinato)iridium(III) (abbreviation: Ir(mppm)$_3$), tris(4-t-butyl-6-phenylpyrimidinato)iridium(III) (abbreviation: Ir(tBuppm)$_3$), (acetylacetonato)bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), (acetylacetonato)bis[4-(2-norbornyl)-6-phenylpyrimidinato]iridium(III) (abbreviation: Ir(nbppm)$_2$ (acac)), (acetylacetonato)bis[5-methyl-6-(2-methylphenyl)-4-phenylpyrimidinato]iridium(III) (abbreviation: Ir(mpmppm)$_2$(acac)), (acetylacetonato)bis{4,6-dimethyl-2-[6-(2,6-dimethylphenyl)-4-pyrimidinyl-κN$^3$]phenyl-κC}irid ium(III) (abbreviation: Ir(dmppm-dmp)$_2$(acac)), and (acetylacetonato)bis(4,6-diphenylpyrimidinato)iridium (III) (abbreviation: Ir(dppm)$_2$(acac)); organometallic iridium complexes having a pyrazine skeleton, such as (acetylacetonato)bis(3,5-dimethyl-2-phenylpyrazinato) iridium(III) (abbreviation: Ir(mppr-Me)$_2$(acac)) and (acetylacetonato)bis(5-isopropyl-3-methyl-2-phenylpyrazinato) iridium(III) (abbreviation: Ir(mppr-iPr)$_2$(acac)); organometallic iridium complexes having a pyridine skeleton, such as tris(2-phenylpyridinato-N,C$^{2'}$)iridium(III) (abbreviation: Ir(ppy)$_3$), bis(2-phenylpyridinato-N,C$^{2'}$)iridium (III) acetylacetonate (abbreviation: Ir(ppy)$_2$(acac)), bis (benzo[h]quinolinato)iridium(III) acetylacetonate (abbreviation: Ir(bzq)$_2$(acac)), tris(benzo[h]quinolinato) iridium(III) (abbreviation: Ir(bzq)$_3$), tris(2-phenylquinolinato-N,C$^{2'}$)iridium(III) (abbreviation: Ir(pq)$_3$), and bis(2-phenylquinolinato-N,C$^{2'}$)iridium(III) acetylacetonate (abbreviation: Ir(pq)$_2$(acac)); organometallic iridium complexes such as bis(2,4-diphenyl-1,3-oxazolato-N,C$^{2'}$)iridium (III) acetylacetonate (abbreviation: Ir(dpo)$_2$(acac)), bis{2-[4'-(perfluorophenyl)phenyl]pyridinato-N,C$^{2'}$}iridium(III) acetylacetonate (abbreviation: Ir(p-PF-ph)$_2$(acac)), and bis (2-phenylbenzothiazolato-N,C$^{2'}$)iridium(III) acetylacetonate (abbreviation: Ir(bt)$_2$(acac)); and rare earth metal complexes such as tris(acetylacetonato)(monophenanthroline) terbium(III) (abbreviation: Tb(acac)$_3$(Phen)). Among the materials given above, the organometallic iridium complexes having a pyrimidine skeleton have distinctively high reliability and emission efficiency and are thus particularly preferable.

Examples of substances that have an emission peak in the yellow or red wavelength range include organometallic iridium complexes having a pyrimidine skeleton, such as (diisobutyrylmethanato)bis[4,6-bis(3-methylphenyl)pyrimidinato]iridium(III) (abbreviation: Ir(5mdppm)$_2$(dibm)), bis [4,6-bis(3-methylphenyl)pyrimidinato](dipivaloylmethanato)iridium(III) (abbreviation: Ir(5mdppm)$_2$(dpm)), and bis[4,6-di(naphthalen-1-yl)pyrimidinato](dipivaloylmethanato)iridium(III) (abbreviation: Ir(dInpm)$_2$(dpm)); organometallic iridium complexes having a pyrazine skeleton, such as (acetylacetonato)bis(2,3,5-triphenylpyrazinato)iridium (III) (abbreviation: Ir(tppr)$_2$(acac)), bis(2,3,5-triphenylpyrazinato)(dipivaloylmethanato)iridium(III) (abbreviation: Ir(tppr)$_2$(dpm)), and (acetylacetonato)bis[2,3-bis(4-fluorophenyl)quinoxalinato]iridium(III) (abbreviation: Ir(Fdpq)$_2$(acac)); organometallic iridium complexes having a pyridine skeleton, such as tris(1-phenylisoquinolinato-N, C$^{2'}$)iridium(III) (abbreviation: Ir(piq)$_3$) and bis(1-phenylisoquinolinato-N,C$^{2'}$)iridium(III) acetylacetonate (abbreviation: Ir(piq)$_2$(acac)); platinum complexes such as 2,3,7,8, 12,13,17,18-octaethyl-21H,23H-porphyrin platinum(II) (abbreviation: PtOEP); and rare earth metal complexes such as tris(1,3-diphenyl-1,3-propanedionato)(monophenanthroline)europium(III) (abbreviation: Eu(DBM)$_3$(Phen)) and tris [1-(2-thenoyl)-3,3,3-trifluoroacetonato](monophenanthroline)europium(III) (abbreviation: Eu(TTA)$_3$(Phen)). Among the materials given above, the organometallic iridium complexes having a pyrimidine skeleton have distinctively high reliability and emission efficiency and are thus particularly preferable. Furthermore, the organometallic iridium complexes having a pyrazine skeleton can provide red light emission with favorable chromaticity.

Another material usable for the compound 131 is a thermally activated delayed fluorescent material as mentioned above. Specifically, any of the following materials can be employed.

First, a fullerene, a derivative thereof, an acridine derivative such as proflavine, eosin, and the like can be given. Other examples include a metal-containing porphyrin, such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$(Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$(OEP)).

As a thermally activated delayed fluorescence material composed of one kind of material, a heterocyclic compound including a π-electron rich heteroaromatic ring and a π-electron deficient heteroaromatic ring can also be used. Specific examples include 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), and 10-phenyl-10H,10'H-spiro[acridin-9,9'-anthracen]-10'-one (abbreviation: ACRSA). The heterocyclic compound is preferable because of its high electron-transport and hole-transport properties due to the π-electron rich heteroaromatic ring and the π-electron deficient heteroaromatic ring contained therein. Among skeletons having the π-electron deficient heteroaromatic ring, a diazine skeleton (a pyrimidine skeleton, a pyrazine skeleton, or a pyridazine skeleton) and a triazine skeleton are particularly preferable because of their high stability and high reliability. Among skeletons having the π-electron rich heteroaromatic ring, an acridine skeleton, a phenoxazine skeleton, a thiophene skeleton, a furan skeleton, and a pyrrole skeleton have high stability and high reliability; therefore, one or more of these skeletons are preferably included. As the pyrrole skeleton, an indole skeleton, a carbazole skeleton, or a 3-(9-phenyl-9H-carbazol-3-yl)-9H-carbazole skeleton is particularly preferred. Note that a substance in which the π-electron rich heteroaromatic ring is directly bonded to the π-electron deficient heteroaromatic ring is particularly preferable because the donor property of the π-electron rich heteroaromatic ring and the acceptor property of the π-electron deficient heteroaromatic ring are both high and the difference between the energy level in the singlet excited state and the energy level in the triplet excited state becomes small.

A fluorescent compound is preferably used as the compound 133 in the light-emitting layer 130. The fluorescent compound is preferably, but not particularly limited to, an anthracene derivative, a tetracene derivative, a chrysene derivative, a phenanthrene derivative, a pyrene derivative, a perylene derivative, a stilbene derivative, an acridone derivative, a coumarin derivative, a phenoxazine derivative, a phenothiazine derivative, or the like.

Specific examples include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N-bis[3-(9-phenyl-9H-fluoren-9-yl)phenyl]pyrene-1,6-diamine (abbreviation: 1,6mMemFLPAPrn), N,N'-bis[4-(9-phenyl-9H-fluoren-9-yl)phenyl]-N,N-bis(4-tert-butylphenyl)pyrene-1,6-diamine (abbreviation: 1,6tBu-FLPAPrn), N,N'-bis[4-(9-phenyl-9H-fluoren-9-yl)phenyl]-N,N-diphenyl-3,8-dicyclohexylpyrene-1,6-diamin e (abbreviation: ch-1,6FLPAPrn), N,N'-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis[N,N',N'-triphenyl-1,4-phenylenedia mine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N''',N''''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 6, coumarin 545T, N,N-diphenylquinacridone (abbreviation: DPQd), rubrene, 2,8-di-tert-butyl-5,11-bis(4-tert-butylphenyl)-6,12-diphenyltetracene (abbreviation: TBRb), Nile red, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylide ne}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethe nyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethe nyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl) ethenyl]-4H-pyran-4-ylidene}propanedinitrile (abbreviation: BisDCJTM), and 5,10,15,20-tetraphenylbisbenzo[5,6]indeno[1,2,3-cd:1',2',3'-lm]perylene.

In the case where the compound 131 and the compound 132 form an exciplex, the compound 131, the compound 132, and the compound 133 are preferably selected such that the emission peak of the formed exciplex overlaps an absorption band on the longest wavelength side (low energy side) of the compound 133 serving as a light-emitting material. This makes it possible to provide a light-emitting element with drastically improved emission efficiency.

Note that the light-emitting layer 130 can have a structure in which two or more layers are stacked. For example, in the case where the light-emitting layer 130 is formed by stacking a first light-emitting layer and a second light-emitting layer in this order from the hole-transport layer side, the first light-emitting layer is formed using a substance having a hole-transport property as the host material and the second light-emitting layer is formed using a substance having an electron-transport property as the host material.

As shown in FIGS. 4A and 4B, the light-emitting layer 130 may contain a material (the compound 134) other than the compounds 131, 132, and 133. In that case, it is preferred that the compound 132 and the compound 134 form an exciplex. Here, one of the compounds 132 and 134 preferably has the highest HOMO level among the materials of the light-emitting layer 130, and the other of the compounds 132 and 134 preferably has the lowest LUMO level among the materials of the light-emitting layer 130. That is, the HOMO level of one of the compounds 132 and 134 is preferably higher than the HOMO levels of the compound 131 and the other of the compounds 132 and 134, and the LUMO level of the other of the compounds 132 and 134 is preferably lower than the LUMO levels of the compound 131 and the one of the compounds 132 and 134. Such a structure can inhibit the reaction of the compound 131 and the compound 132 to form an exciplex.

As the compound 134, any of the following hole-transport materials and electron-transport materials can be used, for example. As has been described, the compound 132 has a low LUMO level and a high electron-transport property because of having a benzofuropyrimidine skeleton or a benzothienopyrimidine skeleton. Accordingly, the compound 134 is preferably an organic compound having a favorable hole-transport property (a hole-transport material) whose HOMO level is higher than that of the compound 132.

As the hole-transport material, a material having a property of transporting more holes than electrons can be used, and a material having a hole mobility of $1\times10^{-6}$ cm$^2$/Vs or higher is preferable. Specifically, an aromatic amine, a carbazole derivative, or the like can be used.

Furthermore, the hole-transport material may be a high molecular compound.

Examples of aromatic amine compounds usable as the material having a high hole-transport property include N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), and 1,3,5-tris[N-(4-diphenylaminophenyl)-N-phenylamino]benzene (abbreviation: DPA3B).

Specific examples of usable carbazole derivatives include 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 3-[N-(9- phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Other examples of usable carbazole derivatives are 4,4'-di(N-carbazolyl)biphenyl (abbreviation: CBP), 1,3,5-tris[4-(N-carbazolyl)phenyl]benzene (abbreviation: TCPB), and 1,4-bis[4-(N-carbazolyl)phenyl]-2,3,5,6-tetraphenylbenzene.

Other examples of the material having a high hole-transport property are aromatic amine compounds such as 4,4'-bis[N-(1-naphthyl)-N-phenylamino]biphenyl (abbreviation: NPB or α-NPD), N,N-bis(3-methylphenyl)-N,N-diphenyl-[1,1'-biphenyl]-4,4'-diamine (abbreviation: TPD), 4,4',4''-tris(carbazol-9-yl)triphenylamine (abbreviation: TCTA), 4,4',4''-tris[N-(1-naphthyl)-N-phenylamino]triphenylamine (abbreviation: 1'-TNATA), 4,4',4''-tris(N,N-diphenylamino)triphenylamine (abbreviation: TDATA), 4,4',4''-tris[N-(3-methylphenyl)-N-phenylamino]triphenylamine (abbreviation: m-MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N-bis(9-phenylcarbazol-3-yl)-N,N-diphenylbenzene-1,3-diamine (abbreviation: PCA2B), N,N',N''-triphenyl-N,N',N''-tris(9-phenylcarbazol-3-yl)benzene-1,3,5-triamine (abbreviation: PCA3B), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 2-[N-(9-phenylcarbazol-3-yl)-N-phenylamino]spiro-9,9'-bifluorene (abbreviation: PCASF), 2,7-bis[N-(4-diphenylaminophenyl)-N-phenylamino]spiro-9,9'-bifluorene (abbreviation: DPA2SF), N-[4-(9H-carbazol-9-yl)phenyl]-N-(4-phenyl)phenylaniline (abbreviation: YGA1BP), and N,N-bis[4-(carbazol-9-yl)phenyl]-N,N'-diphenyl-9,9-dimethylfluorene-2,7-diamine (abbreviation: YGA2F). Other examples include amine compounds, carbazole compounds, thiophene compounds, furan compounds, fluorene compounds, triphenylene compounds, and phenanthrene compounds such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 3,3'-bis(9-phenyl-9H-carbazole) (abbreviation: PCCP), 1,3-bis(N-carbazolyl)benzene (abbreviation: mCP), 3,6-bis(3,5-diphenylphenyl)-9-phenylcarbazole (abbreviation: CzTP), 4-{3-[3-(9-phenyl-9H-fluoren-9-yl)phenyl]phenyl}dibenzofuran (abbreviation: mmDBFFLBi-II), 4,4',4''-(benzene-1,3,5-triyl)tri(dibenzofuran) (abbreviation: DBF3P-II), 1,3,5-tri(dibenzothiophen-4-yl)benzene (abbreviation: DBT3P-II), 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylen-2-yl)phenyl]dibenzothiophene (abbreviation: mDBTPTp-II). The substances described here are mainly substances having a hole mobility of $1\times10^{-6}$ cm$^2$/Vs or higher. Note that other than these substances, any substance that has a property of transporting more holes than electrons may be used.

<<Pair of Electrodes>>

The electrode 101 and the electrode 102 have functions of injecting holes and electrons into the light-emitting layer 130. The electrodes 101 and 102 can be formed using a metal, an alloy, or a conductive compound, a mixture or a stack thereof, or the like. A typical example of the metal is aluminum (Al); in addition, a transition metal such as silver (Ag), tungsten, chromium, molybdenum, copper, or titanium, an alkali metal such as lithium (Li) or cesium, or a Group 2 metal such as calcium or magnesium (Mg) can be used. As the transition metal, a rare earth metal such as ytterbium (Yb) may be used. The alloy can be an alloy containing any of the above metals and is MgAg or AlLi, for example. Examples of the conductive compound include metal oxides such as indium tin oxide (hereinafter referred to as ITO), indium tin oxide containing silicon or silicon oxide (ITSO), indium zinc oxide, and indium oxide containing tungsten and zinc. The conductive compound may be an inorganic carbon-based material such as graphene. As described above, the electrode 101 and/or the electrode 102 may be formed by stacking at least two of these materials.

Light emitted from the light-emitting layer 130 is extracted through the electrode 101 and/or the electrode 102; therefore, at least one of the electrodes 101 and 102 transmits visible light. An example of a conductive material transmitting light is a conductive material having a visible light transmittance of 40% to 100%, preferably 60% to 100% and a resistivity of $1\times10^{-2}$ Ω·cm or lower. The electrode through which light is extracted may be formed using a conductive material having functions of transmitting light and reflecting light. An example of such a conductive material is a conductive material having a visible light reflectivity of 20% to 80%, preferably 40% to 70% and a resistivity of $1\times10^{-2}$ Ω·cm or lower. When the electrode through which light is extracted is formed using a material with low light transmittance, such as a metal or an alloy, the electrode 101 and/or the electrode 102 is formed to a thickness that is thin enough to transmit visible light (e.g., a thickness of 1 nm to 10 nm).

Note that in this specification and the like, as the electrode transmitting light, a material that transmits visible light and has conductivity is used. For example, an oxide semiconductor layer or an organic conductive layer containing an organic substance can be used in addition to a layer of an oxide conductor typified by ITO mentioned above. Examples of the organic conductive layer containing an organic substance include a layer containing a composite material in which an organic compound and an electron donor (donor) are mixed, and a layer containing a composite material in which an organic compound and an electron acceptor (acceptor) are mixed. The resistivity of the light-transmitting conductive layer is preferably lower than or equal to $1\times10^5$ Ω·cm, further preferably lower than or equal to $1\times10^4$ Ω·cm.

As the method for forming the electrode 101 and the electrode 102, a sputtering method, an evaporation method, a printing method, a coating method, a molecular beam epitaxy (MBE) method, a chemical vapor deposition (CVD) method, a pulsed laser deposition method, an atomic layer deposition (ALD) method, or the like can be used as appropriate.

<<Hole-Injection Layer>>

The hole-injection layer 111 has a function of promoting hole injection by lowering a barrier to hole injection from one of the pair of electrodes (the electrode 101 or the electrode 102) and is formed using a transition metal oxide, a phthalocyanine derivative, or an aromatic amine, for example. Examples of the transition metal oxide include molybdenum oxide, vanadium oxide, ruthenium oxide, tungsten oxide, and manganese oxide. Examples of the phthalocyanine derivative include phthalocyanine and metal phthalocyanine. Examples of the aromatic amine include a benzidine derivative and a phenylenediamine derivative. It is also possible to use a high molecular compound such as polythiophene or polyaniline; a typical example is poly(ethylenedioxythiophene)/poly(styrenesulfonic acid), which is self-doped polythiophene.

As the hole-injection layer 111, a layer containing a composite material of a hole-transport material and a material having a property of accepting electrons from the hole-transport material can also be used. Alternatively, a stack of a layer containing a material having an electron-accepting property and a layer containing a hole-transport material may be used. In a steady state or in the presence of an electric field, electric charge can be transferred between these materials. Examples of the material having an electron-accepting property include organic acceptors such as a quinodimethane derivative, a chloranil derivative, and a hexaazatriphenylene derivative. Specific examples are compounds having an electron-withdrawing group (a halogen group or a cyano group), such as 7,7,8,8-tetracyano-2,3,5,6-tetrafluoroquinodimethane (abbreviation: $F_4$-TCNQ), chloranil, and 2,3,6,7,10,11-hexacyano-1,4,5,8,9,12-hexaazatriphenylene (abbreviation: HAT-CN). Alternatively, a transition metal oxide such as an oxide of a metal from Group 4 to Group 8 can be used. Specific examples include vanadium oxide, niobium oxide, tantalum oxide, chromium oxide, molybdenum oxide, tungsten oxide, manganese oxide, and rhenium oxide. In particular, molybdenum oxide is preferable because it is stable in the air, has a low hygroscopic property, and is easily handled.

As the hole-transport material, a material having a property of transporting more holes than electrons can be used, and a material having a hole mobility of $1 \times 10^{-6}$ cm$^2$/Vs or higher is preferable. Specifically, it is possible to use an aromatic amine or a carbazole derivative, which are exemplified as the hole-transport material that can be used in the light-emitting layer 130, as well as an aromatic hydrocarbon or a stilbene derivative. Alternatively, the hole-transport material may be a high molecular compound.

Examples of the aromatic hydrocarbon include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Other examples are pentacene and coronene. The aromatic hydrocarbon having a hole mobility of $1 \times 10^{-6}$ cm$^2$/Vs or higher and having 14 to 42 carbon atoms is particularly preferable.

The aromatic hydrocarbon may have a vinyl skeleton. Examples of the aromatic hydrocarbon having a vinyl group include 4,4'-bis(2,2-diphenylvinyl)biphenyl (abbreviation: DPVBi) and 9,10-bis[4-(2,2-diphenylvinyl)phenyl]anthracene (abbreviation: DPVPA).

It is also possible to use a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N-phenylamino}phenyl)methacrylamide](abbreviation: PTPDMA), or poly[N,N-bis(4-butylphenyl)-N,N-bis(phenyl)benzidine](abbreviation: poly-TPD).

<<Hole-Transport Layer>>

The hole-transport layer 112 is a layer containing a hole-transport material and can be formed using any of the materials given as examples of the material of the hole-injection layer 111. In order that the hole-transport layer 112 has a function of transporting holes injected into the hole-injection layer 111 to the light-emitting layer 130, the HOMO level of the hole-transport layer 112 is preferably equal or close to that of the hole-injection layer 111.

As the hole-transport material, any of the materials given as examples of the material of the hole-injection layer 111 can be used. As the hole-transport material, a substance having a hole mobility of $1 \times 10^{-6}$ cm$^2$/Vs or higher is preferably used. Note that other than these substances, any substance that has a property of transporting more holes than electrons may be used. The layer including a substance having a high hole-transport property is not limited to a single layer and may be a stack of two or more layers each containing any of the aforementioned substances.

<<Electron-Transport Layer>>

The electron-transport layer 118 has a function of transporting, to the light-emitting layer 130, electrons injected from the other of the pair of electrodes (the electrode 101 or the electrode 102) through the electron-injection layer 119. As an electron-transport material, a material having a property of transporting more electrons than holes can be used, and a material having an electron mobility of $1 \times 10^{-6}$ cm$^2$/Vs or higher is preferable. As a compound that easily accepts electrons (a material having an electron-transport property), a π-electron deficient heteroaromatic compound such as a nitrogen-containing heteroaromatic compound, a metal complex, or the like can be used. It is particularly preferable to use an organic compound having a benzofuropyrimidine skeleton or a benzothienopyrimidine skeleton. Other specific examples are metal complexes having a quinoline ligand, a benzoquinoline ligand, an oxazole ligand, or a thiazole ligand. Other examples include an oxadiazole derivative, a triazole derivative, a phenanthroline derivative, a pyridine derivative, a bipyridine derivative, and a pyrimidine derivative. Note that other than these substances, any substance that has a property of transporting more electrons than holes may be used for the electron-transport layer. The electron-transport layer 118 is not limited to a single layer and may be a stack of two or more layers each containing any of the aforementioned substances.

Specific examples of the electron-transport material include metal complexes having a quinoline skeleton or a benzoquinoline skeleton, such as tris(8-quinolinolato)aluminum(III) (abbreviation: Alq), tris(4-methyl-8-quinolinolato) aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), and bis(8-quinolinolato)zinc(II) (abbreviation: Znq). Other examples are metal complexes having an oxazole-based or thiazole-based ligand, such as bis[2-(2-benzoxazolyl)phenolato]zinc(II) (abbreviation: ZnPBO) and bis[2-(2-benzothiazolyl)phenolato]zinc(II) (abbreviation: ZnBTZ). Other than such metal complexes, any of the following can be used: heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), bathophenanthroline (abbreviation: BPhen), bathocuproine (abbreviation: BCP), and 2,9-bis(naphthalen-2-yl)-4,7-diphenyl-1,10-phenanthroline (abbreviation: NBPhen); heterocyclic compounds having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f;h]quinoxaline (abbreviation: 6mDBTPDBq-II), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), and 4,6-bis[3-(9H-carbazol-9-yl)phenyl]pyrimidine (abbreviation: 4,6mCzP2Pm); heterocyclic compounds having a triazine skeleton, such as 2-{4-[3-(N-phenyl-9H-carbazol-3-yl)-9H-carbazol-9-yl]phenyl}-4,6-diphenyl-1,3,5-triazine (abbreviation: PCCzPTzn); heterocyclic compounds having a pyridine skeleton, such as 3,5-bis[3-(9H-carbazol-9-yl)phenyl]pyridine (abbreviation: 35DCzPPy) and 1,3,5-tri[3-(3-pyridyl)-phenyl]benzene (abbreviation: TmPyPB); and heteroaromatic compounds such as 4,4'-bis(5-methylbenzoxazol-2-yl)stilbene (abbreviation: BzOs). Alternatively, it is possible to use a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy). The substances described here are mainly substances having an electron mobility of $1 \times 10^{-6}$ cm$^2$/Vs or higher. Note that any other substance may be used as long as it has a property of transporting more electrons than holes. Furthermore, it is preferable to use an organic compound having a benzofuropyrimidine skeleton or a benzothienopyrimidine skeleton.

A layer that controls transfer of electron carriers may be provided between the electron-transport layer 118 and the light-emitting layer 130. The layer controlling electron carrier transfer is formed by addition of a small amount of a substance having a high electron-trapping property to the aforementioned material having a high electron-transport property, and is capable of adjusting carrier balance by inhibiting electron carrier transfer. Such a structure is highly effective in preventing a problem that occurs when electrons pass through the light-emitting layer (e.g., reduction of element lifetime).

<<Electron-Injection Layer>>

The electron-injection layer 119 has a function of promoting electron injection by lowering a barrier to electron injection from the electrode 102 and can be formed using a Group 1 metal or a Group 2 metal, or an oxide, a halide, or a carbonate of any of these metals, for example. Alternatively, it is possible to use a composite material containing the aforementioned electron-transport material and a material having a property of donating electrons to the electron-transport material. Examples of the material having an electron-donating property include a Group 1 metal, a Group 2 metal, and an oxide of any of these metals. Specifically, it is possible to use an alkali metal, an alkaline earth metal, or a compound thereof, such as lithium fluoride (LiF), sodium fluoride (NaF), cesium fluoride (CsF), calcium fluoride (CaF$_2$), or lithium oxide (LiO$_x$). A rare earth metal compound like erbium fluoride (ErF$_3$) can also be used. An electride may also be used for the electron-injection layer 119. An example of the electride includes a substance in which electrons are added at high concentration to calcium oxide-aluminum oxide. The electron-injection layer 119 may be formed using any of the substances usable for the electron-transport layer 118.

A composite material in which an organic compound and an electron donor (donor) are mixed may also be used for the electron-injection layer 119. Such a composite material is excellent in an electron-injection property and an electron-transport property because electrons are generated in the organic compound by the electron donor. In this case, the organic compound is preferably a material that is excellent in transporting the generated electrons. Specifically, any of the above-listed substances for forming the electron-transport layer 118 (e.g., the metal complexes and heteroaromatic compounds) can be used, for example. The electron donor can be any substance having a property of donating electrons to the organic compound. Specifically, it is preferable to employ an alkali metal, an alkaline earth metal, or a rare earth metal, such as lithium, cesium, magnesium, calcium, erbium, or ytterbium. It is also preferable to employ an alkali metal oxide or an alkaline earth metal oxide, such as lithium oxide, calcium oxide, or barium oxide. Alternatively, a Lewis base such as magnesium oxide can be used. Further alternatively, an organic compound such as tetrathiafulvalene (abbreviation: TTF) can be used.

Note that the light-emitting layer, the hole-injection layer, the hole-transport layer, the electron-transport layer, and the electron-injection layer described above can each be formed by an evaporation method (including a vacuum evaporation method), an inkjet method, a coating method, a nozzle-printing method, a gravure printing method, or the like. Besides the above-mentioned materials, an inorganic compound such as a quantum dot or a high molecular compound (e.g., an oligomer, a dendrimer, or a polymer) may be used in the light-emitting layer, the hole-injection layer, the hole-transport layer, the electron-transport layer, and the electron-injection layer.

The quantum dot may be a colloidal quantum dot, an alloyed quantum dot, a core-shell quantum dot, or a core quantum dot, for example. The quantum dot containing elements belonging to Groups 2 and 16, elements belonging to Groups 13 and 15, elements belonging to Groups 13 and 17, elements belonging to Groups 11 and 17, or elements belonging to Groups 14 and 15 may be used. Alternatively, the quantum dot containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

Examples of a liquid medium used for the wet process include organic solvents of ketones such as methyl ethyl ketone and cyclohexanone; fatty acid esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decalin, and dodecane; dimethylformamide (DMF); and dimethyl sulfoxide (DMSO).

Examples of high molecular compounds usable for the light-emitting layer include a polyphenylenevinylene (PPV) derivative such as poly[2-methoxy-5-(2-ethylhexyloxy)-1,4-phenylenevinylene] (abbreviation: MEH-PPV) and poly(2,5-dioctyl-1,4-phenylenevinylene); a polyfluorene derivative such as poly(9,9-di-n-octylfluorenyl-2,7-diyl) (abbreviation: PF8), poly[(9,9-di-n-octylfluorenyl-2,7-diyl)-alt-(benzo[2,1,3]thiadiazole-4,8-diyl)] (abbreviation: F8BT), poly[(9,9-di-n-octylfluorenyl-2,7-diyl)-alt-(2,2'-bithiophene-5,5'-diyl)] (abbreviation: F8T2), poly[(9,9-dioctyl-2,7-divinylenefluorenylene)-alt-(9,10-anthracene)], and poly[(9,9-dihexylfluorene-2,7-diyl)-alt-(2,5-dimethyl-1,4-phenylene)]; a polyalkylthiophene (PAT) derivative such as poly(3-hexylthiophen-2,5-diyl) (abbreviation: P3HT); and a polyphenylene derivative. Any of these high molecular compounds or a high molecular compound such as PVK, poly(2-vinylnaphthalene), or poly[bis(4-phenyl)(2,4,6-trimethylphenyl)amine] (abbreviation: PTAA) may be doped with a light-emitting compound and used for the light-emitting layer. As the light-emitting compound, any of the above compounds having a light-emitting property can be used.

In one embodiment of the present invention, the light-emitting layer 130 is formed using a combination of three organic compounds of an organic compound having a benzofuropyrimidine skeleton or a benzothienopyrimidine skeleton, an organic compound capable of converting triplet excitation energy into light, and an organic compound that emits fluorescence; alternatively, a high molecular compound that has the above skeleton or the above function can also be used. For example, the light-emitting layer 130 may be formed using a high molecular compound that has a benzofuropyrimidine skeleton or a benzothienopyrimidine skeleton, a substituent capable of converting triplet excitation energy into light, and a substituent that emits fluorescence. Alternatively, the light-emitting layer 130 may be formed with a mixture of a high molecular compound that has a benzofuropyrimidine skeleton or a benzothienopyrimidine skeleton and a substituent capable of converting triplet excitation energy into light and a low molecular compound that emits fluorescence. The use of such a high molecular compound enables an increase in material use efficiency and a reduction in manufacturing cost.

<<Substrate>>

The light-emitting element of one embodiment of the present invention is formed over a substrate of glass, plastic, or the like. As the way of stacking layers over the substrate, the layers may be sequentially stacked from the electrode 101 side or from the electrode 102 side.

For the substrate where the light-emitting element of one embodiment of the present invention can be formed, glass, quartz, or plastic can be used, for example. Alternatively, a flexible substrate may be used. The flexible substrate is a substrate that can be bent, such as a plastic substrate made of polycarbonate or polyarylate, for example. Alternatively, a film, an inorganic vapor deposition film, or the like can be used. Another material may be used as long as the substrate functions as a support in a manufacturing process of the light-emitting elements or has a function of protecting the light-emitting elements.

In this specification and the like, a light-emitting element can be formed using a variety of substrates, for example. There is no particular limitation on the type of a substrate. Examples of the substrate include a semiconductor substrate (e.g., a single crystal substrate and a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, cellulose nanofiber (CNF) and paper that include a fibrous material, and a base material film. For the glass substrate, for example, barium borosilicate glass, aluminoborosilicate glass, or soda lime glass can be used. Examples of materials for the flexible substrate, the attachment film, the base material film, and the like include plastics typified by polyethylene terephthalate (PET), polyethylene naphthalate (PEN), polyether sulfone (PES), and polytetrafluoroethylene (PTFE). Other examples include a resin such as acrylic, and polypropylene, polyester, polyvinyl fluoride, and polyvinyl chloride. Other examples are polyamide, polyimide, aramid, epoxy, an inorganic vapor deposition film, and paper.

Alternatively, a flexible substrate may be used as the substrate such that the light-emitting element is provided directly on the flexible substrate. A separation layer may be provided between the substrate and the light-emitting element. The separation layer can be used to separate part or the whole of the light-emitting element, which is formed over the separation layer, from the substrate and transfer the separated component onto another substrate. In such a case, the light-emitting element can be transferred to a substrate having low heat resistance or a flexible substrate as well. The separation layer can be, for example, a stack including inorganic films of a tungsten film and a silicon oxide film, or a resin film of polyimide or the like that is formed over the substrate.

In other words, after a light-emitting element is formed using a substrate, the light-emitting element may be transferred to another substrate. Examples of the substrate to which the light-emitting element is transferred are, in addition to the above substrates, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. When such a substrate is used, a light-emitting element with high durability, high heat resistance, reduced weight, or reduced thickness can be formed.

A field-effect transistor (FET), for example, may be formed over any of the above substrates, and the light-emitting element 150 may be formed over an electrode electrically connected to the FET. Accordingly, an active matrix display device in which the FET controls the driving of the light-emitting element can be manufactured.

The structure described above in this embodiment can be used in combination with any other embodiment as appropriate.

Embodiment 2

Figure 5:
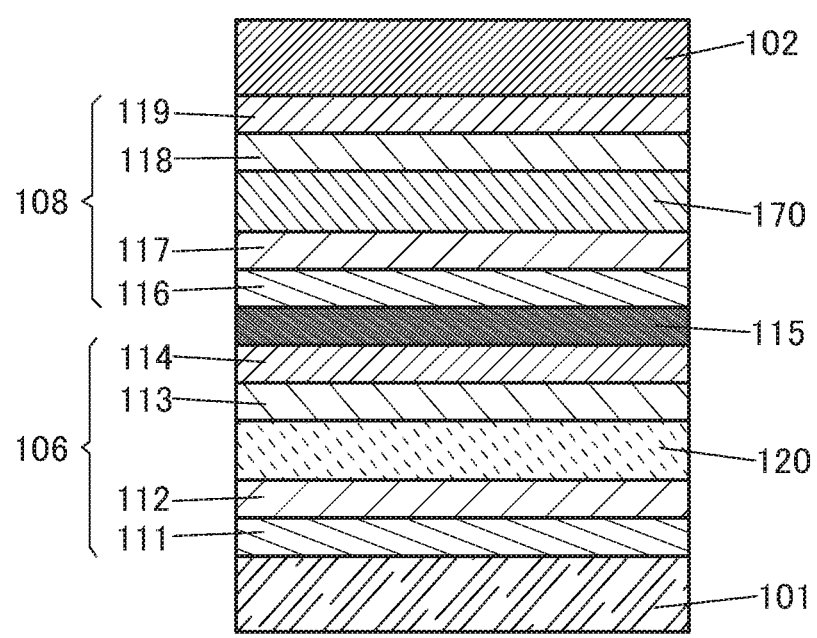
FIG. 5 is a schematic cross-sectional view of a light-emitting element of one embodiment of the present invention.

In this embodiment, a light-emitting element having a structure different from that described in Embodiment 1 will be described below with reference to FIG. 5. In FIG. 5, a portion having a function similar to that in FIG. 1A is represented by the same hatch pattern as in FIG. 1A and not especially denoted by a reference numeral in some cases. In addition, common reference numerals are used for portions having similar functions, and detailed description of the portions is omitted in some cases.

<Structure Example 2 of Light-Emitting Element>

FIG. 5 is a schematic cross-sectional view of a light-emitting element 250.

The light-emitting element 250 illustrated in FIG. 5 includes a plurality of light-emitting units (a light-emitting unit 106 and a light-emitting unit 108) between a pair of electrodes (the electrode 101 and the electrode 102). One of the light-emitting units preferably has a structure similar to that of the EL layer 100 illustrated in FIG. 1A. That is, it is preferred that the light-emitting element 150 illustrated in FIG. 1A include one light-emitting unit while the light-emitting element 250 include a plurality of light-emitting units. Note that the electrode 101 functions as an anode and the electrode 102 functions as a cathode in the following description of the light-emitting element 250; however, the functions may be interchanged in the light-emitting element 250.

In the light-emitting element 250 illustrated in FIG. 5, the light-emitting unit 106 and the light-emitting unit 108 are stacked, and a charge-generation layer 115 is provided between the light-emitting unit 106 and the light-emitting unit 108. Note that the light-emitting unit 106 and the light-emitting unit 108 may have the same structure or different structures. For example, a structure similar to that of the EL layer 100 is preferably used in the light-emitting unit 108.

The light-emitting element 250 includes a light-emitting layer 120 and a light-emitting layer 170. The light-emitting unit 106 includes the hole-injection layer 111, the hole-transport layer 112, an electron-transport layer 113, and an electron-injection layer 114 in addition to the light-emitting layer 120. The light-emitting unit 108 includes a hole-injection layer 116, a hole-transport layer 117, the electron-transport layer 118, and the electron-injection layer 119 in addition to the light-emitting layer 170.

In the light-emitting element 250, any layer in each of the light-emitting units 106 and 108 contains the organic compound of one embodiment of the present invention. Note that the layer containing the organic compound is preferably the electron-transport layer 113 or the electron-transport layer 118, and more preferably the light-emitting layer 120 or the light-emitting layer 170.

The charge-generation layer 115 may have either a structure in which an acceptor substance (electron acceptor) is added to a hole-transport material or a structure in which a donor substance (electron donor) is added to an electron-transport material. Alternatively, the charge-generation layer 115 may be a stack of both these structures.

When the charge-generation layer 115 contains a composite material of an organic compound and an acceptor substance, the composite material can be any composite material usable for the hole-injection layer 111 described in Embodiment 1. As the organic compound, a variety of compounds such as an aromatic amine compound, a carbazole compound, an aromatic hydrocarbon, and a high molecular compound (e.g., an oligomer, a dendrimer, and a polymer) can be used. The organic compound preferably has a hole mobility of $1\times10^{-6}$ cm$^2$/Vs or higher. Note that any other substance may be used as long as it has a property of transporting more holes than electrons. Since the composite material of an organic compound and an acceptor substance has excellent carrier-injection and carrier-transport properties, low-voltage driving or low-current driving can be achieved. Note that when a surface of a light-emitting unit on the anode side is in contact with the charge-generation layer 115, the charge-generation layer 115 can also serve as a hole-injection layer or a hole-transport layer of the light-emitting unit; thus, a hole-injection layer or a hole-transport layer is not necessarily included in the light-emitting unit. Alternatively, when a surface of the light-emitting unit on the cathode side is in contact with the charge-generation layer 115, the charge-generation layer 115 can also serve as an electron-injection layer or an electron-transport layer of the light-emitting unit; thus, an electron-injection layer or an electron-transport layer is not necessarily included in the light-emitting unit.

The charge-generation layer 115 may have a stacked structure of a layer containing the composite material of an organic compound and an acceptor substance and a layer containing another material. For example, the charge-generation layer 115 may be formed using a combination of a layer containing the composite material of an organic compound and an acceptor substance with a layer containing one compound selected from among electron-donating substances and a compound having a high electron-transport property. Alternatively, the charge-generation layer 115 may be formed using a combination of a layer containing the composite material of an organic compound and an acceptor substance with a layer including a transparent conductive film.

The charge-generation layer 115 placed between the light-emitting unit 106 and the light-emitting unit 108 is configured to inject electrons into one of the light-emitting units and inject holes into the other light-emitting unit when a voltage is applied to the electrode 101 and the electrode 102. For example, in FIG. 5, the charge-generation layer 115 injects electrons into the light-emitting unit 106 and holes into the light-emitting unit 108 when a voltage is applied such that the potential of the electrode 101 is higher than that of the electrode 102.

Note that in terms of light extraction efficiency, the charge-generation layer 115 preferably has a visible light transmittance (specifically, a visible light transmittance of 40% or higher). The charge-generation layer 115 functions even with lower conductivity than the pair of electrodes (the electrodes 101 and 102).

The charge-generation layer 115 formed using any of the above materials can suppress an increase in driving voltage caused by the stack of the light-emitting layers.

Although FIG. 5 illustrates the light-emitting element including two light-emitting units, a similar structure can be applied to a light-emitting element including three or more light-emitting units stacked. When a plurality of light-emitting units partitioned by the charge-generation layer are arranged between a pair of electrodes as in the light-emitting element 250, it is possible to provide a light-emitting element that is capable of emitting high-luminance light with the current density kept low and has a long lifetime. Moreover, a light-emitting element with low power consumption can be obtained.

Note that in each of the above structures, the emission colors of the guest materials used in the light-emitting unit 106 and the light-emitting unit 108 may be the same or different. When guest materials emitting light of the same color are used for the light-emitting unit 106 and the light-emitting unit 108, the light-emitting element 250 advantageously obtains high luminance at a small current value. Meanwhile, when guest materials emitting light of different colors are used for the light-emitting unit 106 and the light-emitting unit 108, the light-emitting element 250 advantageously exhibits multi-color light emission. In that case, when a plurality of light-emitting materials with different emission wavelengths are used in one or both of the light-emitting layers 120 and 170, the light-emitting element 250 emits light obtained by synthesizing lights with different emission peaks. That is, the emission spectrum of the light-emitting element 250 has at least two local maximum values.

The above structure is also suitable for obtaining white light emission. White light emission can be obtained when the light-emitting layer 120 and the light-emitting layer 170 emit light of complementary colors. It is particularly favorable to select the guest materials so that white light emission with high color rendering properties or light emission of at least red, green, and blue can be obtained.

One or both of the light-emitting layers 120 and 170 preferably have the structure of the light-emitting layer 130 shown in Embodiment 1, in which case a highly reliable light-emitting element having high emission efficiency can be obtained. The guest material contained in the light-emitting layer 130 is a fluorescent material; hence, when the structure of the light-emitting layer 130 shown in Embodiment 1 is employed in one or both of the light-emitting layers 120 and 170, a light-emitting element with a sharp emission spectrum and high color purity can be obtained.

In the case of a light-emitting element in which three or more light-emitting units are stacked, colors of light emitted from guest materials in the light-emitting units may be the same or different from each other. When the light-emitting element includes a plurality of light-emitting units that emit light of the same color, these light-emitting units can exhibit light of the color with higher luminance at a smaller current value as compared with light of the other colors. Such a structure can be suitably used to adjust emission colors. The structure is particularly suitable when guest materials that emit light of different colors with different emission efficiencies are used. For example, when the light-emitting element includes three light-emitting units, the intensity of fluorescence and phosphorescence can be adjusted with two light-emitting units that contain a fluorescent material for the same color and one light-emitting unit that contains a phosphorescent material and emits light of a color different from the emission color of the fluorescent material. Thus, the intensity of emitted light of each color can be adjusted by changing the number of light-emitting units.

When a light-emitting element includes two light-emitting units for fluorescence and one light-emitting unit for phosphorescence in the above manner, preferable combinations of the light-emitting units are as follows: a combination of two light-emitting units containing a blue fluorescent material and one light-emitting unit containing a yellow phosphorescent material; a combination of two light-emitting units containing a blue fluorescent material and one light-emitting unit containing a red phosphorescent material and a green phosphorescent material; and a combination of two light-emitting units containing a blue fluorescent material and one light-emitting unit containing a red phosphorescent material, a yellow phosphorescent material, and a green phosphorescent material. Such combinations are preferable because they enable efficient white light emission.

At least one of the light-emitting layers 120 and 170 may be divided into layers and each of the divided layers may contain different light-emitting materials. That is, at least one of the light-emitting layers 120 and 170 may consist of two or more layers. For example, when the light-emitting layer is formed by stacking a first light-emitting layer and a second light-emitting layer in this order from the hole-transport layer side, the first light-emitting layer is formed using a material having a hole-transport property as the host material and the second light-emitting layer is formed using a material having an electron-transport property as the host material. In this structure, a light-emitting material contained in the first light-emitting layer may be the same as or different from a light-emitting material contained in the second light-emitting layer, and the materials may have functions of emitting light of the same color or light of different colors. White light emission with high color rendering properties that is formed of three primary colors or four or more colors can be obtained by using a plurality of light-emitting materials with functions of emitting light of different colors.

Note that this embodiment can be combined with any of the other embodiments as appropriate.

Embodiment 3

In this embodiment, a light-emitting device including the light-emitting element described in Embodiment 1 and Embodiment 2 will be described with reference to FIGS. 6A and 6B.

FIG. 6A is a top view of the light-emitting device. FIG. 6B is a cross-sectional view along the lines A-B and C-D in FIG. 6A. The light-emitting device includes a driver circuit portion (source driver circuit) 601, a pixel portion 602, and a driver circuit portion (gate driver circuit) 603 that are indicated by dotted lines and control light emission of light-emitting elements. A reference numeral 604 denotes a sealing substrate, a reference numeral 625 denotes a desiccant, and a reference numeral 605 denotes a sealant. A portion surrounded by the sealant 605 is a space 607.

Note that a lead wiring 608 is a wiring for transmitting signals to be input to the source driver circuit 601 and the gate driver circuit 603 and for receiving a video signal, a clock signal, a start signal, a reset signal, and the like from a flexible printed circuit (FPC) 609 serving as an external input terminal. Although only the FPC is illustrated here, a printed wiring board (PWB) may be attached to the FPC. A light-emitting device in this specification includes, in its category, not only a light-emitting device itself but also a light-emitting device provided with an FPC or a PWB.

Next, a cross-sectional structure of the light-emitting device is described with reference to FIG. 6B. The driver circuit portions and the pixel portion are formed over an element substrate 610. Here, FIG. 6B illustrates the source driver circuit 601, which is the driver circuit portion, and one pixel of the pixel portion 602.

In the source driver circuit 601, a CMOS circuit composed of an n-channel TFT 623 and a p-channel TFT 624 is formed. The driver circuit may be formed using any of various circuits such as a CMOS circuit, a PMOS circuit, and an NMOS circuit. Although this embodiment shows a driver-integrated light-emitting device in which the driver circuit is formed over the substrate, the driver circuit is not necessarily formed over the substrate and may be formed outside the substrate.

The pixel portion 602 is composed of pixels each including a switching TFT 611, a current controlling TFT 612, and a first electrode 613 electrically connected to a drain of the current controlling TFT 612. Note that an insulator 614 is formed to cover an end portion of the first electrode 613. The insulator 614 can be formed using a positive photosensitive resin film.

In order to improve coverage with a film that is formed over the insulator 614, the insulator 614 is formed to have a curved surface with curvature at its upper or lower end portion. For example, when photosensitive acrylic is used as a material of the insulator 614, only the upper end portion of the insulator 614 preferably has a curved surface. The radius of curvature of the curved surface is preferably greater than or equal to 0.2 µm and less than or equal to 0.3 µm. For the insulator 614, either a negative photosensitive material or a positive photosensitive material can be used.

An EL layer 616 and a second electrode 617 are formed over the first electrode 613. For the first electrode 613 that functions as an anode, a material having a high work function is preferably used. It is possible to use, for example, a single-layer film such as an ITO film, an indium tin oxide film containing silicon, an indium oxide film containing zinc oxide at 2 wt % to 20 wt %, a titanium nitride film, a chromium film, a tungsten film, a Zn film, or a Pt film; a stack including a titanium nitride film and a film containing aluminum as its main component; or a stack including three layers of a titanium nitride film, a film containing aluminum as its main component, and a titanium nitride film. The first electrode 613 with a stacked structure achieves low wiring resistance and a favorable ohmic contact as well as functioning as an anode.

The EL layer 616 is formed by any of a variety of methods such as an evaporation method using an evaporation mask, an inkjet method, and a spin coating method. As a material contained in the EL layer 616, a low molecular compound or a high molecular compound (including an oligomer or a dendrimer) may be used.

As a material used for the second electrode 617, which is formed over the EL layer 616 and functions as a cathode, a material having a low work function (e.g., Al, Mg, Li, Ca, or an alloy or a compound thereof, such as MgAg, MgIn, or AlLi) is preferably used. In the case where light generated in the EL layer 616 passes through the second electrode 617, a stack including a thin metal film and a transparent conductive film (e.g., ITO, indium oxide containing zinc oxide at 2 wt % to 20 wt %, indium tin oxide containing silicon, or zinc oxide (ZnO)) is preferably used for the second electrode 617.

A light-emitting element 618 is composed of the first electrode 613, the EL layer 616, and the second electrode 617. The light-emitting element 618 preferably has the structure described in Embodiment 1 or Embodiment 2. In the light-emitting device of this embodiment, the pixel portion, which is composed of a plurality of light-emitting elements, may include both the light-emitting element with the structure described in Embodiment 1 or Embodiment 2 and a light-emitting element with a different structure.

The sealing substrate 604 is attached to the element substrate 610 with the sealant 605, so that the light-emitting element 618 is placed in the space 607 surrounded by the element substrate 610, the sealing substrate 604, and the sealant 605. The space 607 is filled with a filler. The filler may be an inert gas (e.g., nitrogen or argon), or a resin and/or a desiccant.

An epoxy-based resin or glass frit is preferably used for the sealant 605. It is preferred that such a material do not transmit moisture or oxygen as much as possible. As the sealing substrate 604, a glass substrate, a quartz substrate, or a plastic substrate formed of fiber reinforced plastic (FRP), polyvinyl fluoride (PVF), polyester, acrylic, or the like can be used.

As described above, the light-emitting device including the light-emitting element described in Embodiment 1 or Embodiment 2 can be obtained.

<Structure Example 1 of Light-Emitting Device>

FIGS. 7A and 7B each illustrate an example of a light-emitting device that includes a light-emitting element exhibiting white light emission and a coloring layer (a color filter).

FIG. 7A illustrates a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of light-emitting elements, a partition 1026, an EL layer 1028, a second electrode 1029 of the light-emitting elements, a sealing substrate 1031, a sealant 1032, a red pixel 1044R, a green pixel 1044G, a blue pixel 1044B, a white pixel 1044W, and the like.

In FIG. 7A, coloring layers (a red coloring layer 1034R, a green coloring layer 1034G, and a blue coloring layer 1034B) are provided on a transparent base material 1033. A black layer (a black matrix) 1035 may be additionally provided. The transparent base material 1033 provided with the coloring layers and the black layer is placed in proper alignment and fixed to the substrate 1001. The coloring layers and the black layer are covered with an overcoat layer 1036. In FIG. 7A, light obtained from the EL layer 1028 includes light extracted to the outside without passing through the coloring layers and light extracted to the outside after passing through the coloring layers. Since light that does not pass through the coloring layers is white and light that passes through any one of the coloring layers is red, blue, or green, an image can be displayed using pixels of the four colors.

FIG. 7B illustrates an example in which the red coloring layer 1034R, the green coloring layer 1034G, and the blue coloring layer 1034B are formed between the gate insulating film 1003 and the first interlayer insulating film 1020. As illustrated in FIG. 7B, the coloring layers may be provided between the substrate 1001 and the sealing substrate 1031.

The above-described light-emitting device has a structure in which light is extracted from the substrate 1001 side where the TFTs are formed (a bottom-emission structure), but may have a structure in which light is extracted from the sealing substrate 1031 side (a top-emission structure).

<Structure Example 2 of Light-Emitting Device>

FIGS. 8A and 8B are cross-sectional views of top-emission light-emitting devices. For a top-emission structure, a substrate that does not transmit light can be used as the substrate 1001. The process up to the step of forming of a connection electrode that connects the TFT and the anode of the light-emitting element is performed in the same manner as in the bottom-emission light-emitting device. Then, a third interlayer insulating film 1037 is formed to cover an electrode 1022. This insulating film may have a planarization function. The third interlayer insulating film 1037 can be formed using a material usable for the second interlayer insulating film 1021 or any of other various materials.

Lower electrodes 1025W, 1025R, 1025G, and 1025B of the light-emitting elements each function as an anode here, but may function as a cathode. In a top-emission light-emitting device such as those illustrated in FIGS. 8A and 8B, the lower electrodes 1025W, 1025R, 1025G, and 1025B are preferably reflective electrodes. Note that the second electrode 1029 preferably has a function of reflecting light and a function of transmitting light. A microcavity structure is preferably employed between the second electrode 1029 and the lower electrodes 1025W, 1025R, 1025G, and 1025B, in which case light having a specific wavelength is amplified. The EL layer 1028 has a structure similar to the structure described in Embodiment 1 or Embodiment 2 so that white light emission can be obtained.

In FIGS. 7A and 7B and FIGS. 8A and 8B, the structure of the EL layer for providing white light emission can be achieved by, for example, using a plurality of light-emitting layers or using a plurality of light-emitting units. Note that the structure providing white light emission is not limited to the above.

In the top-emission structure illustrated in FIGS. 8A and 8B, sealing can be performed with the sealing substrate 1031 where the coloring layers (the red coloring layer 1034R, the green coloring layer 1034G, and the blue coloring layer 1034B) are provided. The sealing substrate 1031 may be provided with a black layer (a black matrix) 1030 that is positioned between pixels. The coloring layers (the red coloring layer 1034R, the green coloring layer 1034G, and the blue coloring layer 1034B) and the black layer (the black matrix) 1030 may be covered with the overcoat layer. Note that a light-transmitting substrate is used as the sealing substrate 1031.

FIG. 8A illustrates a structure in which full color display is performed using three colors of red, green, and blue; full color display can alternatively be performed using four colors of red, green, blue, and white as illustrated in FIG. 8B. The structure for performing full color display is not limited to the above. For example, full color display using four colors of red, green, blue, and yellow may be performed.

In the light-emitting element of one embodiment of the present invention, a fluorescent material is used as a guest material. Since a fluorescent material has a shaper spectrum than a phosphorescent material, light emission with high color purity can be obtained. Accordingly, the use of the light-emitting element enables the light-emitting device shown in this embodiment to have high color reproducibility.

In the above manner, the light-emitting device including the light-emitting element described in Embodiment 1 or Embodiment 2 can be obtained.

Note that this embodiment can be combined with any of the other embodiments as appropriate.

Embodiment 4

In this embodiment, electronic devices and display devices of embodiments of the present invention will be described.

According to one embodiment of the present invention, it is possible to manufacture an electronic device and a display device that include a flat surface and have favorable emission efficiency and high reliability. In addition, according to one embodiment of the present invention, it is possible to manufacture an electronic device and a display device that include a curved surface and have favorable emission efficiency and high reliability. The light-emitting element of one embodiment of the present invention can emit light with high color purity. Accordingly, the use of the light-emitting element in a light-emitting device shown in this embodiment can provide an electronic device and a display device that have high color reproducibility.

Examples of electronic devices include a television set, a desktop or laptop personal computer, a monitor of a computer or the like, a digital camera, a digital video camera, a digital photo frame, a mobile phone, a portable game machine, a portable information terminal, an audio reproducing device, and a large game machine such as a pachinko machine.

Figure 9A:
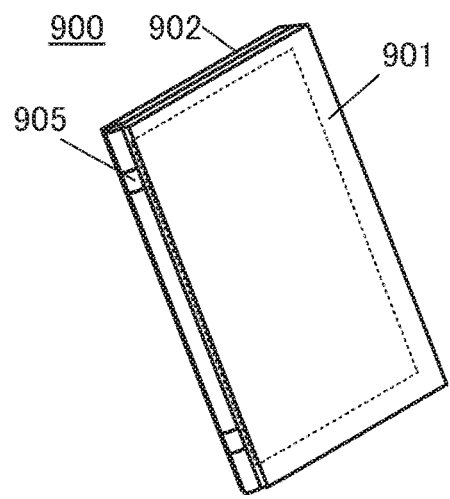
FIGS. 9A to 9D illustrate electronic devices of embodiments of the present invention.
Figure 9B:
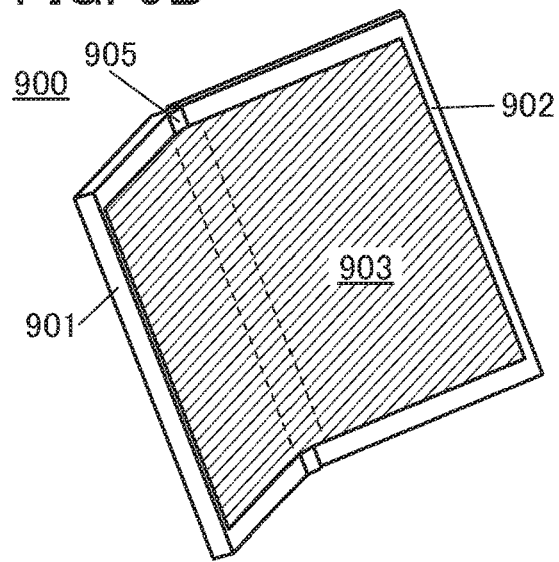

A portable information terminal 900 illustrated in FIGS. 9A and 9B includes a housing 901, a housing 902, a display portion 903, a hinge portion 905, and the like.

The housing 901 and the housing 902 are joined together with the hinge portion 905. The portable information terminal 900 can be opened as illustrated in FIG. 9B from a closed state (FIG. 9A). Thus, the portable information terminal 900 has high portability when carried and excels in visibility when used because of its large display region.

In the portable information terminal 900, the flexible display portion 903 is provided across the housing 901 and the housing 902 that are joined to each other by the hinge portion 905.

The light-emitting device manufactured using one embodiment of the present invention can be used for the display portion 903. Thus, the portable information terminal can have high reliability.

The display portion 903 can display at least one of document data, a still image, a moving image, and the like. When document data is displayed on the display portion 903, the portable information terminal 900 can be used as an e-book reader.

When the portable information terminal 900 is opened, the display portion 903 is significantly curved. For example, the display portion 903 is held while including a curved portion with a radius of curvature ranging from 1 mm to 50 mm, preferably from 5 mm to 30 mm. Part of the display portion 903 can display an image while being bent because pixels are continuously arranged from the housing 901 to the housing 902.

The display portion 903 functions as a touch panel and can be controlled with a finger, a stylus, or the like.

The display portion 903 is preferably formed using one flexible display, in which case a continuous image can be displayed between the housing 901 and the housing 902. Note that each of the housings 901 and 902 may be provided with a display.

The hinge portion 905 preferably includes a locking mechanism so that an angle formed between the housing 901 and the housing 902 does not become larger than a predetermined angle when the portable information terminal 900 is opened. For example, an angle at which the housing 901 and the housing 902 become locked (they are not opened any further) is preferably greater than or equal to 900 and less than 1800 and can typically be 90°, 120°, 135°, 150°, 175°, or the like. Consequently, the convenience, safety, and reliability of the portable information terminal 900 can be improved.

When the hinge portion 905 includes a locking mechanism, excessive force is not applied to the display portion 903; thus, breakage of the display portion 903 can be prevented. Therefore, a highly reliable portable information terminal can be provided.

The housing 901 and the housing 902 may include a power button, an operation button, an external connection port, a speaker, a microphone, or the like.

One of the housing 901 and the housing 902 is provided with a wireless communication module, and data can be transmitted and received through a computer network such as the Internet, a local area network (LAN), or Wi-Fi (registered trademark).

Figure 9C:
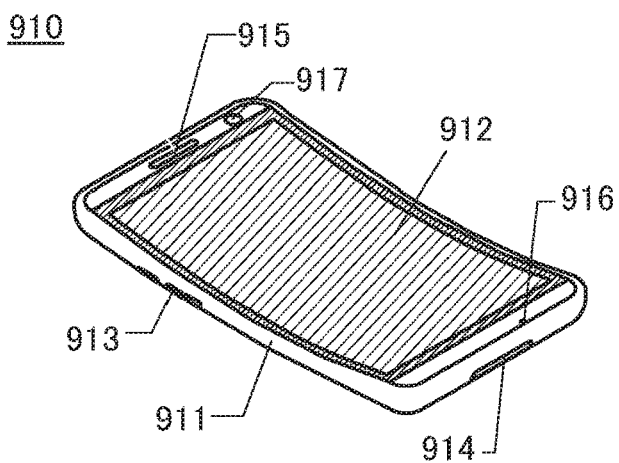

A portable information terminal 910 illustrated in FIG. 9C includes a housing 911, a display portion 912, an operation button 913, an external connection port 914, a speaker 915, a microphone 916, a camera 917, and the like.

The light-emitting device manufactured using one embodiment of the present invention can be used for the display portion 912. Thus, the portable information terminal can be manufactured with high yield.

The portable information terminal 910 includes a touch sensor in the display portion 912. Operations such as making a call and inputting letters can be performed by touch on the display portion 912 with a finger, a stylus, or the like.

With the operation button 913, the power can be turned on or off. In addition, types of images displayed on the display portion 912 can be switched; for example, switching an image from a mail creation screen to a main menu screen is performed with the operation button 913.

When a sensing device such as a gyroscope sensor or an acceleration sensor is provided inside the portable information terminal 910, the direction of display on the screen of the display portion 912 can be automatically changed by determining the orientation of the portable information terminal 910 (whether the portable information terminal 910 is placed horizontally or vertically). Furthermore, the direction of display on the screen can be changed by touch on the display portion 912, operation with the operation button 913, or sound input using the microphone 916, for example.

The portable information terminal 910 functions as, for example, one or more of a telephone set, a notebook, and an information browsing system. Specifically, the portable information terminal 910 can be used as a smartphone. The portable information terminal 910 is capable of executing a variety of applications such as mobile phone calls, e-mailing, viewing and editing texts, music reproduction, video replay, Internet communication, and computer games, for example.

Figure 9D:
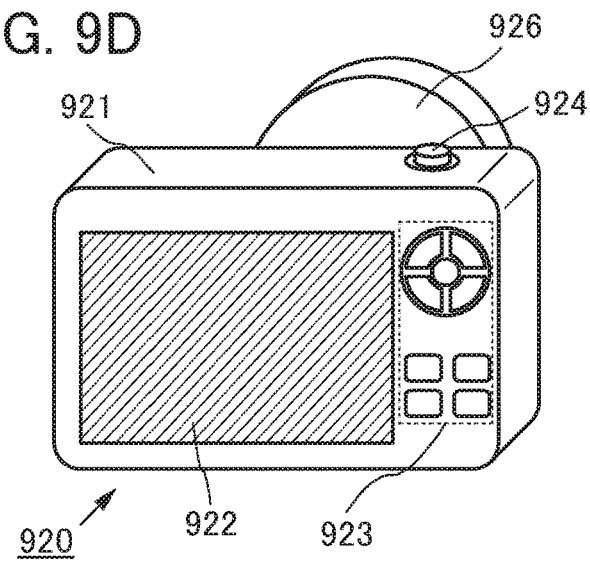

A camera 920 illustrated in FIG. 9D includes a housing 921, a display portion 922, operation buttons 923, a shutter button 924, and the like. Furthermore, an attachable lens 926 is attached to the camera 920.

The light-emitting device manufactured using one embodiment of the present invention can be used for the display portion 922. Thus, the camera can be highly reliable.

Although the lens 926 of the camera 920 here is detachable from the housing 921 for replacement, the lens 926 may be incorporated into the housing 921.

Still images or moving images can be taken with the camera 920 at the press of the shutter button 924. Images can also be taken by the touch on the display portion 922 that has a function of a touch panel.

Note that a stroboscope, a viewfinder, or the like can be additionally attached to the camera 920 or may alternatively be incorporated into the housing 921.

Figure 10A:
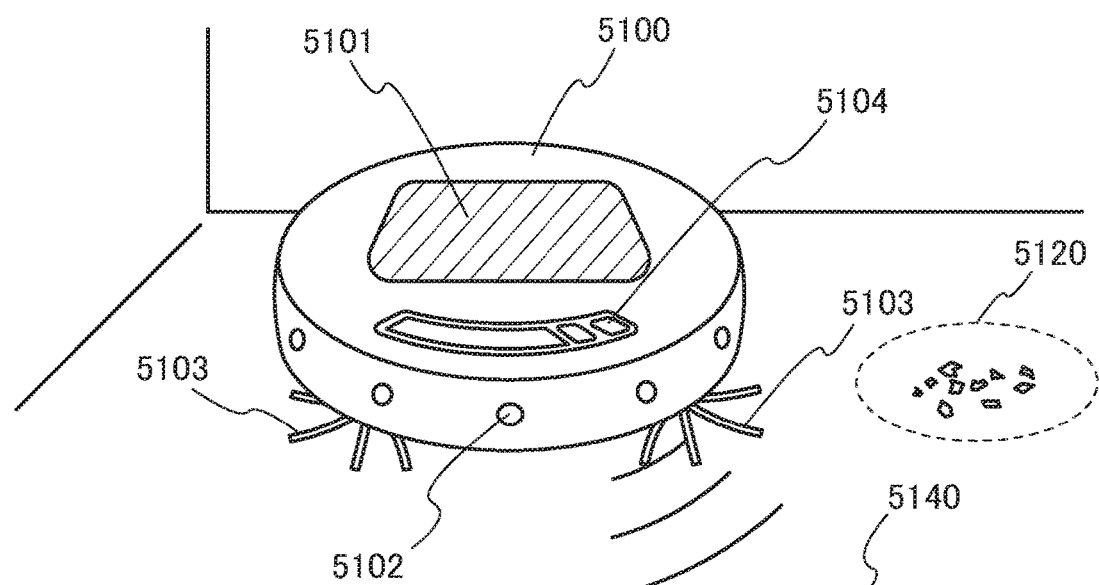
FIGS. 10A to 10C illustrate electronic devices of embodiments of the present invention.

FIG. 10A is a schematic view illustrating an example of a cleaning robot.

A cleaning robot 5100 includes a display 5101 on its top surface, a plurality of cameras 5102 on its side surface, a brush 5103, and operation buttons 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. The cleaning robot 5100 has a wireless communication means.

The cleaning robot 5100 is self-propelled, detects dust 5120, and sucks up the dust through the inlet provided on the bottom surface.

The cleaning robot 5100 can judge whether there is an obstacle such as a wall, furniture, or a step by analyzing images taken by the cameras 5102. When the cleaning robot 5100 detects an object that is likely to be caught in the brush 5103 (e.g., a wire) by image analysis, the rotation of the brush 5103 can be stopped.

The display 5101 can display the remaining capacity of a battery, the amount of vacuumed dust, and the like. The display 5101 may display a path on which the cleaning robot 5100 has run. The display 5101 may be a touch panel, and the operation buttons 5104 may be provided on the display 5101.

The cleaning robot 5100 can communicate with a portable electronic device 5140 such as a smartphone. The portable electronic device 5140 can display images taken by the cameras 5102. Accordingly, an owner of the cleaning robot 5100 can monitor his/her room even when the owner is not at home. The owner can also check the display on the display 5101 by the portable electronic device 5140 such as a smartphone.

The light-emitting device of one embodiment of the present invention can be used for the display 5101.

Figure 10B:
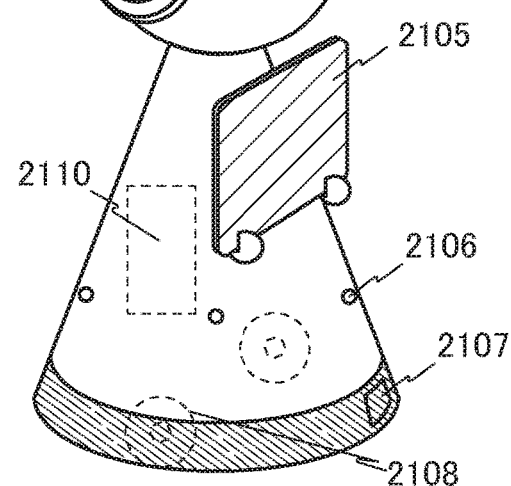

A robot 2100 illustrated in FIG. 10B includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 also has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of capturing an image of the surroundings of the robot 2100. The obstacle sensor 2107 can detect an obstacle in the direction where the robot 2100 advances with the moving mechanism 2108. The robot 2100 can move safely by recognizing the surroundings with the upper camera 2103, the lower camera 2106, and the obstacle sensor 2107.

The light-emitting device of one embodiment of the present invention can be used for the display 2105.

Figure 10C:
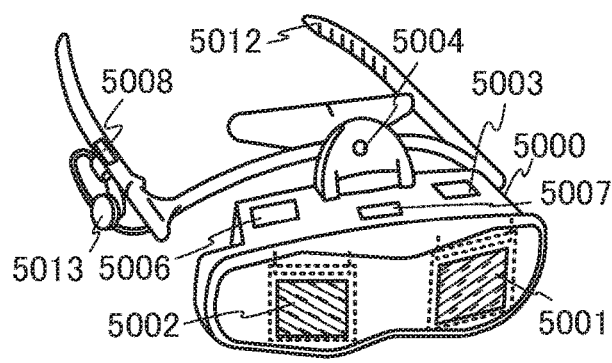

FIG. 10C illustrates an example of a goggle-type display. The goggle-type display includes, for example, a housing 5000, a display portion 5001, a speaker 5003, an LED lamp 5004, operation keys 5005 (including a power switch and an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, a second display portion 5002, a support 5012, and an earphone 5013.

The light-emitting device of one embodiment of the present invention can be used for the display portion 5001 and the second display portion 5002.

Figure 11A:
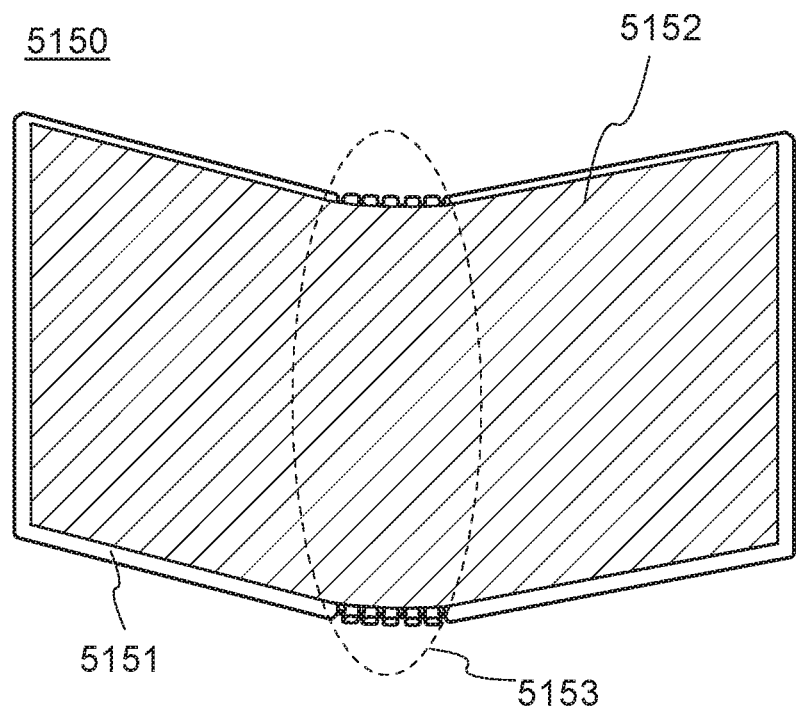
FIGS. 11A and 11B illustrate an electronic device of one embodiment of the present invention.
Figure 11B:
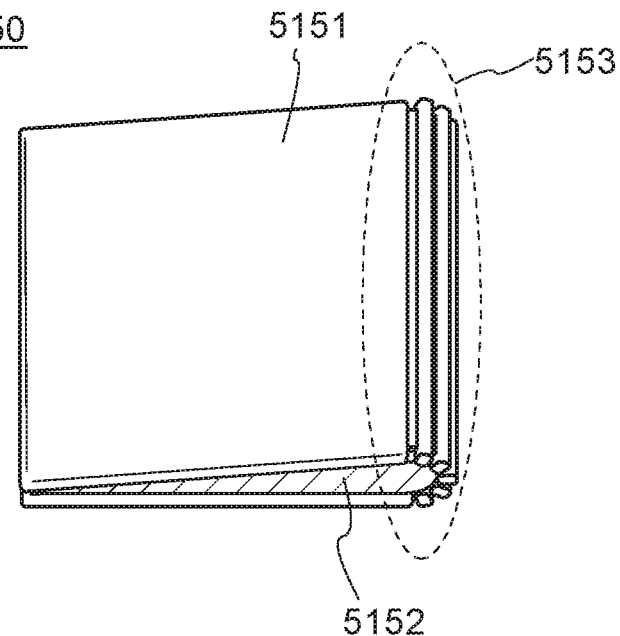

FIGS. 11A and 11B illustrate a foldable portable information terminal 5150. The foldable portable information terminal 5150 includes a housing 5151, a display region 5152, and a bend portion 5153. FIG. 11A illustrates the portable information terminal 5150 that is opened. FIG. 11B illustrates the portable information terminal 5150 that is folded. Despite its large display region 5152, the portable information terminal 5150 is compact in size and has excellent portability when folded.

The display region 5152 can be folded in half with the bend portion 5153. The bend portion 5153 includes a flexible member and a plurality of supporting members. When the display region is folded, the flexible member expands and the bend portion 5153 has a radius of curvature of 2 mm or more, preferably 5 mm or more.

Note that the display region 5152 may be a touch panel (an input/output device) including a touch sensor (an input device). The light-emitting device of one embodiment of the present invention can be used for the display region 5152.

This embodiment can be combined with any of the other embodiments as appropriate.

Embodiment 5

In this embodiment, an example in which the light-emitting element of one embodiment of the present invention is used for various lighting devices will be described with reference to FIG. 12. With the use of the light-emitting element of one embodiment of the present invention, a highly reliable lighting device with favorable emission efficiency can be manufactured.

Forming the light-emitting element of one embodiment of the present invention over a flexible substrate enables an electronic device and a lighting device to have a light-emitting region with a curved surface.

The light-emitting device including the light-emitting element of one embodiment of the present invention can also be used for lighting for motor vehicles, specifically lighting for a windshield and a ceiling, for example.

Figure 12:
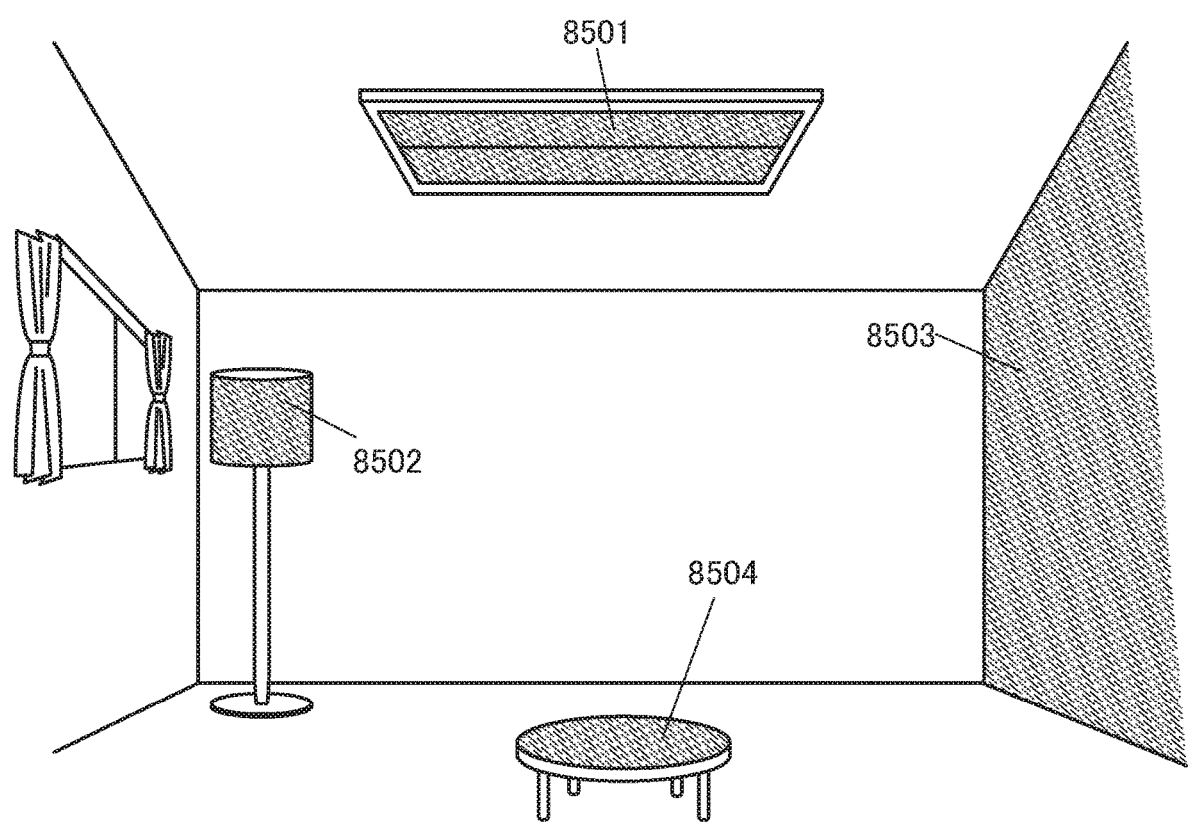
FIG. 12 illustrates lighting devices of embodiments of the present invention.

FIG. 12 illustrates an example in which the light-emitting element is used for an indoor lighting device 8501. Since the light-emitting element can have a larger area, a large-area lighting device can also be formed. In addition, a lighting device 8502 whose light-emitting region has a curved surface can be formed with the use of a housing having a curved surface. The light-emitting element described in this embodiment is in the form of a thin film, which allows the housing to be designed more freely. Accordingly, the lighting device can be elaborately designed in a variety of ways. Furthermore, a wall of the room may be provided with a large-sized lighting device 8503. Touch sensors may be provided in the lighting devices 8501, 8502, and 8503 to control the power on/off of the lighting devices.

When the light-emitting element is provided on the top surface of a table, a lighting device 8504 that has a function of a table can be obtained. Note that when the light-emitting element is used as part of other furniture, a lighting device that has a function of the furniture can be obtained.

As described above, lighting devices and electronic devices can be obtained with the use of the light-emitting element of one embodiment of the present invention. Note that the light-emitting element can be used for lighting devices and electronic devices in a variety of fields without being limited to those described in this embodiment.

The structures described in this embodiment can be combined with any of the structures described in the other embodiments as appropriate.

[Example 1]

This example will show fabrication examples of the light-emitting element of one embodiment of the present invention. The structure of each light-emitting element fabricated in this example is the same as that illustrated in FIG. 1A. Table 1 shows the details of the element structures. The structure and abbreviation of compounds used in this example are shown below.

[Chemical Formulae 6]

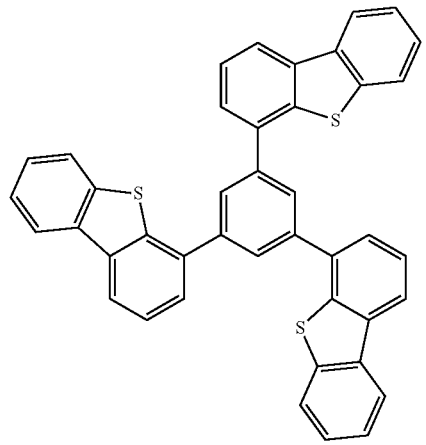

DBT3P-II

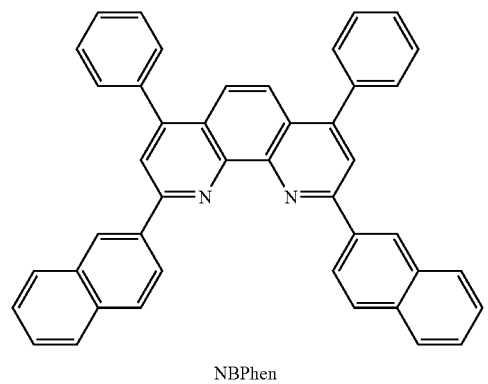

NBPhen

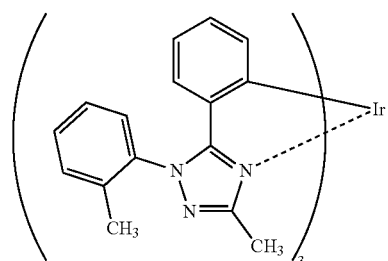

Ir(Mptz1-mp)$_3$

-continued

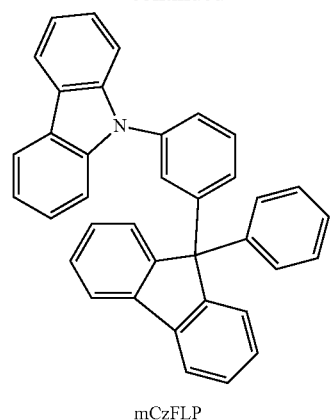

mCzFLP

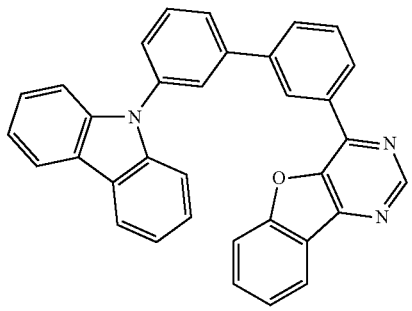

4mCzBPBfpm

-continued

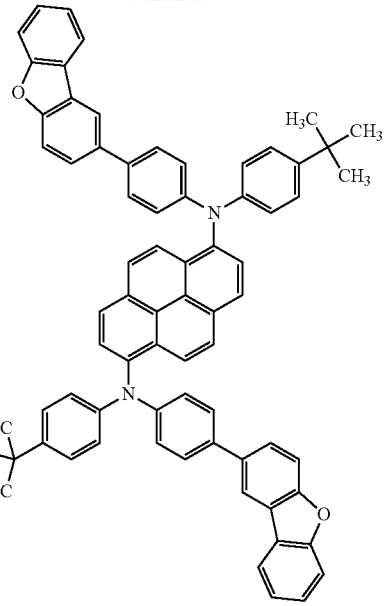

1,6tBuFrBAPrn

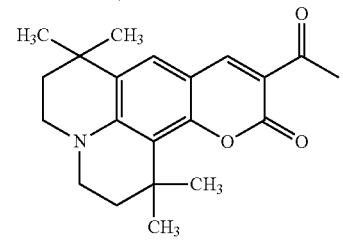

coumarin521T

TABLE 1

| Layer | | Ref. numeral | Thickness (nm) | Material | Weight ratio |
|---|---|---|---|---|---|
| Light-emitting element 1 | Electrode | 102 | 200 | Al | — |
| | Electron-injection layer | 119 | 1 | LiF | — |
| | Electron-transport layer | 118 (2) | 10 | NBPhen | — |
| | | 118 (1) | 15 | 4mCzBPBfpm | — |
| | Light-emitting layer | 130 | 30 | 4mCzBPBfpm: Ir(Mptzl-mp)$_3$: 1,6tBuFrBAPm | 0.8:0.2:0.01 |
| | Hole-transport layer | 112 | 20 | mCzFLP | — |
| | Hole-injection layer | 111 | 30 | DBT3P-II:MoO$_3$ | 1:0.5 |
| | Electrode | 101 | 70 | ITSO | — |
| Light-emitting element 2 | Electrode | 102 | 200 | Al | — |
| | Electron-injection layer | 119 | 1 | LiF | — |
| | Electron-transport layer | 118 (2) | 10 | NBPhen | — |
| | | 118 (1) | 15 | 4mCzBPBfpm | — |
| | Light-emitting layer | 130 | 30 | 4mCzBPBfpm: Ir(Mptzl-mp)$_3$: coumarin 521T | 0.8:0.2:0.005 |
| | Hole-transport layer | 112 | 20 | mCzFLP | — |
| | Hole-injection layer | 111 | 30 | DBT3P-II:MoO$_3$ | 1:0.5 |
| | Electrode | 101 | 70 | ITSO | — |

<Fabrication of Light-Emitting Elements>

Methods of fabricating the light-emitting elements in this example will be described below.

<<Fabrication of Light-Emitting Element 1>>

As the electrode 101, an ITSO film was formed to a thickness of 70 nm over a glass substrate. Note that the area of the electrode 101 was set to 4 mm² (2 mm×2 mm).

Next, as the hole-injection layer 111, DBT3P-II and molybdenum oxide ($MoO_3$) were deposited over the electrode 101 by co-evaporation to have a weight ratio of DBT3P-II:$MoO_3$ 1:0.5 and a thickness of 30 nm.

Then, as the hole-transport layer 112, 9-[3-(9-phenyl-9H-fluoren-9-yl)phenyl]-9H-carbazole (abbreviation: mCzFLP) was deposited to a thickness of 20 nm over the hole-injection layer 111 by evaporation.

Next, as the light-emitting layer 130, 4-{3-[3'-(9H-carbazol-9-yl)]biphenyl-3-yl}benzofuro[3,2-d]pyrimidine (abbreviation: 4mCzBPBfpm), tris[3-methyl-1-(2-methylphenyl)-5-phenyl-1H-1,2,4-triazolato]iridium(III) (abbreviation: Ir(Mptz1-mp)$_3$), and N,N'-bis(4-tert-butylphenyl)-N,N'-bis[4-(dibenzofuran-2-yl)phenyl]-pyren-1,6-diamine (abbreviation: 1,6tBuFrBAPrn) were deposited over the hole-transport layer 112 by co-evaporation to have a weight ratio of 4mCzBPBfpm:Ir(Mptz1-mp)$_3$:1,6tBuFrBAPrn=0.8:0.2:0.01 and a thickness of 30 nm. In the light-emitting layer 130, 1,6tBuFrBAPrn is a fluorescent compound, and Ir(Mptz1-mp)$_3$ is a phosphorescent compound.

Then, as the electron-transport layer 118, 4mCzBPBfpm and NBPhen were sequentially deposited to a thickness of 15 nm and 10 nm, respectively, over the light-emitting layer 130 by evaporation. Subsequently, as the electron-injection layer 119, LiF was deposited to a thickness of 1 nm over the electron-transport layer 118 by evaporation.

Next, as the electrode 102, aluminum (Al) was formed to a thickness of 200 nm over the electron-injection layer 119.

Then, in a glove box containing a nitrogen atmosphere, with the use of a sealant for an organic EL device, a glass substrate for sealing was fixed to the glass substrate on which the organic materials were deposited, whereby the light-emitting element 1 was sealed. Specifically, after the sealant was applied to surround the organic materials deposited on the glass substrate and the glass substrate was bonded to the glass substrate for sealing, irradiation with ultraviolet light having a wavelength of 365 nm at 6 J/cm² and heat treatment at 80° C. for one hour were performed. Through the above steps, the light-emitting element 1 was obtained.

<<Fabrication of Light-Emitting Element 2>>

The light-emitting element 2 was fabricated through the same steps as those for the light-emitting element 1 except for the step of forming the light-emitting layer 130.

As the light-emitting layer 130 in the light-emitting element 2, 4mCzBPBfpm, Ir(Mptz1-mp)$_3$, and 10-acetyl-2,3,6,7-tetrahydro-1,1,7,7-tetramethyl-1H,5H,11H-[1]benzopyrano[6,7,8-ij]quinolizin-11-one (abbreviation: coumarin 521T) were deposited by co-evaporation to have a weight ratio of 4mCzBPBfpm:Ir(Mptz1-mp)$_3$:coumarin 521T=0.8:0.2:0.005 and a thickness of 30 nm. In the light-emitting layer 130, coumarin 521T is a fluorescent compound serving as the third organic compound, and Ir(Mptz1-mp)$_3$ is a phosphorescent compound.

<Characteristics of Light-Emitting Elements>

Next, the characteristics of the fabricated light-emitting elements 1 and 2 were measured.

Luminance and CIE chromaticity were measured with a luminance colorimeter (BM-5A, manufactured by Topcon Technohouse Corporation), and electroluminescence spectra were measured with a multi-channel spectrometer (PMA-11, manufactured by Hamamatsu Photonics K.K.).

Figure 13:
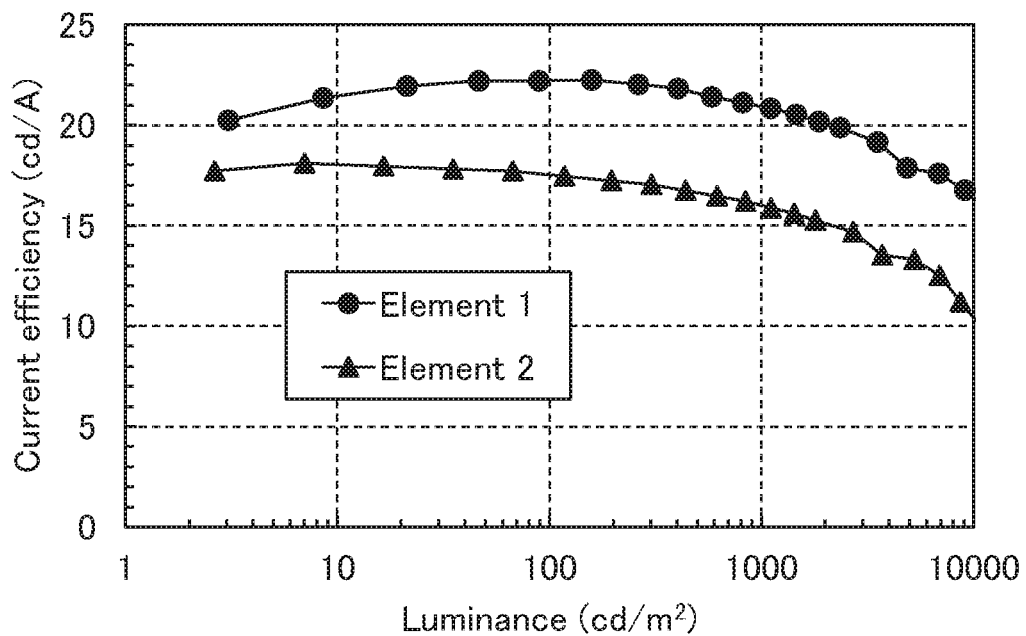
FIG. 13 shows current efficiency—luminance characteristics of light-emitting elements in Example.
Figure 14:
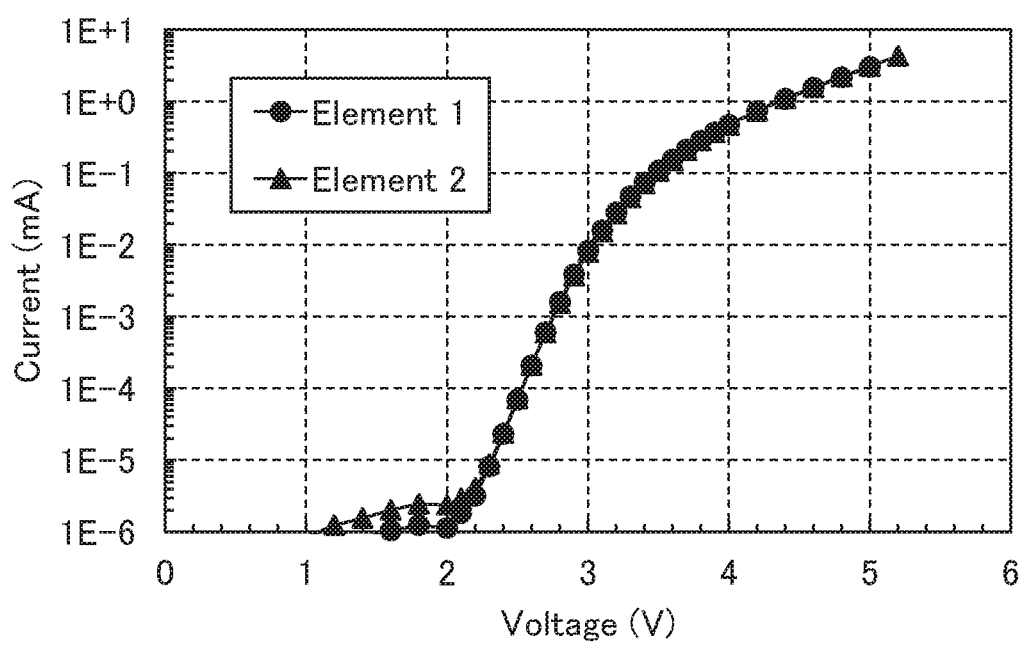
FIG. 14 shows current—voltage characteristics of light-emitting elements in Example.
Figure 15:
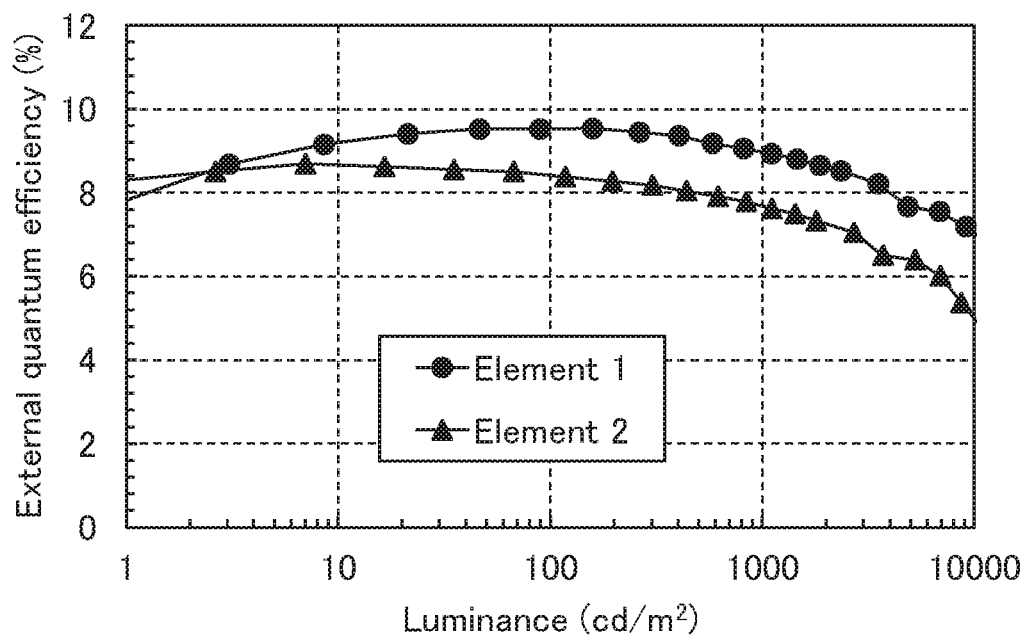
FIG. 15 shows external quantum efficiency—luminance characteristics of light-emitting elements in Example.
Figure 16:
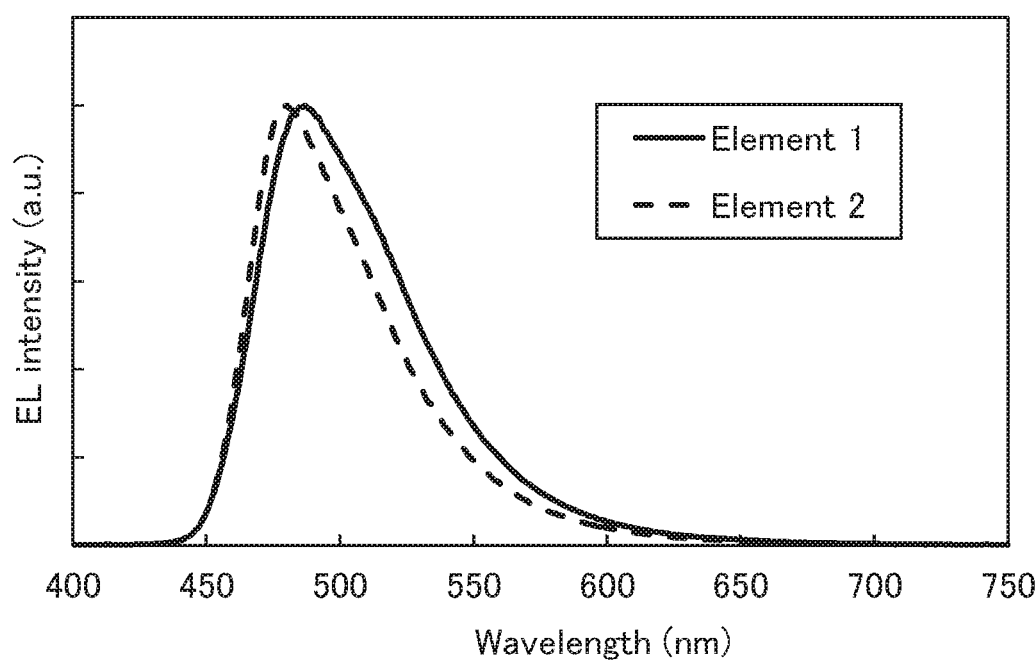
FIG. 16 shows emission spectra of light-emitting elements in Example.

FIG. 13, FIG. 14, and FIG. 15 show luminance-current efficiency characteristics, voltage-current characteristics, and luminance-external quantum efficiency characteristics, respectively, of the light-emitting elements 1 and 2. FIG. 16 shows the electroluminescence spectra obtained when a current with a current density of 2.5 mA/cm² was supplied to the light-emitting elements 1 and 2. Note that the measurement of the light-emitting elements was performed at room temperature (in an atmosphere maintained at 23° C.).

Table 2 shows the element characteristics of the light-emitting elements 1 and 2 at around 1000 cd/m².

TABLE 2

| | Voltage (V) | Current density (mA/cm²) | CIE chromaticity (x, y) | Luminance (cd/m²) | Current efficiency (cd/A) | Power efficiency (lm/W) | External quantum efficiency (%) |
|---|---|---|---|---|---|---|---|
| Light-emitting element 1 | 3.70 | 5.31 | (0.174, 0.424) | 1100 | 20.8 | 17.7 | 8.93 |
| Light-emitting element 2 | 3.80 | 6.98 | (0.157, 0.363) | 1100 | 15.9 | 13.1 | 7.62 |

From FIG. 16, the light-emitting element 1 and the light-emitting element 2 have emission spectra with peak wavelengths of 487 nm and 480 nm, respectively, and exhibit blue light emission originating from fluorescent compounds, 1,6tBuFrBAPrn and coumarin 521T. Moreover, the light-emitting elements 1 and 2, each of which is one embodiment of the present invention, have a narrow full width at half maximum of the electroluminescence spectrum and emit light with high color purity, and thus are suitable for display devices.

As shown in FIG. 13, FIG. 15, and Table 2, the light-emitting elements 1 and 2 exhibit high emission efficiency (current efficiency, power efficiency, and external quantum efficiency). Since the maximum generation probability of singlet excitons due to recombination of carriers (holes and electrons) injected from a pair of electrodes is 25% here, the maximum external quantum efficiency based on the assumption that the outcoupling efficiency is 25% would be 6.25%. Meanwhile, the external quantum efficiency of each of the light-emitting elements 1 and 2 is higher than 6.25%. This is because, in the light-emitting elements 1 and 2 according to one embodiment of the present invention, not only singlet excitons but also triplet excitons can contribute to fluorescence as singlet excitons through Ir(Mptz1-mp)$_3$, which is the phosphorescent compound.

Moreover, the efficiency fall (also referred to as roll-off) on the high luminance side is small in the light-emitting elements 1 and 2. Such small roll-off is one of the features of the light-emitting element in one embodiment of the present invention.

An organic compound having a benzofuropyrimidine skeleton, such as 4mCzBPBfpm used as the host material of the light-emitting elements 1 and 2, has a high S1 level and T1 level. This offers a highly efficient light-emitting element that exhibits blue fluorescence, like the light-emitting elements 1 and 2.

[Example 2]

This example will show fabrication examples of the light-emitting element of one embodiment of the present invention and comparative light-emitting elements. The structure of each light-emitting element fabricated in this example is the same as that illustrated in FIG. 1A. Table 3 shows the details of the element structures. The structure and abbreviation of compounds used in this example are shown below. Note that Example 1 can be referred to for the structures and abbreviations of the other compounds.

[Chemical Formulae 7]

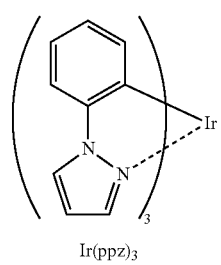

Ir(ppz)₃

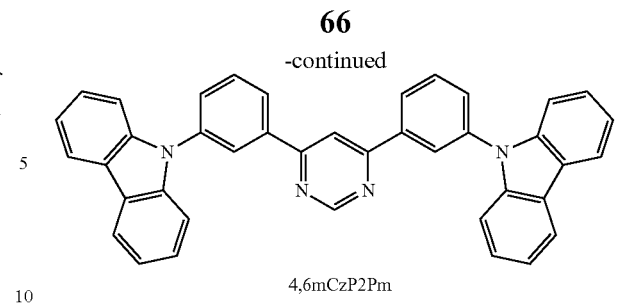

4,6mCzP2Pm

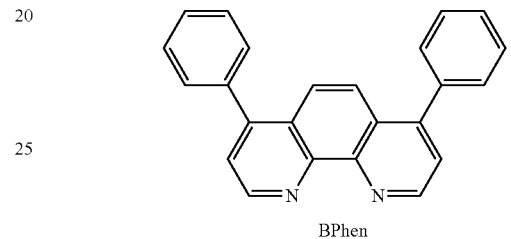

BPhen

TABLE 3

| | Layer | Ref. numeral | Thickness (nm) | Material | Weight ratio |
|---|---|---|---|---|---|
| Light-emitting element 3 | Electrode | 102 | 200 | Al | — |
| | Electron-injection layer | 119 | 1 | LiF | — |
| | Electron-transport layer | 118 (2) | 20 | NBPhen | — |
| | | 118 (1) | 15 | 4mCzBPBfpm | — |
| | Light-emitting layer | 130 | 30 | 4mCzBPBfpm: Ir(ppz)₃: coumarin 545T | 0.8:0.2:0.005 |
| | Hole-transport layer | 112 | 20 | mCzFLP | — |
| | Hole-injection layer | 111 | 40 | DBT3P-II: MoO₃ | 1:0.5 |
| | Electrode | 101 | 70 | ITSO | — |
| Comparative light-emitting element 4 | Electrode | 102 | 200 | Al | — |
| | Electron-injection layer | 119 | 1 | LiF | — |
| | Electron-transport layer | 118 (2) | 20 | NBPhen | — |
| | | 118 (1) | 15 | 4mCzBPBfpm | — |
| | Light-emitting layer | 130 | 30 | 4mCzBPBfpm: Ir(ppz)₃ | 0.8:0.2 |
| | Hole-transport layer | 112 | 20 | mCzFLP | — |
| | Hole-injection layer | 111 | 40 | DBT3P-II:MoO₃ | 1:0.5 |
| | Electrode | 101 | 70 | ITSO | — |
| Comparative light-emitting element 5 | Electrode | 102 | 200 | Al | — |
| | Electron-injection layer | 119 | 1 | LiF | — |
| | Electron-transport layer | 118 (2) | 20 | BPhen | — |
| | | 118 (1) | 15 | 4,6mCzP2Pm | — |
| | Light-emitting layer | 130 | 30 | 4,6mCzP2Pm: Ir(ppz)₃: coumarin 545T | 0.8:0.2:0.005 |
| | Hole-transport layer | 112 | 20 | mCzFLP | — |
| | Hole-injection layer | 111 | 40 | DBT3P-II:MoO₃ | 1:0.5 |
| | Electrode | 101 | 70 | ITSO | — |

<Fabrication of Light-Emitting Elements>

Methods of fabricating the light-emitting elements in this example will be described below.

<<Fabrication of Light-Emitting Element 3>>

As the electrode 101, an ITSO film was formed to a thickness of 70 nm over a glass substrate. Note that the area of the electrode 101 was set to 4 mm$^2$ (2 mm×2 mm).

Next, as the hole-injection layer 111, DBT3P-II and molybdenum oxide (MoO$_3$) were deposited over the electrode 101 by co-evaporation to have a weight ratio of DBT3P-II:MoO$_3$=1:0.5 and a thickness of 40 nm.

Then, as the hole-transport layer 112, 9-[3-(9-phenyl-9H-fluoren-9-yl)phenyl]-9H-carbazole (abbreviation: mCzFLP) was deposited to a thickness of 20 nm over the hole-injection layer 111 by evaporation.

Next, as the light-emitting layer 130, 4mCzBPBfpm, tris[2-(1H-pyrazol-1-yl-κN$^2$)phenyl-κC]iridium(III) (abbreviation: Ir(ppz)$_3$), and 10-(2-benzothiazolyl)-2,3,6,7-tetrahydro-1,1,7,7-tetramethyl-1H,5H,11H-[1]benzopyrano[6,7,8-i j]quinolizin-11-one (abbreviation: coumarin 545T) were deposited over the hole-transport layer 112 by co-evaporation to have a weight ratio of 4mCzBPBfpm:Ir(ppz)$_3$:coumarin 545T=0.8:0.2:0.005 and a thickness of 30 nm. In the light-emitting layer 130, coumarin 545T is a fluorescent compound.

Then, as the electron-transport layer 118, 4mCzBPBfpm and NBPhen were sequentially deposited to a thickness of 15 nm and 20 nm, respectively, over the light-emitting layer 130 by evaporation. Subsequently, as the electron-injection layer 119, LiF was deposited to a thickness of 1 nm over the electron-transport layer 118 by evaporation.

Next, as the electrode 102, aluminum (Al) was formed to a thickness of 200 nm over the electron-injection layer 119.

Then, in a glove box containing a nitrogen atmosphere, with the use of a sealant for an organic EL device, a glass substrate for sealing was fixed to the glass substrate on which the organic materials were deposited, whereby the light-emitting element 3 was sealed. Specifically, after the sealant was applied to surround the organic materials deposited on the glass substrate and the glass substrate was bonded to the glass substrate for sealing, irradiation with ultraviolet light having a wavelength of 365 nm at 6 J/cm$^2$ and heat treatment at 80° C. for one hour were performed. Through the above steps, the light-emitting element 3 was obtained.

<<Fabrication of Comparative Light-Emitting Element 4>>

The comparative light-emitting element 4 was fabricated through the same steps as those for the light-emitting element 3 except for the step of forming the light-emitting layer 130.

As the light-emitting layer 130 of the comparative light-emitting element 4, 4mCzBPBfpm and Ir(ppz)$_3$ were deposited by co-evaporation to have a weight ratio of 4mCzBPBfpm:Ir(ppz)$_3$=0.8:0.2 and a thickness of 30 nm. The light-emitting layer 130 of the comparative light-emitting element 4 differs from that of the light-emitting element 3 in not containing coumarin 545T, which is a fluorescent compound.

<<Fabrication of Comparative Light-Emitting Element 5>>

The comparative light-emitting element 5 was fabricated through the same steps as those for the light-emitting element 3 except for the steps of forming the light-emitting layer 130 and the electron-transport layer 118.

As the light-emitting layer 130, 4,6mCzP2Pm, Ir(ppz)$_3$, and coumarin 545T were deposited by co-evaporation to have a weight ratio of 4,6mCzP2Pm:Ir(ppz)$_3$:coumarin 545T=0.8:0.2:0.005 and a thickness of 30 nm. In the light-emitting layer 130, coumarin 545T is a fluorescent compound serving as the third organic compound. The comparative light-emitting element 5 has the same structure as the light-emitting element 3 except that 4,6mCzP2Pm, which has a pyrimidine skeleton, is used as the host material in the light-emitting layer 130.

Then, as the electron-transport layer 118, 4,6mCzP2Pm and BPhen were sequentially deposited to a thickness of 15 nm and 20 nm, respectively, over the light-emitting layer 130 by evaporation. Subsequently, as the electron-injection layer 119, LiF was deposited to a thickness of 1 nm over the electron-transport layer 118 by evaporation.

<Characteristics of Light-Emitting Elements>

Next, the characteristics of the fabricated light-emitting element 3 and comparative light-emitting elements 4 and 5 were measured. Note that the measurement methods are the same as those in Example 1.

Figure 17:
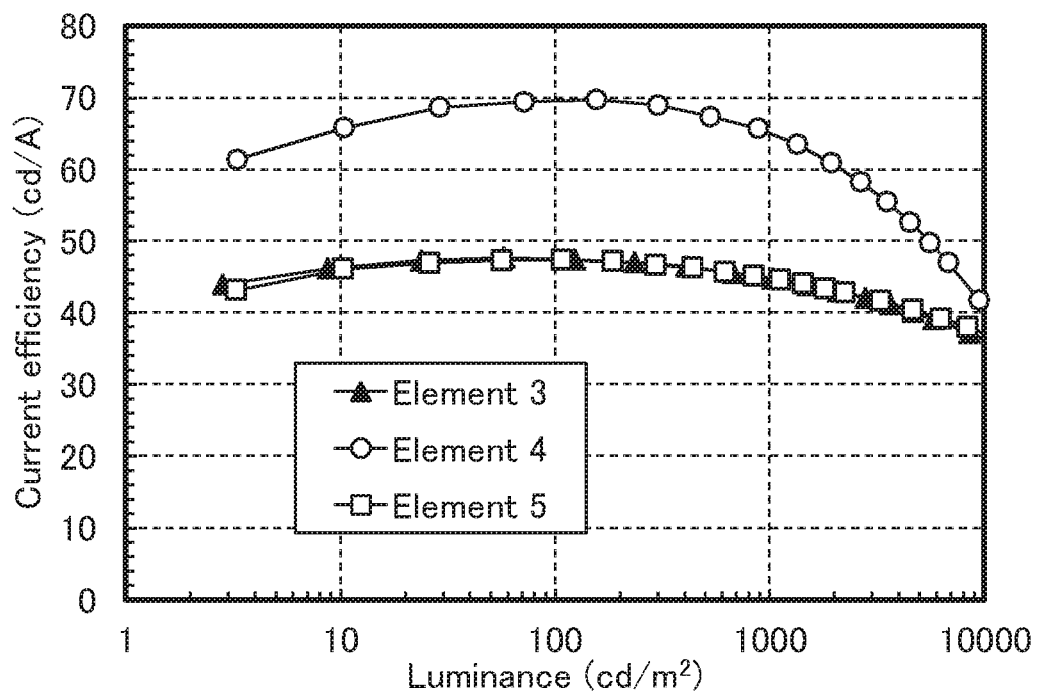
FIG. 17 shows current efficiency—luminance characteristics of light-emitting elements in Example.
Figure 18:
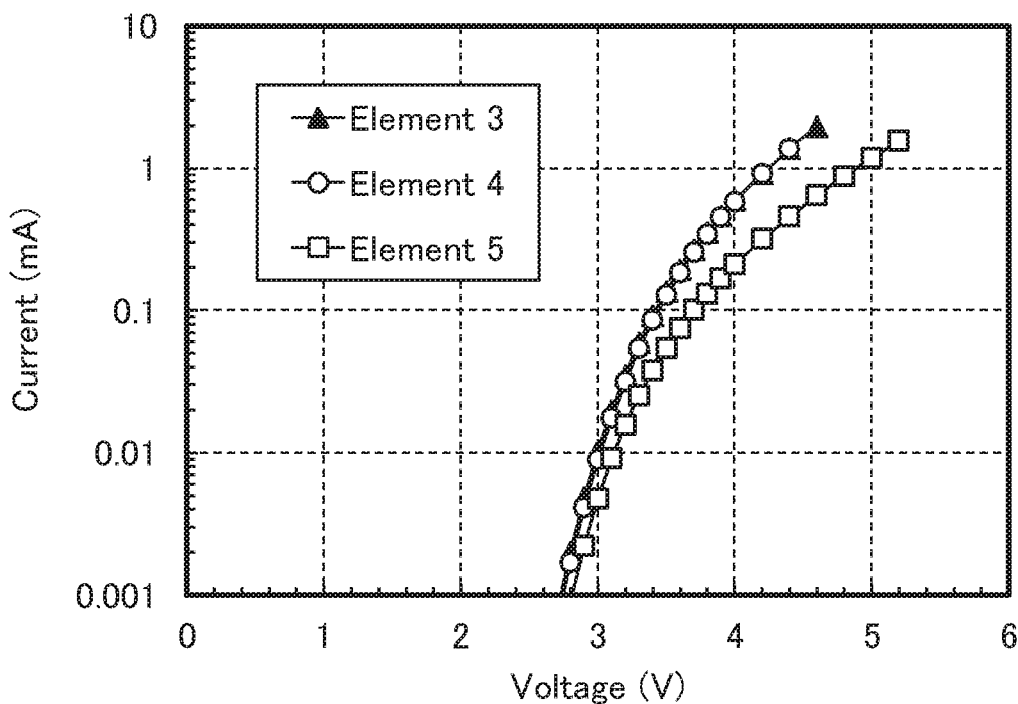
FIG. 18 shows current—voltage characteristics of light-emitting elements in Example.
Figure 19:
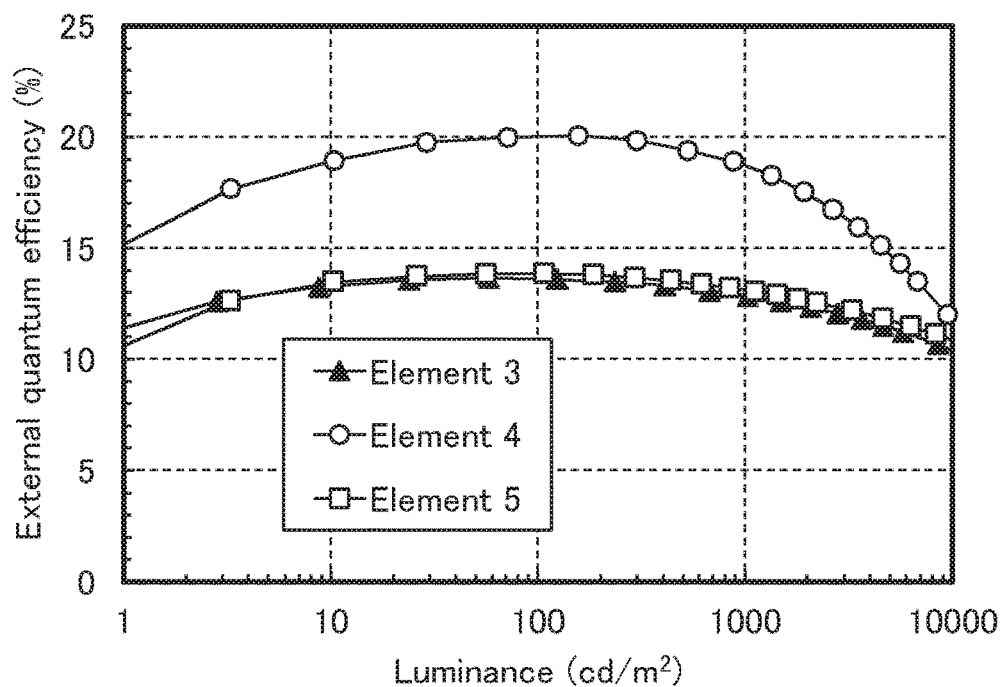
FIG. 19 shows external quantum efficiency—luminance characteristics of light-emitting elements in Example.
Figure 20:
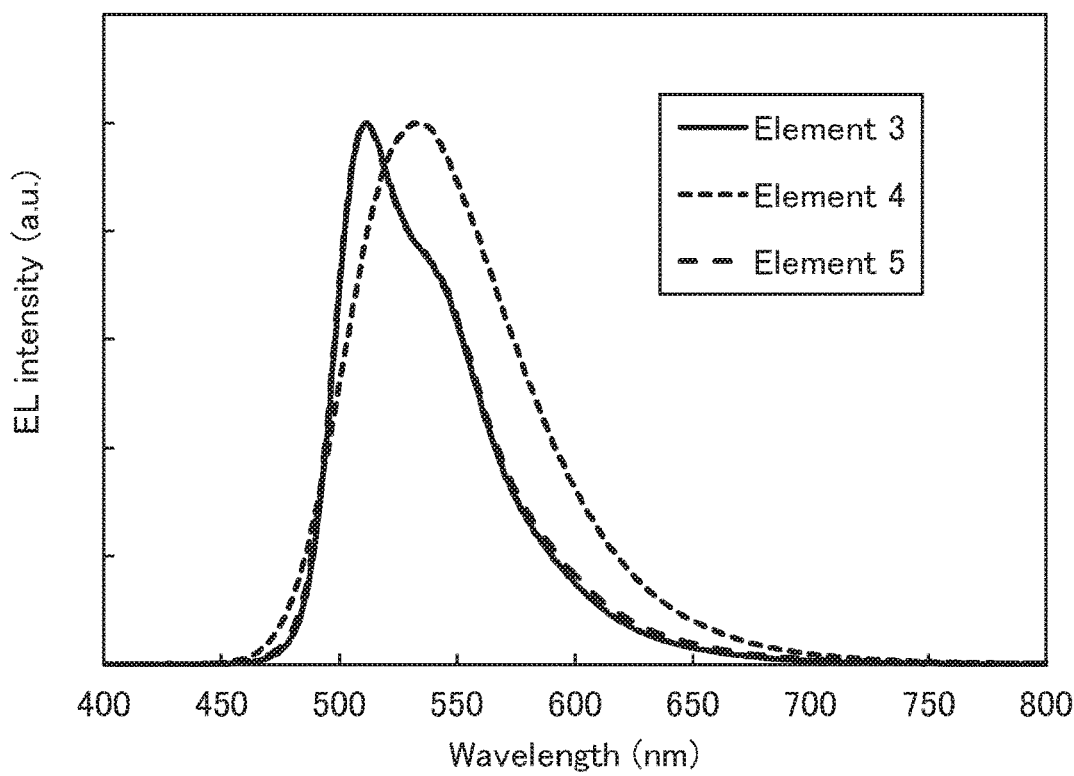
FIG. 20 shows emission spectra of light-emitting elements in Example.

FIG. 17, FIG. 18, and FIG. 19 show luminance-current efficiency characteristics, voltage-current characteristics, and luminance-external quantum efficiency characteristics, respectively, of the light-emitting element 3 and the comparative light-emitting elements 4 and 5. FIG. 20 shows the electroluminescence spectra obtained when a current with a current density of 2.5 mA/cm$^2$ was supplied to the light-emitting element 3 and the comparative light-emitting elements 4 and 5. Note that the measurement of the light-emitting elements was performed at room temperature (in an atmosphere maintained at 23° C.).

Table 4 shows the element characteristics of the light-emitting element 3 and the comparative light-emitting elements 4 and 5 at around 1000 cd/m$^2$.

TABLE 4

|  | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
| --- | --- | --- | --- | --- | --- | --- | --- |
| Light-emitting element 3 | 3.40 | 2.3 | (0.274, 0.655) | 1030 | 44.8 | 41.4 | 12.9 |
| Comparative light-emitting element 4 | 3.30 | 1.3 | (0.334, 0.611) | 885 | 65.7 | 62.5 | 18.9 |
| Comparative light-emitting element 5 | 3.70 | 2.5 | (0.275, 0.653) | 1120 | 44.6 | 37.9 | 13.1 |

As shown in FIG. 20, the electroluminescence spectrum of both the light-emitting element 3 and the comparative light-emitting element 5 exhibits green light emission with a peak wavelength of 512 nm and a full width at half maximum of approximately 63 nm. Therefore, light emitted from the light-emitting element 3 and the comparative light-emitting element 5 originates from coumarin 545T, which is the fluorescent compound. Note that Ir(ppz)$_3$ used in the light-emitting element 3 and the comparative light-emitting element 5 is known as a compound that emits blue light at low temperatures and emits no observable light at room temperature; light originating from Ir(ppz)$_3$ was not observed here.

The comparative light-emitting element 4 exhibits a broad electroluminescence spectrum with a peak wavelength of 532 nm and a full width at half maximum of 83 nm. Light emitted from the comparative light-emitting element 4 originates from an exciplex formed by 4mCzBPBfpm and Ir(ppz)$_3$, which will be described later. Thus, compared to the comparative light-emitting element 4, the light-emitting element 3 of one embodiment of the present invention has a short peak wavelength and a small full width at half maximum in the electroluminescence spectrum and can emit light with high color purity. Accordingly, the light-emitting element of one embodiment of the present invention is suitable for display devices.

As shown in FIG. 17, FIG. 19, and Table 4, the light-emitting element 3 and the comparative light-emitting elements 4 and 5 exhibit high emission efficiency (current efficiency, power efficiency, and external quantum efficiency). Moreover, the external quantum efficiency of the light-emitting element 3 is higher than 6.25%. This is because the light-emitting element 3 emits, in addition to light originating from singlet excitons generated by recombination of carriers (holes and electrons), light originating from triplet excitons or light originating from singlet excitons generated from triplet excitons by reverse intersystem crossing in the exciplex. The comparative light-emitting element 4 emits light originating from the exciplex, and the light-emitting element 3 is the light-emitting element of one embodiment of the present invention that utilizes ExEF.

<Time-Resolved Emission Measurement>

Next, time-resolved emission measurement was performed on the light-emitting element 3 and the comparative light-emitting element 4.

Figure 21:
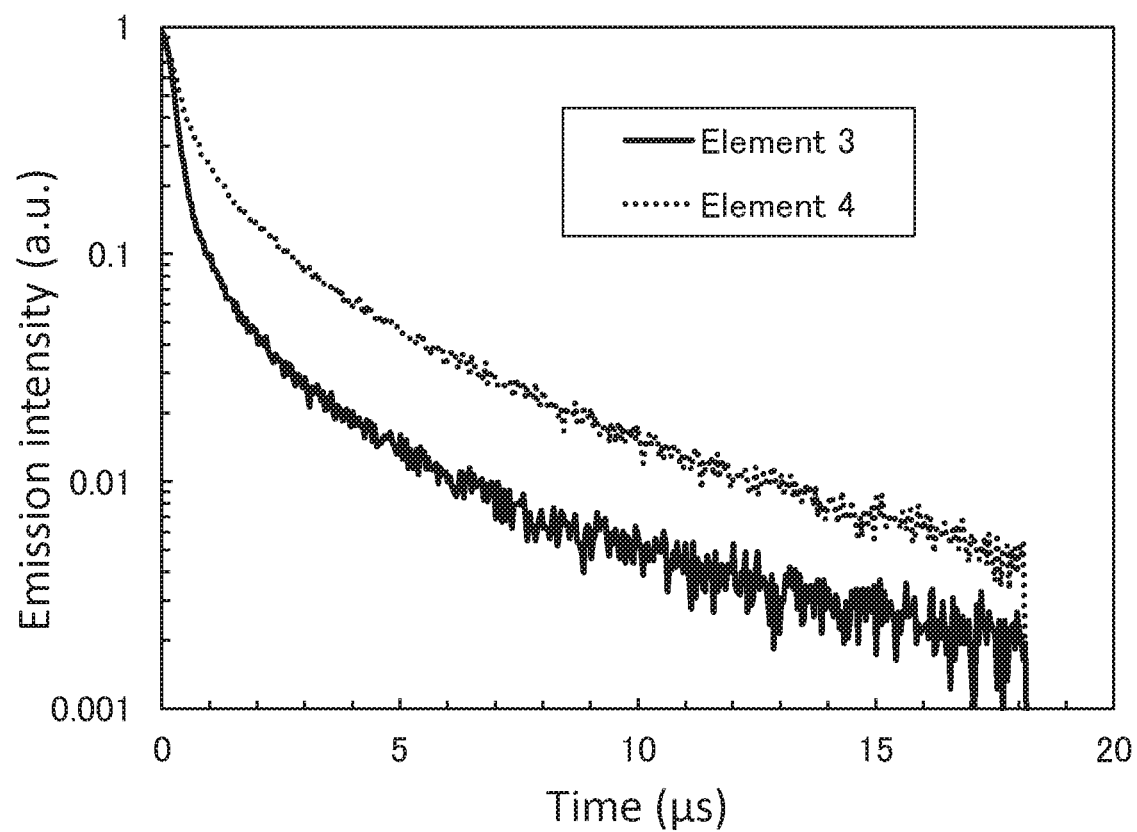
FIG. 21 shows results of time-resolved emission measurement in Example.

A picosecond fluorescence lifetime measurement system (manufactured by Hamamatsu Photonics K.K.) was used for the measurement. In this measurement, to assess the lifetime of fluorescence in the light-emitting elements, a square-wave pulse voltage was applied to the light-emitting elements, and time-resolved measurement of emitted light that was attenuated from the falling of the voltage was performed using a streak camera. The pulse voltage was applied at a frequency of 10 Hz. Integrating data obtained by repeated measurements resulted in data with a high S/N ratio. The measurement was performed at room temperature (300 K) under the following conditions: a pulse voltage of approximately 3 V to 4 V was applied so that the luminance of the light-emitting elements became close to 1000 cd/m$^2$, the pulse time width was 100 μsec, a negative bias voltage was −5 V (at the time when the elements were not driven), and the measurement time was 20 μsec. FIG. 21 shows the measurement results. In FIG. 21, the vertical axis represents the emission intensity normalized to the value in a state where carriers are steadily injected (i.e., the pulse voltage is applied), and the horizontal axis represents the time elapsed after the falling of the pulse voltage.

As shown in FIG. 21, the attenuation rate of light emitted from the light-emitting element 3 is higher than that of light emitted from the comparative light-emitting element 4. This means that the excitation energy is rapidly converted into light in the light-emitting element 3. Thus, the light can be extracted efficiently even when the density of excitons is high (a large amount of current flows) in the light-emitting layer. For that reason, the roll-off is small in the light-emitting element 3 as shown in FIG. 17 and FIG. 19. Such small roll-off is one of the features of the light-emitting element in one embodiment of the present invention.

<CV Measurement Results>

Then, the electrochemical characteristics (oxidation reaction characteristics and reduction reaction characteristics) of the above compounds were measured by cyclic voltammetry (CV) measurement. Note that for the measurement, an electrochemical analyzer (ALS 600A or 600C, produced by BAS Inc.) was used, and the measurement was performed on a solution obtained by dissolving each compound in N,N-dimethylformamide (abbreviation: DMF). In the measurement, the potential of a working electrode with respect to the reference electrode was changed within an appropriate range, so that the oxidation peak potential and the reduction peak potential were obtained. In addition, the HOMO and LUMO levels of each compound were calculated from the estimated redox potential (−4.94 eV) of the reference electrode and the obtained peak potentials.

The HOMO level and LUMO level of Ir(ppz)$_3$ obtained from the CV measurement results were −5.39 eV and −1.77 eV, respectively. The HOMO level and LUMO level of 4mCzBPBfpm were −5.91 eV and −2.97 eV, respectively. The HOMO level and LUMO level of 4,6mCzP2Pm were −5.89 eV and −2.88 eV, respectively.

As described above, the LUMO level of 4mCzBPBfpm is lower than that of Ir(ppz)$_3$, and the HOMO level of Ir(ppz)$_3$ is higher than that of 4mCzBPBfpm. Thus, when these compounds are used for a light-emitting layer as in the light-emitting element 3 and the comparative light-emitting element 4, electrons and holes serving as carriers are efficiently injected from a pair of electrodes into 4mCzBPBfpm and Ir(ppz)$_3$, and thus 4mCzBPBfpm and Ir(ppz)$_3$ can form an exciplex. Similarly, 4,6mCzP2Pm and Ir(ppz)$_3$ can form an exciplex; hence, the comparative light-emitting element 5 is also a light-emitting element utilizing ExEF.

The exciplex formed by 4mCzBPBfpm and Ir(ppz)$_3$ has the LUMO level in 4mCzBPBfpm and the HOMO level in Ir(ppz)$_3$. The energy difference between the LUMO level of 4mCzBPBfpm and the HOMO level of Ir(ppz)$_3$ is 2.42 eV. This value substantially agrees with the emission energy (2.33 eV) calculated from the peak wavelength of the emission spectrum of the comparative light-emitting element 4 in FIG. 20. This indicates that the emission spectrum of the comparative light-emitting element 4 corresponds to light emission due to the exciplex formed by 4mCzBPBfpm and Ir(ppz)$_3$. The difference between the S1 level and the T1 level of the exciplex is small; thus, the emission energy can be regarded as the energy (2.33 eV) of the S1 level and the T1 level of the exciplex.

<Relation Between Emission Spectrum of Exciplex and Absorption Spectrum of Guest Material>

Figure 22:
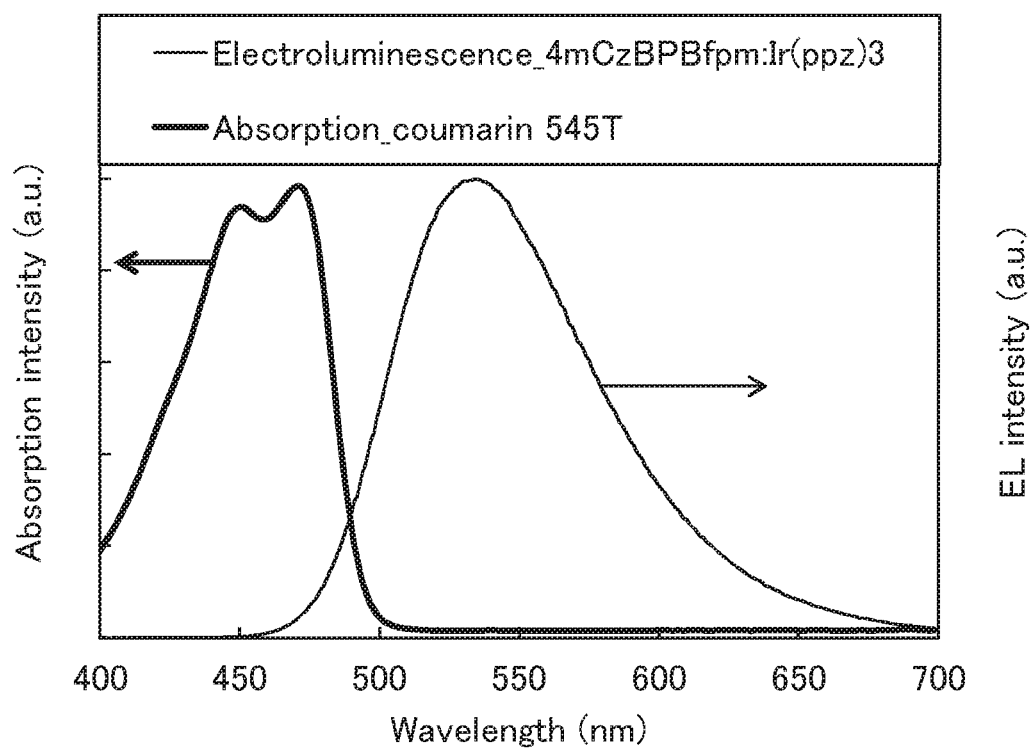
FIG. 22 shows the relation between an emission spectrum and an absorption spectrum in Example.

FIG. 22 shows the measurement result of the absorption spectrum of coumarin 545T in a toluene solution. FIG. 22 also shows the emission spectrum of the exciplex in the comparative light-emitting element 4. The absorption spectrum was measured with an ultraviolet-visible spectrophotometer (V-550, produced by JASCO Corporation) at room temperature (in an atmosphere kept at 23° C.).

As shown in FIG. 22, the absorption spectrum of coumarin 545T and the emission spectrum of the exciplex in the comparative light-emitting element 4 partly overlap. Thus, the excitation energy can be efficiently supplied from the exciplex formed by 4mCzBPBfpm and Ir(ppz)$_3$ to coumarin 545T, which is the fluorescent compound. Accordingly, it is possible to provide a light-emitting element that emits light with a peak wavelength shorter than that of the electroluminescence spectrum of the exciplex, like the light-emitting element 3 having the electroluminescence spectrum shown in FIG. 20.

<Measurement of T1 Level>

Next, to obtain the T1 level of the compound used in the light-emitting layer 130, a thin film of 4mCzBPBfpm was formed over a quartz substrate by a vacuum evaporation method, and the emission spectrum of the thin film was measured at a low temperature (10 K). The measurement was performed at a temperature of 10 K with a PL microscope (LabRAM HR-PL, produced by HORIBA, Ltd.), a He-Cd laser having a wavelength of 325 nm as excitation light, and a CCD detector.

As a result, the T1 level of 4mCzBPBfpm was calculated to be 2.68 eV.

Moreover, an absorption spectrum and an emission spectrum were measured to estimate the T1 level of Ir(ppz)$_3$. A dichloromethane solution in which Ir(ppz)$_3$ was dissolved was prepared, and the absorption spectrum was measured using a quartz cell. The absorption spectrum was measured with an ultraviolet-visible spectrophotometer (V-550, produced by JASCO Corporation). The absorption spectra of the quartz cell and the solvent were subtracted from the measured absorption spectrum of the sample. The measurement was performed at room temperature (in an atmosphere kept at 23° C.).

The absorption edge was calculated from the data of the aforementioned absorption spectrum, and the transition energy was estimated on the assumption of direct transition; the transition energy of Ir(ppz)$_3$ was calculated to be 3.27 eV. Since Ir(ppz)$_3$ is a phosphorescent compound, the absorption edge on the lowest energy side is an absorption band based on the transition from the triplet excited state. Therefore, from the absorption edge, the T1 level of Ir(ppz)$_3$ is calculated to be 3.27 eV.

From the above measurement results, the T1 level of 4mCzBPBfpm is lower than that of Ir(ppz)$_3$, and the T1 level of 4mCzBPBfpm is higher than that (2.33 eV) of the exciplex formed by 4mCzBPBfpm and Ir(ppz)$_3$. Thus, the triplet excitation energy of the exciplex formed by 4mCzBPBfpm and Ir(ppz)$_3$ is not deactivated by 4mCzBPBfpm or Ir(ppz)$_3$. Consequently, the triplet excitation energy of the exciplex can be converted into light, converted into the singlet excitation energy by reverse intersystem crossing, or transferred to the fluorescent compound.

In addition, when the emission spectrum of Ir(ppz)$_3$ was attempted to be measured at room temperature, light emitted from Ir(ppz)$_3$ was not observed. Non-Patent Document 1 discloses that the emission quantum yield of Ir(ppz)$_3$ is lower than 1% at room temperature. This indicates that Ir(ppz)$_3$ is a material that does not emit light at room temperature. That is, even in the case of using a compound with an emission quantum yield as low as less than 1%, a light-emitting element with high emission efficiency can be obtained.

<Reliability of Light-Emitting Elements>

Figure 23:
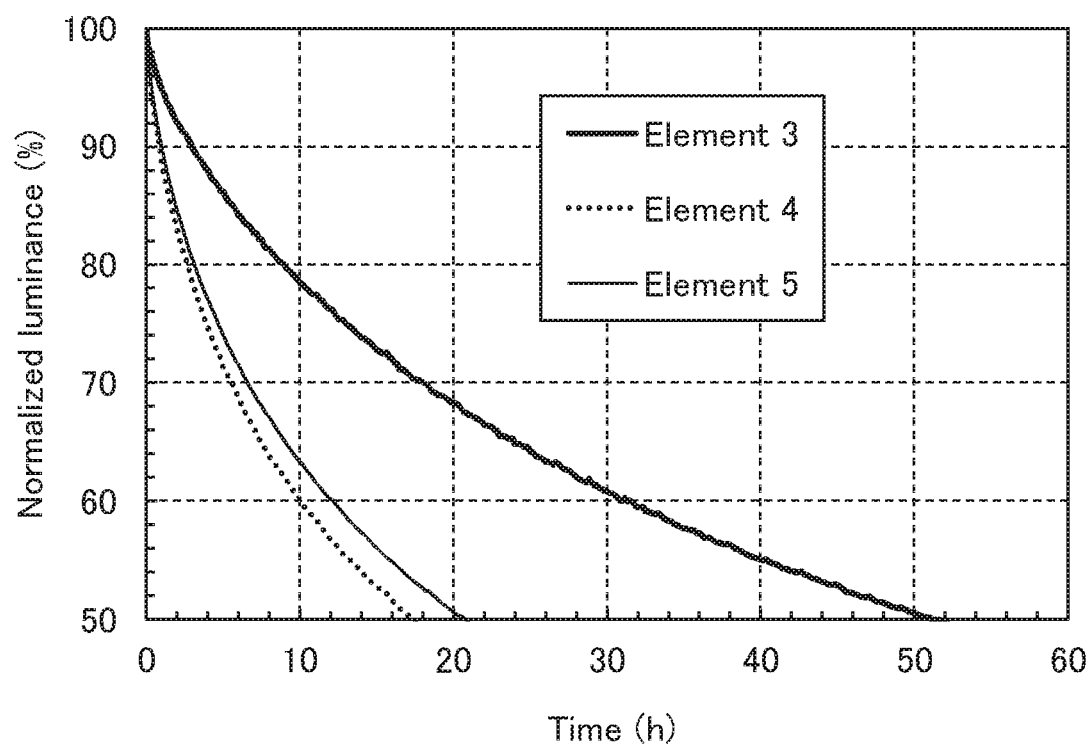
FIG. 23 shows reliability test results in Example.

FIG. 23 shows the results of a driving test at a constant current of 0.5 mA, performed on the light-emitting element 3 and the comparative light-emitting elements 4 and 5. It was clear from FIG. 23 that the light-emitting element 3 had higher reliability than the comparative light-emitting elements 4 and 5. The difference between the light-emitting element 3 and the comparative light-emitting element 4 is whether the fluorescent compound is contained. As described above, light from the fluorescent compound was obtained in the light-emitting element 3, and light from the exciplex was obtained in the comparative light-emitting element 4. This demonstrates that the reliability is improved when light emission is obtained from the fluorescent compound as in the light-emitting element of one embodiment of the present invention. Furthermore, the difference between the light-emitting element 3 and the comparative light-emitting element 5 is the host material. As described above, the host material of the light-emitting element 3 is the material having a benzofuropyrimidine skeleton, whereas the host material of the comparative light-emitting element 5 is the material having a pyrimidine skeleton. Thus, the use of a material having a benzofuropyrimidine skeleton offers a highly reliable light-emitting element.

As has been described, one embodiment of the present invention can provide a light-emitting element with high emission efficiency and high reliability. In addition, one embodiment of the present invention can provide a light-emitting element with low driving voltage and low power consumption.

[Example 3]

This example will show fabrication examples of the light-emitting element of one embodiment of the present invention and comparative light-emitting elements. The structure of each light-emitting element fabricated in this example is the same as that illustrated in FIG. 1A. Table 5 shows the details of the element structures. The structure and abbreviation of compounds used in this example are shown below. Note that Example 1 can be referred to for the structures and abbreviations of the other compounds.

[Chemical Formulae 8]

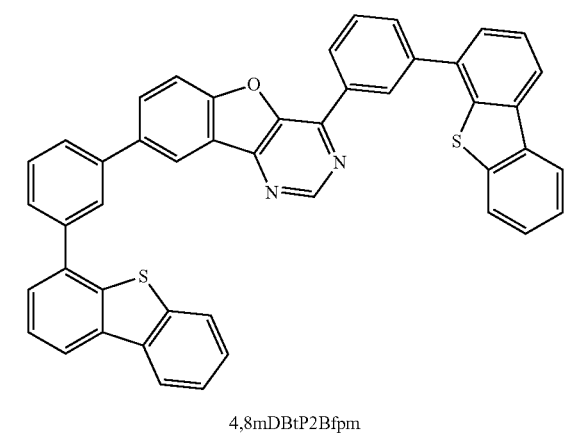

4,8mDBtP2Bfpm

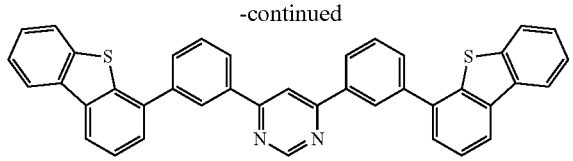

4,6mDBTP2Pm-II

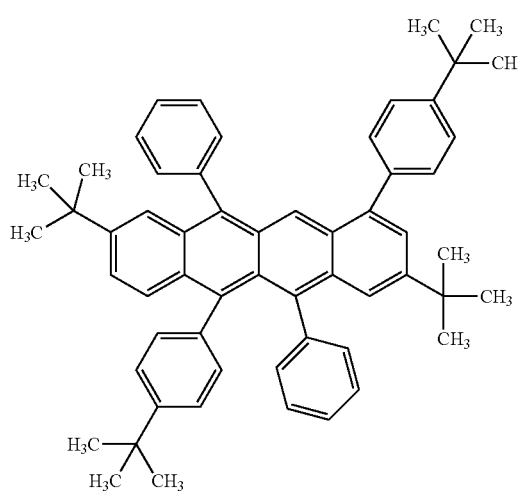

TBRb

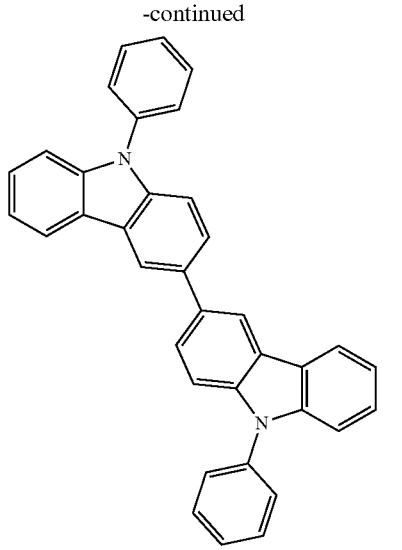

PCCP

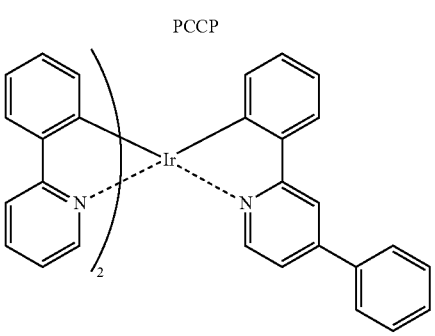

Ir(ppy)₂(4dppy)

TABLE 5

| | Layer | Ref. numeral | Thickness (nm) | Material | Weight ratio |
|---|---|---|---|---|---|
| Light-emitting element 6 | Electrode | 102 | 200 | Al | — |
| | Electron-injection layer | 119 | 1 | LiF | — |
| | Electron-transport layer | 118 (2) | 10 | NBPhen | — |
| | | 118 (1) | 20 | 4,8mDBtP2Bfpm | — |
| | Light-emitting layer | 130 | 40 | 4,8mDBtP2Bfpm:PCCP: Ir(ppy)₂(4dppy):TBRb | 0.6:0.4:0.1:0.01 |
| | Hole-transport layer | 112 | 20 | PCBBi1BP | — |
| | Hole-injection layer | 111 | 45 | DBT3P-II:MoO₃ | 1:0.5 |
| | Electrode | 101 | 70 | ITSO | — |
| Comparative light-emitting element 7 | Electrode | 102 | 200 | Al | — |
| | Electron-injection layer | 119 | 1 | LiF | — |
| | Electron-transport layer | 118 (2) | 10 | NBPhen | — |
| | | 118 (1) | 20 | 4,8mDBtP2Bfpm | — |
| | Light-emitting layer | 130 | 40 | 4,8mDBtP2Bfpm:PCCP: Ir(ppy)₂(4dppy) | 0.6:0.4:0.1 |
| | Hole-transport layer | 112 | 20 | PCBBi1BP | — |
| | Hole-injection layer | 111 | 45 | DBT3P-II:MoO₃ | 1:0.5 |
| | Electrode | 101 | 70 | ITSO | — |
| Comparative light-emitting element 8 | Electrode | 102 | 200 | Al | — |
| | Electron-injection layer | 119 | 1 | LiF | — |
| | Electron-transport layer | 118 (2) | 10 | NBPhen | — |
| | | 118 (1) | 20 | 4,6mDBTP2Pm-II | — |
| | Light-emitting layer | 130 | 40 | 4,6mDBTP2Pm-II:PCCP: Ir(ppy)₂(4dppy):TBRb | 0.6:0.4:0.1:0.01 |
| | Hole-transport layer | 112 | 20 | PCBBi1BP | — |
| | Hole-injection layer | 111 | 45 | DBT3P-II:MoO₃ | 1:0.5 |
| | Electrode | 101 | 70 | ITSO | — |

<Fabrication of Light-Emitting Elements>

Methods of fabricating the light-emitting elements in this example will be described below.

<<Fabrication of Light-Emitting Element 6>>

As the electrode 101, an ITSO film was formed to a thickness of 70 nm over a glass substrate. Note that the area of the electrode 101 was set to 4 mm$^2$ (2 mm×2 mm).

Next, as the hole-injection layer 111, DBT3P-II and molybdenum oxide (MoO$_3$) were deposited over the electrode 101 by co-evaporation to have a weight ratio of DBT3P-II:MoO$_3$=1:0.5 and a thickness of 45 nm.

Then, as the hole-transport layer 112, 4,4'-diphenyl-4"-(9-phenyl-9H-carbazol-3-yl)triphenylamine (abbreviation: PCBBiIBP) was deposited to a thickness of 20 nm over the hole-injection layer 111 by evaporation.

Next, as the light-emitting layer 130, 4,8-bis[3-(dibenzothiophen-4-yl)phenyl]-[1]benzofuro[3,2-d]pyrimidine (abbreviation: 4,8mDBtP2Bfpm), 9-phenyl-9H-3-(9-phenyl-9H-carbazol-3-yl)carbazole (abbreviation: PCCP), [2-(4-phenyl-2-pyridinyl-κC)phenyl-κC]bis[2-(2-pyridinyl-κC)phenyl-κC]iridium(III) (abbreviation: Ir(ppy)$_2$(4dppy)), and 2,8-di-tert-butyl-5,11-bis(4-tert-butylphenyl)-6,12-diphenyltetracene (abbreviation: TBRb) were deposited over the hole-transport layer 112 by co-evaporation to have a weight ratio of 4,8mDBtP2Bfpm:PCCP:Ir(ppy)$_2$(4dppy):TBRb=0.6:0.4:0.1:0.01 and a thickness of 40 nm. In the light-emitting layer 130, TBRb is a fluorescent compound.

Then, as the electron-transport layer 118, 4,8mDBtP2Bfpm and NBPhen were sequentially deposited to a thickness of 20 nm and 10 nm, respectively, over the light-emitting layer 130 by evaporation. Subsequently, as the electron-injection layer 119, LiF was deposited to a thickness of 1 nm over the electron-transport layer 118 by evaporation.

Then, as the electrode 102, aluminum (Al) was formed to a thickness of 200 nm over the electron-injection layer 119.

Then, in a glove box containing a nitrogen atmosphere, with the use of a sealant for an organic EL device, a glass substrate for sealing was fixed to the glass substrate on which the organic materials were deposited, whereby the light-emitting element 6 was sealed. Specifically, after the sealant was applied to surround the organic materials deposited on the glass substrate and the glass substrate was bonded to the glass substrate for sealing, irradiation with ultraviolet light having a wavelength of 365 nm at 6 J/cm$^2$ and heat treatment at 80° C. for one hour were performed. Through the above steps, the light-emitting element 6 was obtained.

As the light-emitting layer 130 in the comparative light-emitting element 7, 4,8mDBtP2Bfpm, PCCP, and Ir(ppy)$_2$(4dppy) were deposited by co-evaporation to have a weight ratio of 4,8mDBtP2Bfpm:PCCP:Ir(ppy)$_2$(4dppy)=0.6:0.4:0.1 and a thickness of 40 nm. The light-emitting layer 130 of the comparative light-emitting element 7 differs from that of the light-emitting element 6 in not containing TBRb, which is a fluorescent compound.

<<Fabrication of Comparative Light-Emitting Element 8>>

The comparative light-emitting element 8 was fabricated through the same steps as those for the light-emitting element 6 except for the steps of forming the light-emitting layer 130 and the electron-transport layer 118.

As the light-emitting layer 130 in the comparative light-emitting element 8, 4,6-bis[3-(dibenzothiophen-4-yl)phenyl]pyrimidine (abbreviation: 4,6mDBTP2Pm-II), PCCP, Ir(ppy)$_2$(4dppy), and TBRb were deposited by co-evaporation to have a weight ratio of 4,6mDBTP2Pm-II:PCCP:Ir(ppy)$_2$(4dppy):TBRb=0.6:0.4:0.1:0.01 and a thickness of 40 nm. The light-emitting layer 130 of the comparative light-emitting element 8 differs from that of the light-emitting element 6 in including the material having a pyrimidine skeleton as the host material.

Then, as the electron-transport layer 118, 4,6mDBTP2Pm-II and NBPhen were sequentially deposited to a thickness of 20 nm and 10 nm, respectively, over the light-emitting layer 130 by evaporation.

<Characteristics of Light-Emitting Elements>

Next, the characteristics of the fabricated light-emitting element 6 and comparative light-emitting elements 7 and 8 were measured. Note that the measurement methods are the same as those in Example 1.

Figure 24:
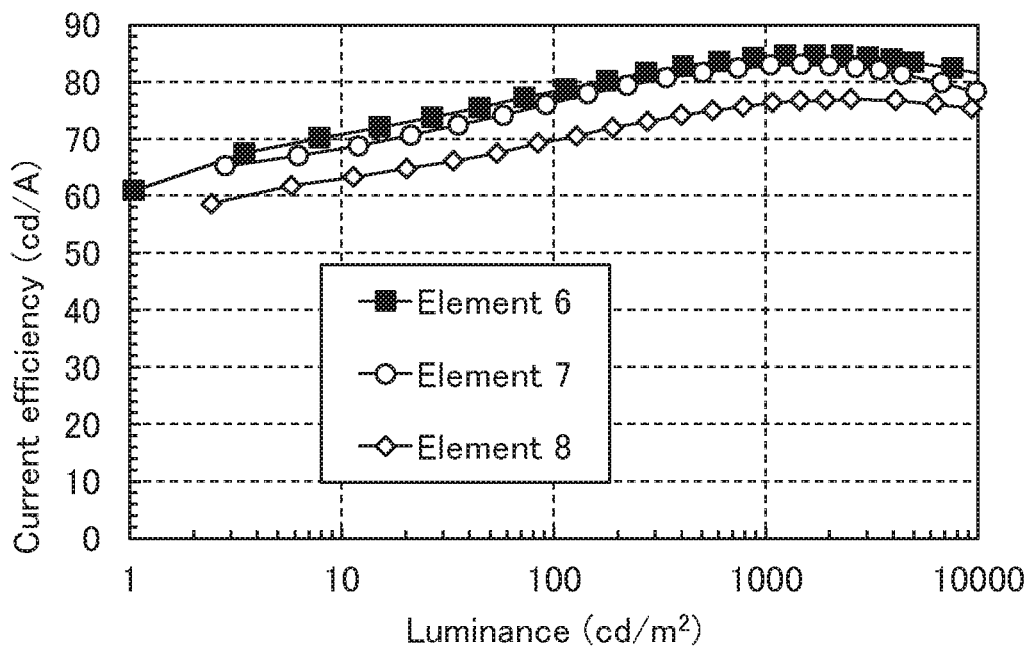
FIG. 24 shows current efficiency—luminance characteristics of light-emitting elements in Example.
Figure 25:
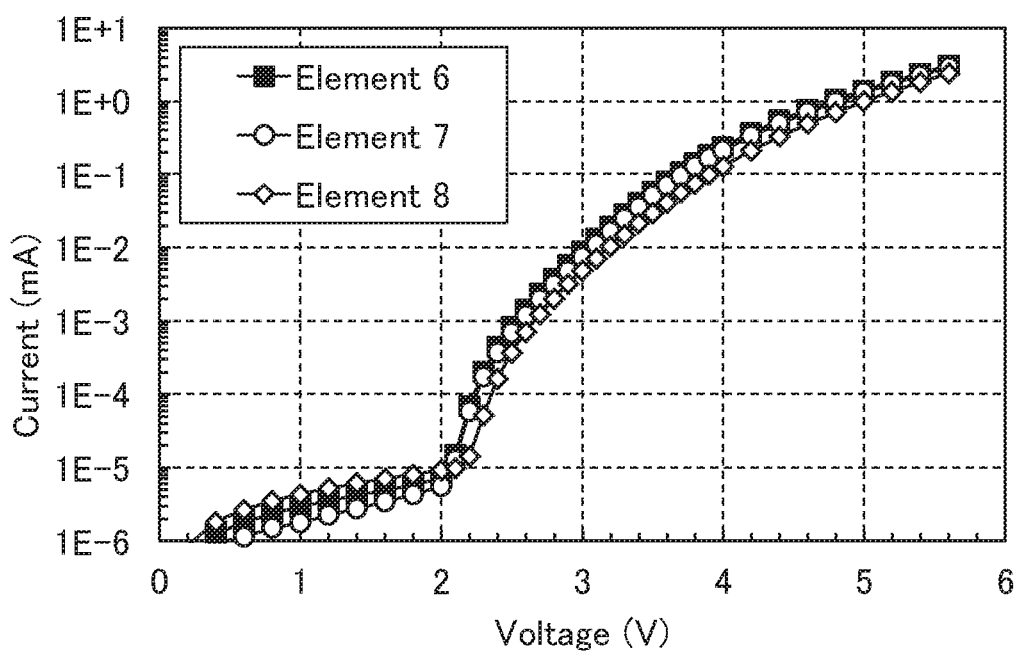
FIG. 25 shows current—voltage characteristics of light-emitting elements in Example.
Figure 26:
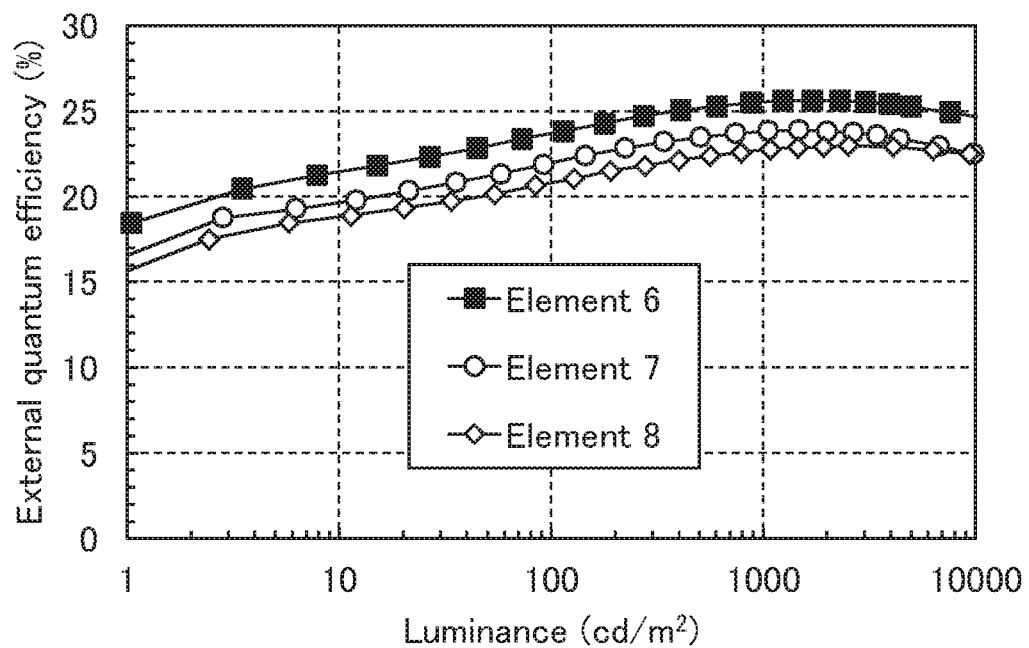
FIG. 26 shows external quantum efficiency—luminance characteristics of light-emitting elements in Example.
Figure 27:
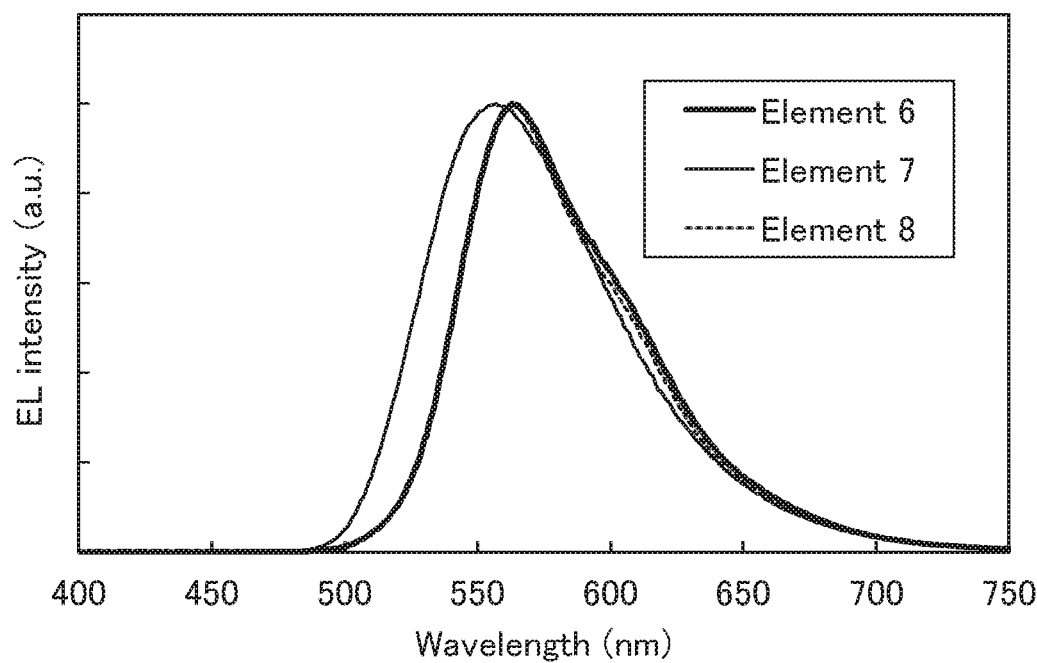
FIG. 27 shows emission spectra of light-emitting elements in Example.

FIG. 24, FIG. 25, and FIG. 26 show luminance-current efficiency characteristics, voltage-current characteristics, and luminance-external quantum efficiency characteristics, respectively, of the light-emitting element 6 and the comparative light-emitting elements 7 and 8. FIG. 27 shows the electroluminescence spectra obtained when a current with a current density of 2.5 mA/cm$^2$ was supplied to the light-emitting element 6 and the comparative light-emitting elements 7 and 8. Note that the measurement of the light-emitting elements was performed at room temperature (in an atmosphere maintained at 23° C.).

Table 6 shows the element characteristics of the light-emitting element 6 and the comparative light-emitting elements 7 and 8 at around 1000 cd/m$^2$.

TABLE 6

|  | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
| --- | --- | --- | --- | --- | --- | --- | --- |
| Light-emitting element 6 | 3.40 | 1.0 | (0.461, 0.534) | 875 | 84.2 | 77.8 | 25.5 |
| Comparative light-emitting element 7 | 3.50 | 1.3 | (0.420, 0.570) | 1060 | 82.9 | 74.4 | 23.9 |
| Comparative light-emitting element 8 | 3.70 | 1.4 | (0.457, 0.538) | 1077 | 76.3 | 64.8 | 22.8 |

<<Fabrication of Comparative Light-Emitting Element 7>>

The comparative light-emitting element 7 was fabricated through the same steps as those for the light-emitting element 6 except for the step of forming the light-emitting layer 130.

As shown in FIG. 27, the electroluminescence spectrum of both the light-emitting element 6 and the comparative light-emitting element 8 exhibits yellow light emission with a peak wavelength of 563 nm and a full width at half maximum of approximately 72 nm. Therefore, light emitted from the light-emitting element 6 and the comparative light-emitting element 8 originates from TBRb, which is the fluorescent compound. Note that light originating from Ir(ppy)$_2$(4dpy) was not observed from the light-emitting element 6 and the comparative light-emitting element 8.

The comparative light-emitting element 7 exhibits a broad emission spectrum with a peak wavelength of 557 nm and a full width at half maximum of 80 nm. Light emitted from the comparative light-emitting element 7 originates from Ir(ppy)$_2$(4dpy). Thus, the light-emitting element 6 of one embodiment of the present invention has a smaller full width at half maximum in the electroluminescence spectrum and can emit light with higher color purity than the comparative light-emitting element 7. Accordingly, one embodiment of the present invention is suitable for display devices.

As shown in FIG. 24, FIG. 26, and Table 6, the light-emitting element 6 and the comparative light-emitting elements 7 and 8 exhibit extremely high emission efficiency (current efficiency, power efficiency, and external quantum efficiency). Moreover, the external quantum efficiency of the light-emitting element 6 is much higher than 6.25%. This is because light emission originating from triplet excitons is obtained in addition to light emission originating from singlet excitons generated by recombination of carriers (holes and electrons), indicating that excitation energy is transferred to TBRb, which is the fluorescent compound, through Ir(ppy)$_2$(4dppy), which is the phosphorescent material. In addition, the light-emitting element 6 exhibits higher external quantum efficiency than the comparative light-emitting element 7, which proves that deactivation of the excitation energy is reduced and the excitation energy can be efficiently converted into light.

Moreover, roll-off is small in the light-emitting element 6. Such small roll-off is one of the features of the light-emitting element in one embodiment of the present invention.

<CV Measurement Results>

Next, the HOMO level and LUMO level of the above compounds were obtained using cyclic voltammetry (CV) measurement of their electrochemical characteristics (oxidation reaction characteristics and reduction reaction characteristics). The measurement method is the same as that in Example 2.

From the CV measurement results, the HOMO level and LUMO level of 4,8mDBtP2Bfpm were −6.18 eV and −3.02 eV, respectively. The HOMO level and LUMO level of PCCP were −5.63 eV and −1.96 eV, respectively. The HOMO level and LUMO level of 4,6mDBTP2Pm-II were −6.22 eV and −2.83 eV, respectively.

Thus, 4,8mDBtP2Bfpm has a higher HOMO level and a lower LUMO level than PCCP; hence, 4,8mDBtP2Bfpm and PCCP are a combination that forms an exciplex in the light-emitting layer. Similarly, 4,6mDBTP2Pm-II and PCCP are also a combination that forms an exciplex.

The S1 level and T1 level of the exciplex formed by 4,8mDBtP2Bfpm and PCCP, which were calculated from emission energy calculated from the peak wavelength of the emission spectrum, are 2.61 eV Here, the T1 level of Ir(ppy)$_2$(4dpy) is 2.40 eV (calculated from the absorption edge of a dichloromethane solution). Accordingly, both the singlet excitation energy and the triplet excitation energy of the exciplex can be transferred to Ir(ppy)$_2$(4dpy).

<Relation Between Emission Spectrum of Exciplex and Absorption Spectrum of Guest Material>

Figure 28:
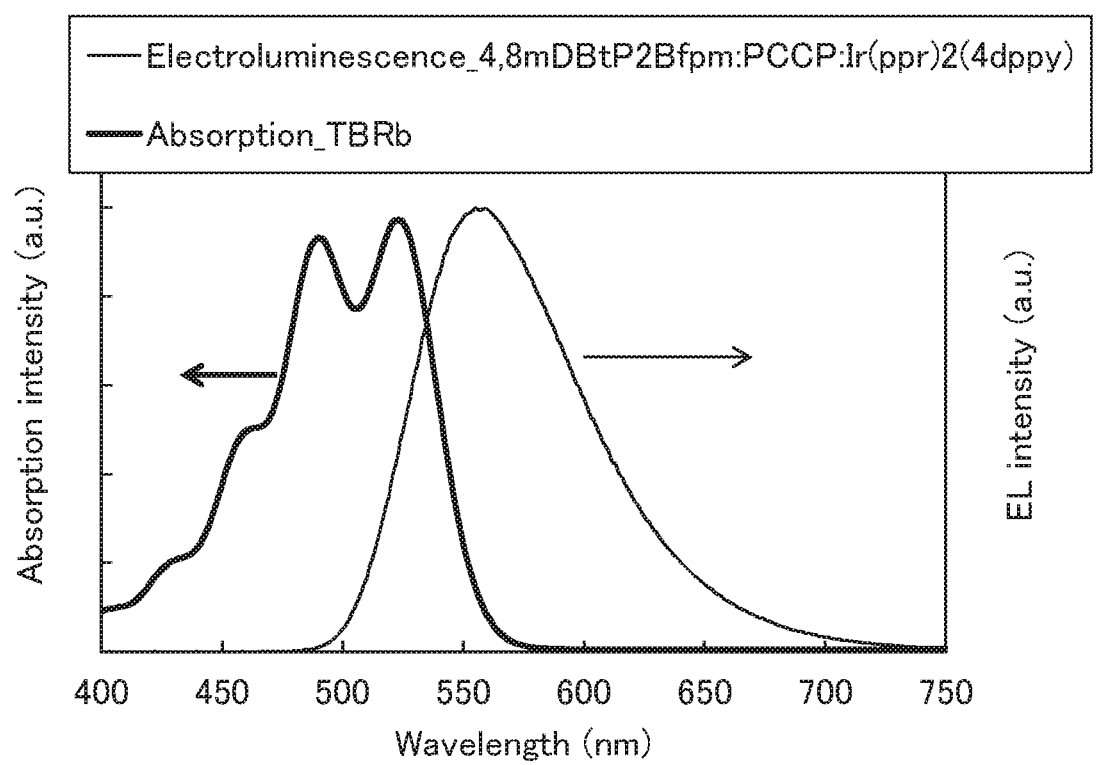
FIG. 28 shows the relation between an emission spectrum and an absorption spectrum in Example.

FIG. 28 shows the measurement result of the absorption spectrum of TBRb in a toluene solution. FIG. 28 also shows the emission spectrum of the comparative light-emitting element 7. The measurement was performed in the same manner as that in Example 2.

As shown in FIG. 28, the absorption spectrum of TBRb and the emission spectrum of the comparative light-emitting element 7 partly overlap. Thus, the excitation energy can be efficiently supplied from the exciplex formed by 4,8mDBtP2Bfpm and PCCP to TBRb (the fluorescent compound) through Ir(ppy)$_2$(4dpy). Energy transfer to TBRb through Ir(ppy)$_2$(4dpy), which is the phosphorescent compound, enables the triplet excitation energy to contribute to fluorescence. Note that a similar mechanism is likely to occur also in the comparative light-emitting element 8.

Here, the light-emitting element 6 has higher emission efficiency than the comparative light-emitting element 8. The difference between these elements is the host material; the material having a benzofuropyrimidine skeleton is used in the light-emitting element 6, whereas the material having a pyrimidine skeleton is used in the comparative light-emitting element 8. Thus, a light-emitting element can have higher emission efficiency by using a material having a benzofuropyrimidine skeleton as the host material.

<Reliability of Light-Emitting Elements>

Next, a driving test at a constant current of 2 mA was performed on the light-emitting element 6 and the comparative light-emitting elements 7 and 8. Table 7 shows LT$_{40}$ (the time at which the luminance decreases by 60%) of these light-emitting elements.

TABLE 7

|  | LT$_{40}$ (h) |
| --- | --- |
| Light-emitting element 6 | 3560 |
| Comparative light-emitting element 7 | 3090 |
| Comparative light-emitting element 8 | 1200 |

From Table 7, the light-emitting element 6, which is the light-emitting element of one embodiment of the present invention, exhibited the highest reliability. The difference between the light-emitting element 6 and the comparative light-emitting element 7 is whether the fluorescent compound is contained. This suggests that energy transfer to the fluorescent material through the phosphorescent material results in higher reliability. Furthermore, the light-emitting element 6 has higher reliability than the comparative light-emitting element 8, which demonstrates that a highly reliable light-emitting element can be obtained with the use of a material having a benzofuropyrimidine skeleton, as in Example 2.

REFERENCE NUMERALS

100: EL layer, 101: electrode, 102: electrode, 106: light-emitting unit, 108: light-emitting unit, 111: hole-injection layer, 112: hole-transport layer, 113: electron-transport layer, 114: electron-injection layer, 115: charge-generation layer, 116: hole-injection layer, 117: hole-transport layer, 118: electron-transport layer, 119: electron-injection layer, 120: light-emitting layer, 130: light-emitting layer, 131: compound, 132: compound, 133: compound, 134: compound, 150: light-emitting element, 170: light-emitting layer, 250: light-emitting element, 601: source driver circuit, 602: pixel portion, 603: gate driver circuit, 604: sealing substrate, 605: sealant, 607: space, 608: wiring, 609: FPC, 610: element substrate, 611: switching TFT, 612: current controlling TFT, 613: electrode, 614: insulator, 616: EL layer, 617: electrode, 618: light-emitting element, 623: n-channel TFT, 624: p-channel TFT, 625: desiccant, 900: portable information terminal, 901: housing, 902: housing, 903: display portion, 905: hinge portion, 910: portable information terminal, 911: housing, 912: display portion, 913: operation button, 914: external connection port, 915: speaker, 916: microphone, 917: camera, 920: camera, 921: housing, 922: display portion, 923: operation button, 924: shutter button, 926: lens, 1001: substrate, 1002: base insulating film, 1003: gate insulating film, 1006: gate electrode, 1007: gate electrode, 1008: gate electrode, 1020: interlayer insulating film, 1021: interlayer insulating film, 1022: electrode, 1024B: electrode, 1024G: electrode, 1024R: electrode, 1024W: electrode, 1025B: lower electrode, 1025G: lower electrode, 1025R: lower electrode, 1025W: lower electrode, 1026: partition, 1028: EL layer, 1029: electrode, 1030: black layer, 1031: sealing substrate, 1032: sealant, 1033: base material, 1034B: coloring layer, 1034G: coloring layer, 1034R: coloring layer, 1035: black layer, 1036: overcoat layer, 1037: interlayer insulating film, 1040: pixel portion, 1041: driver circuit portion, 1042: peripheral portion, 1044B: blue pixel, 1044G: green pixel, 1044R: red pixel, 1044W: white pixel, 2100: robot, 2101: illuminance sensor, 2102: microphone, 2103: upper camera, 2104: speaker, 2105: display, 2106: lower camera, 2107: obstacle sensor, 2108: moving mechanism, 2110: arithmetic device, 5000: housing, 5001: display portion, 5002: display portion, 5003: speaker, 5004: LED lamp, 5005: operation key, 5006: connection terminal, 5007: sensor, 5008: microphone, 5012: support, 5013: earphone, 5100: cleaning robot, 5101: display, 5102: camera, 5103: brush, 5104: operation button, 5120: dust, 5140: portable electronic device, 5150: portable information terminal, 5151: housing, 5152: display region, 5153: bend portion, 8501: lighting device, 8502: lighting device, 8503: lighting device, 8504: lighting device This application is based on Japanese Patent Application Serial No. 2017-208054 filed with Japan Patent Office on Oct. 27, 2017, the entire contents of which are hereby incorporated by reference.

The invention claimed is:

1. A light-emitting device comprising:
a first electrode;
a light-emitting layer over the first electrode, the light-emitting layer comprising:
a first organic compound configured to convert triplet excitation energy into light;
a second organic compound having one of a benzofuropyrimidine skeleton and a benzothienopyrimidine skeleton; and
a third organic compound configured to convert singlet excitation energy into light; and
a second electrode over the light-emitting layer,
wherein light emitted from the light-emitting layer comprises light emitted from the third organic compound, and
wherein the first organic compound comprises one of Ru, Rh, Pd, Os, Ir and Pt.

2. The light-emitting device according to claim 1, wherein the first organic compound is configured to supply excitation energy to the third organic compound.

3. The light-emitting device according to claim 1,
wherein the benzofuropyrimidine skeleton is a benzofuro[3,2-d]pyrimidine skeleton, and
wherein the benzothienopyrimidine skeleton is a benzothieno[3,2-d]pyrimidine skeleton.

4. The light-emitting device according to claim 3,
wherein the benzofuro[3,2-d]pyrimidine skeleton has one of a substituent at 4-position and a substituent at 8-position, and
wherein the benzothieno[3,2-d]pyrimidine skeleton has one of a substituent at 4-position and a substituent at 8-position.

5. The light-emitting device according to claim 1, wherein the first organic compound is capable of emitting phosphorescence.

6. The light-emitting device according to claim 1, wherein the first organic compound has an emission quantum yield higher than or equal to 0% and lower than or equal to 40% at room temperature.

7. The light-emitting device according to claim 1, wherein the third organic compound emits fluorescence.

8. The light-emitting device according to claim 1, wherein a difference between the lowest singlet excitation energy and the lowest triplet excitation energy of the first organic compound is greater than or equal to 0 eV and less than or equal to 0.2 eV.

9. A display device comprising:
the light-emitting device according to claim 1; and
at least one of a color filter and a transistor.

10. An electronic device comprising:
the display device according to claim 9; and
at least one of a housing and a touch sensor.

11. A lighting device comprising:
the light-emitting device according to claim 1; and
at least one of a housing and a touch sensor.

12. A light-emitting device comprising:
a first electrode;
a light-emitting layer over the first electrode, the light-emitting layer comprising:
a first organic compound configured to convert triplet excitation energy into light;
a second organic compound having one of a benzofuropyrimidine skeleton and a benzothienopyrimidine skeleton; and
a third organic compound configured to convert singlet excitation energy into light; and
a second electrode over the light-emitting layer,
wherein the first organic compound and the second organic compound are capable of forming an exciplex, and
wherein light emitted from the light-emitting layer comprises light emitted from the third organic compound.

13. The light-emitting device according to claim 12, wherein the exciplex is configured to supply excitation energy to the third organic compound.

14. The light-emitting device according to claim 12,
wherein the benzofuropyrimidine skeleton is a benzofuro[3,2-d]pyrimidine skeleton, and
wherein the benzothienopyrimidine skeleton is a benzothieno[3,2-d]pyrimidine skeleton.

15. The light-emitting device according to claim 14,
wherein the benzofuro[3,2-d]pyrimidine skeleton has one of a substituent at 4-position and a substituent at 8-position, and
wherein the benzothieno[3,2-d]pyrimidine skeleton has one of a substituent at 4-position and a substituent at 8-position.

16. The light-emitting device according to claim 12, wherein the first organic compound comprises one of Ru, Rh, Pd, Os, Ir and Pt.

17. The light-emitting device according to claim 12, wherein the first organic compound is capable of emitting phosphorescence.

18. The light-emitting device according to claim 12, wherein an emission spectrum of the exciplex partly overlaps an absorption band on the longest wavelength side of an absorption spectrum of the third organic compound.

19. The light-emitting device according to claim 12, wherein the first organic compound has an emission quantum yield higher than or equal to 0% and lower than or equal to 40% at room temperature.

20. The light-emitting device according to claim 12, wherein the exciplex is configured to emit light with higher emission efficiency than emission efficiency of the first organic compound.

21. The light-emitting device according to claim 12, wherein the third organic compound emits fluorescence.

22. The light-emitting device according to claim 12, wherein a difference between the lowest singlet excitation energy and the lowest triplet excitation energy of the first organic compound is greater than or equal to 0 eV and less than or equal to 0.2 eV.

23. A display device comprising:
    the light-emitting device according to claim 12; and
    at least one of a color filter and a transistor.

24. An electronic device comprising:
    the display device according to claim 23; and
    at least one of a housing and a touch sensor.

25. A lighting device comprising:
    the light-emitting device according to claim 12; and
    at least one of a housing and a touch sensor.

* * * * *